(12) United States Patent
Karino et al.

(10) Patent No.: US 8,320,421 B2
(45) Date of Patent: Nov. 27, 2012

(54) SEMICONDUCTOR LIGHT-EMITTING DEVICE

(75) Inventors: Sachio Karino, Miyagi (JP); Eiji Takase, Miyagi (JP); Makoto Oogane, Kanagawa (JP); Tsuyoshi Nagatake, Kanagawa (JP); Michiru Kamada, Miyagi (JP); Hironobu Narui, Kanagawa (JP); Nobukata Okano, Kanagawa (JP)

(73) Assignee: Sony Corporation, Tokyo (JP)

( * ) Notice: Subject to any disclaimer, the term of this patent is extended or adjusted under 35 U.S.C. 154(b) by 640 days.

(21) Appl. No.: 12/311,916

(22) PCT Filed: May 20, 2008

(86) PCT No.: PCT/JP2008/059195
§ 371 (c)(1),
(2), (4) Date: Jun. 29, 2009

(87) PCT Pub. No.: WO2008/146651
PCT Pub. Date: Dec. 4, 2008

(65) Prior Publication Data
US 2010/0019255 A1    Jan. 28, 2010

(30) Foreign Application Priority Data

| May 28, 2007 | (JP) | 2007-139963 |
| Aug. 3, 2007 | (JP) | 2007-202522 |
| Apr. 21, 2008 | (JP) | 2008-110540 |

(51) Int. Cl.
*H01L 33/00* (2010.01)
(52) U.S. Cl. .................. 372/46.01; 257/94; 257/103

(58) Field of Classification Search ............... 372/46.01; 257/94, 103, E33.013, E33.005
See application file for complete search history.

(56) References Cited

U.S. PATENT DOCUMENTS

| 5,070,510 A | * | 12/1991 | Konushi et al. | 372/46.01 |
| 5,111,469 A | * | 5/1992 | Narui et al. | 372/46.01 |
| 5,255,280 A | * | 10/1993 | Harui et al. | 372/46.01 |
| 5,311,533 A | * | 5/1994 | Stutius et al. | 372/46.01 |
| 5,359,619 A | * | 10/1994 | Yoshida et al. | 372/50.1 |
| 5,383,215 A | * | 1/1995 | Narui et al. | 372/46.01 |
| 5,438,583 A | * | 8/1995 | Narui et al. | 372/45.01 |
| 5,663,975 A | * | 9/1997 | Yoshida et al. | 372/46.01 |

(Continued)

FOREIGN PATENT DOCUMENTS
JP    05-183233    7/1993
(Continued)

OTHER PUBLICATIONS

International Search Report; International Application No. PCT/JP2008/059195; International Search Report Date: Aug. 12, 2008.

(Continued)

*Primary Examiner* — Ha Tran T Nguyen
*Assistant Examiner* — Jordan Klein
(74) *Attorney, Agent, or Firm* — Rader Fishman & Grauer, PLLC

(57) ABSTRACT

A semiconductor light-emitting device configured to decrease a leakage current in a current-blocking layer and including a light-emitting portion composed of a first compound semiconductor layer having a first conductivity type, an active layer, and a second layer having a second conductivity type, and a current-blocking layer in contact with the side of the light-emitting portion and composed of a third layer having the first conductivity type and a fourth layer having the second conductivity type.

30 Claims, 30 Drawing Sheets

U.S. PATENT DOCUMENTS

| | | | |
|---|---|---|---|
| 6,181,723 B1 * | 1/2001 | Okubo et al. | 372/45.01 |
| 6,351,480 B1 * | 2/2002 | Akagi | 372/45.01 |
| 6,377,598 B1 * | 4/2002 | Watanabe et al. | 372/46.01 |
| 6,404,790 B1 * | 6/2002 | Narui et al. | 372/43.01 |
| 6,618,415 B1 * | 9/2003 | Ohitsu et al. | 372/46.01 |
| 6,940,884 B2 * | 9/2005 | Ohitsu et al. | 372/46.01 |
| 7,215,691 B2 * | 5/2007 | Onishi | 372/45.01 |
| 7,701,993 B2 * | 4/2010 | Iga et al. | 372/46.01 |
| 7,915,625 B2 * | 3/2011 | Karino et al. | 257/94 |
| 7,998,770 B2 * | 8/2011 | Matsumura et al. | 438/39 |
| 8,058,660 B2 * | 11/2011 | Karino et al. | 257/94 |
| 2006/0239320 A1 * | 10/2006 | Ohitsu | 372/46.01 |
| 2008/0137703 A1 | 6/2008 | Iga et al. | |

FOREIGN PATENT DOCUMENTS

| | | | |
|---|---|---|---|
| JP | 05183233 A * | 7/1993 | |
| JP | 05-283813 | 10/1993 | |
| JP | 05283813 A * | 10/1993 | |
| JP | 11-054828 | 2/1999 | |
| JP | 11054828 A * | 2/1999 | |
| JP | 2001-144383 | 5/2001 | |
| JP | 2001144383 A * | 5/2001 | |
| JP | 2005-117217 | 12/2005 | |
| JP | 2006-295016 | 10/2006 | |
| JP | 2006295016 A * | 10/2006 | |
| WO | WO 2005117217 A1 * | 12/2005 | |

OTHER PUBLICATIONS

Notification of Transmittal of Translation of the International Preliminary Report on Patentability (Form PCT/IB/338); International Application No. PCT/JP2008/059195; International Filing Date: May 20, 2008.

Wriiten Opinion of the International Searching Authority (Form PCT/ISA/237); International Application No. PCT/JP2008/059195; International Filing Date: May 20, 2008.

* cited by examiner (A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

(A)

(B)

SEMICONDUCTOR LIGHT-EMITTING DEVICE

TECHNICAL FIELD

The present invention relates to a semiconductor light-emitting device and more specifically to a semiconductor light-emitting device including a current-blocking layer provided in a light-emitting portion in a lateral direction thereof, for narrowing a current.

BACKGROUND ART

A semiconductor laser (referred to as a "SDH-type semiconductor laser" hereinafter) having a SDH (Separated Double Hetero Junction) structure which can be formed by one time of an epitaxial growth process is known as a semiconductor layer having low threshold current $I_{th}$, for example, from U.S. Pat. No. 2,990,837.

In this SDH-type semiconductor laser, first, a projecting portion is formed on a substrate having a {100} plane as a main surface to extend in the direction of a {110}A plane. In crystal growth on the main surface of the substrate, a light-emitting portion composed of a laminated structure of compound semiconductor layers is formed on the {100} plane of the projecting portion (referred to as the "protection plane" for convenient sake). The light-emitting portion is composed of a laminated structure in which, for example, a first compound semiconductor layer having a first conductivity type, an active layer, and a second compound semiconductor layer having a second conductivity type are laminated in order. In addition, the light-emitting portion has a triangular sectional shape taken along a virtual plane in a perpendicular direction to the extension direction of the projecting portion, and a side (inclined surface) of the light-emitting portion is composed of a {111}B plane. In a MOCVD method (also referred to as a "MOVPE method"), the {111}B plane is generally known as a non-growth plane except particular crystal growth conditions. Therefore, in the case of the SDH-type semiconductor laser, when the light-emitting portion having the {111}B plane as the side surface is formed, "self-growth termination" is maintained in crystal growth of the light-emitting portion even if MOCVD is continued thereafter.

In the specification, for convenience sake, the following notation of crystal planes is described as (hkl) plane and (hk-l) plane.
(h k l) plane
(h k l̄) plane
In the specification, for convenience sake, the following notation of crystal directions is described as [hkl] direction and [hk-l] direction.
[h k l] direction
[h k l̄] direction On the other hand, a non-growth surface is not present in a portion (referred to as a "recess surface" for convenience sake) of the {100} plane serving as the main surface of the substrate, excluding the projecting portion, when MOCVD is continued, a compound semiconductor layer formed by crystal growth from the recess surface completely cover the light-emitting portion. The compound semiconductor layer formed by crystal growth from the recess surface has a structure in which a current-blocking layer positioning layer, a current-blocking layer, and a buried layer are formed in turn on a second compound semiconductor layer. In this structure, the thickness of the current-blocking layer positioning layer can be controlled so that the current-blocking layer is formed during the formation of the compound semiconductor layer by crystal growth from the recess surface before it completely covers the light-emitting portion (particularly, when the compound semiconductor layer comes near to the side surface the active layer formed in the light-emitting portion), thereby forming a structure in which a current can be injected into only the active layer of the light-emitting portion.

In this way, in the SDH-type semiconductor laser, each of the compound semiconductor layers can be formed on the basis of one time of the crystal growth process. In addition, a material having an energy band gap sufficiently higher than that of the active layer, i.e., a material having a low refractive index, is selected as each of the materials used for the compound semiconductor layers (the first compound semiconductor layer and the second compound semiconductor layer) which hold the active layer therebetween in the vertical direction in the light-emitting portion, and the materials used for the current-blocking layer, the buried layer, and the current-blocking layer positioning layer, which are disposed outside the light-emitting portion, so that the active layer is completely covered with a compound semiconductor layer favorable for light confinement. As a result, the shape of a beam emitted from the semiconductor laser having the side surface of the projecting portion as a light emission surface can be brought near a round shape. Namely, in a far field pattern (FFP), $\theta//\neq\theta\perp$ can be achieved. Alternatively, the shape of a beam emitted from a semiconductor laser may be required to be elliptic, for example, according to the coupling efficiency with a lens or the like. In such a case, $\theta//$ of FFP can be controlled to be small by, for example, employing a so-called flare stripe structure in which the width near the edge of the projecting portion is increased.

In the above-described SDH-type semiconductor laser, an improvement in quality of the current-blocking layer (degree of suppression of a current leakage) is a very important technical factor.

DISCLOSURE OF INVENTION

By the way, a current-blocking layer obtained by crystal growth from a recess surface is composed of a {311}B crystal plane region extending from the side of a light-emitting portion, a {100} crystal plane region extending along a main surface of a substrate, and a {hll}B crystal plane region (may be referred to as a "higher-order crystal plane region" for convenience, wherein h is an integer of 4 or more) positioned between the {311}B crystal plane region and the {100} crystal plane region. In particular, in the {hll}B crystal plane region or the vicinity thereof, there occurs the problem that the current-blocking layer disappears or decreases in thickness due to impurity inter-diffusion between a n-type compound semiconductor layer and a p-type compound semiconductor layer which constitute the current-blocking layer, and thus the effect of the current-blocking layer is not stabilized, thereby increasing a current leakage.

Therefore, in U.S. Pat. No. 2,990,837, in order to resolve this problem, a p-type substrate is used as the substrate, and a current-blocking layer is composed of a p-type compound semiconductor layer. By the way, the {311}B crystal plane region can be easily made n-type, and the higher-order crystal plane region can be easily made p-type. Therefore, the {311}B crystal plane region consequently decreases in thickness to be thinner than the basic p-type epitaxial growth film and become a thin film portion, while the higher-order crystal plane region consequently increases in thickness due to p-type to become a thick film portion. As a result, the higher-order crystal plane region of the current-blocking layer is increased in thickness, and thus a current leakage in this region can be securely avoided.

In this way, the technique disclosed in U.S. Pat. No. 290, 837 is a very effective technique for resolving the above-mentioned problem, but the use of a n-type substrate is strongly demanded. In addition, even when a p-type substrate is used, it is desired to further decrease a current leakage in the current-blocking layer.

In addition, when the SDH-type semiconductor laser is driven with a high driving current, a current leakage is being put into an nonnegligible situation due to impurities which diffuse into the active layer from the current-blocking layer.

Therefore, a first object of the present invention is to provide a semiconductor light-emitting device having a structure and configuration which are capable of realizing high stability over the entire surface of a current-blocking layer composed of a plurality of crystal planes without being affected by the impurity inter-diffusion between a plurality of compound semiconductor layers, which constitute the current-blocking layer, and of further decreasing a current leakage of the current-blocking layer. Also, a second object of the present invention is to provide a semiconductor light-emitting device having a structure and configuration in which impurities little diffuse from a current-blocking layer to an active layer.

In order to achieve the first object, a semiconductor light-emitting device according to a first embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, the impurity for imparting the first conductivity type to the first compound semiconductor layer includes an impurity in the first compound semiconductor layer at a substitution site which is uncompetitive with the substitution site of the impurity in the second compound semiconductor layer, for imparting the second conductivity type to the second compound semiconductor layer, and the impurity for imparting the first conductivity type to the third compound semiconductor layer includes an impurity in the third compound semiconductor layer at a substitution site which is competitive with the substitution site of the impurity in the fourth compound semiconductor layer, for imparting the second conductivity type to the fourth compound semiconductor layer.

In addition, a fourth compound semiconductor layer/third compound semiconductor layer laminated structure from below may be used, or a third compound semiconductor layer/fourth compound semiconductor layer laminated structure from below may be used.

The semiconductor light-emitting device according to the first embodiment of the present invention can be configured so that, the first compound semiconductor layer, the second compound semiconductor layer, the third compound semiconductor layer, and the fourth compound semiconductor layer are composed of Group III-V compound semiconductors, the substitution site of the impurity in the first compound semiconductor layer is a site occupied by a Group V atom, the substitution site of the impurity in the second compound semiconductor layer is a site occupied by a Group III atom, and the substitution site of the impurity in the third compound semiconductor layer and the substitution site of the impurity in the fourth compound semiconductor layer are sites occupied by Group III atoms.

This configuration is referred to as the "semiconductor light-emitting device according to an embodiment 1-A-1 of the present invention" for convenience sake.

The semiconductor light-emitting device according to the embodiment 1-A-1 of the present invention can be configured so that, the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by Group III atoms, and the impurity in the fourth B compound semiconductor layer is carbon (C).

The second object can be achieved by this configuration.

The configuration is referred to as the "semiconductor light-emitting device according to an embodiment 1-A-2 of the present invention" for convenience sake. In addition, the fourth B compound semiconductor layer is partially or entirely in contact with a side of the active layer.

Alternatively, the semiconductor light-emitting device according to the embodiment 1-A-1 of the present invention can be configured so that the impurity in the fourth compound semiconductor layer includes an impurity at a substitution site occupied by a Group III atom, and carbon (C). The second object can be achieved by this configuration. The configuration is referred to as the "semiconductor light-emitting device according to an embodiment 1-A-3 of the present invention" for convenience sake. In other words, the fourth compound semiconductor layer in the semiconductor light-emitting device according to the embodiment 1-A-3 of the present invention co-doped with an impurity at a substitution site occupied by a Group III atom and carbon (C) as an impurity.

Alternatively, the semiconductor light-emitting device according to the first embodiment of the present invention can be configured so that, the first compound semiconductor layer, the second compound semiconductor layer, the third compound semiconductor layer, and the fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with the active layer, the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group III atom, the substitution site of the impurity in the first b compound semiconductor layer is a site occupied by a Group V atom, the substitution site of the impurity in the second B compound semiconductor layer is a site occupied by a Group III atom, the substitution site of the impurity in the second A compound semiconductor layer is a site occupied by a Group V atom, and the substitution site of the impurity in the third compound semiconductor layer and the substitution site of the impurity in the fourth compound semiconductor layer are sites occupied by Group III atoms.

For convenience sake, this configuration is referred to as the "semiconductor light-emitting device according to an embodiment 1-B-1 of the present invention".

The semiconductor light-emitting device according to the embodiment 1-B-1 of the present invention can be configured so that, the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by Group III atoms, and the impurity in the fourth B compound semiconductor layer is carbon (C).

The second object can be achieved by this configuration. The configuration is referred to as the "semiconductor light-emitting device according to an embodiment 1-B-2 of the present invention" for convenience sake. In addition, the fourth B compound semiconductor layer is partially or entirely in contact with a side of the active layer.

Alternatively, the semiconductor light-emitting device according to the embodiment 1-B-1 of the present invention can be configured so that the impurity in the fourth compound semiconductor layer includes an impurity at a substitution site occupied by a Group III atom, and carbon (C). The second object can be achieved by this configuration. The configuration is referred to as the "semiconductor light-emitting device according to an embodiment 1-B-3 of the present invention" for convenience sake. In other words, the fourth compound semiconductor layer in the semiconductor light-emitting device according to the embodiment 1-B-3 of the present invention is co-doped with an impurity at a substitution site occupied by a Group III atom and carbon (C) as an impurity.

Alternatively, the semiconductor light-emitting device according to the first embodiment of the present invention can be configured so that, the first compound semiconductor layer, the second compound semiconductor layer, the third compound semiconductor layer, and the fourth compound semiconductor layer are composed of Group III-V compound semiconductors, the substitution site of the impurity in the first compound semiconductor layer is a site occupied by a Group V atom, the substitution site of the impurity in the second compound semiconductor layer is a site occupied by a Group III atom, and the substitution site of the impurity in the third compound semiconductor layer and the substitution site of the impurity in the fourth compound semiconductor layer are sites occupied by Group V atoms.

This configuration is referred to as the "semiconductor light-emitting device according to an embodiment 1-a-1 of the present invention" for convenience sake.

The semiconductor light-emitting device according to the embodiment 1-a-1 of the present invention can be configured so that, the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by Group V atoms, and the impurity in the third B compound semiconductor layer is silicon (Si).

The second object can be achieved by this configuration.

The configuration is referred to as the "semiconductor light-emitting device according to an embodiment 1-a-2 of the present invention" for convenience sake. In addition, the third B compound semiconductor layer is partially or entirely in contact with a side of the active layer.

Alternatively, the semiconductor light-emitting device according to the embodiment 1-a-1 of the present invention can be configured so that the impurity in the third compound semiconductor layer includes an impurity at a substitution site occupied by a Group V atom, and silicon (Si). The second object can be achieved by this configuration. The configuration is referred to as the "semiconductor light-emitting device according to an embodiment 1-a-3 of the present invention" for convenience sake. In other words, the third compound semiconductor layer in the semiconductor light-emitting device according to the embodiment 1-a-3 of the present invention is co-doped with an impurity at a substitution site occupied by a Group V atom and silicon (Si) as an impurity.

Alternatively, the semiconductor light-emitting device according to the first embodiment of the present invention can be configured so that, the first compound semiconductor layer, the second compound semiconductor layer, the third compound semiconductor layer, and the fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with the active layer, the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group III atom, the substitution site of the impurity in the first B compound semiconductor layer is a site occupied by a Group V atom, the substitution site of the impurity in the second B compound semiconductor layer is a site occupied by a Group III atom, the substitution site of the impurity in the second A compound semiconductor layer is a site occupied by a Group V atom, and the substitution site of the impurity in the third compound semiconductor layer and the substitution site of the impurity in the fourth compound semiconductor layer are sites occupied by Group V atoms.

This configuration is referred to as the "semiconductor light-emitting device according to an embodiment 1-b-1 of the present invention" for convenience sake.

The semiconductor light-emitting device according to the embodiment 1-b-1 of the present invention can be configured so that, the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by Group V atoms, and the impurity in the third B compound semiconductor layer is silicon (Si).

The second object can be achieved by this configuration. The configuration is referred to as the "semiconductor light-emitting device according to an embodiment 1-b-2 of the present invention" for convenience sake. In addition, the third B compound semiconductor layer is partially or entirely in contact with a side of the active layer.

Alternatively, the semiconductor light-emitting device according to the embodiment 1-b-1 of the present invention can be configured so that the impurity in the third compound semiconductor layer includes an impurity at a substitution site occupied by a Group V atom, and silicon (Si). The second object can be achieved by this configuration. The configuration is referred to as the "semiconductor light-emitting device according to an embodiment 1-b-3 of the present invention" for convenience sake. In other words, the third compound semiconductor layer in the semiconductor light-emitting device according to the embodiment 1-b-3 of the present invention is co-doped with an impurity at a substitution site occupied by a Group V atom and silicon (Si) as an impurity.

Alternatively, the semiconductor light-emitting device according to the first embodiment of the present invention can be configured so that, the first compound semiconductor layer, the second compound semiconductor layer, the third compound semiconductor layer, and the fourth compound semiconductor layer are composed of Group III-V compound semiconductors, the substitution site of the impurity in the first compound semiconductor layer is a site occupied by a Group III atom, the substitution site of the impurity in the second compound semiconductor layer is a site occupied by a Group V atom, and the substitution site of the impurity in the third compound semiconductor layer and the substitution site of the impurity in the fourth compound semiconductor layer are sites occupied by Group V atoms.

This configuration is referred to as the "semiconductor light-emitting device according to an embodiment 1-C-1 of the present invention" for convenience sake.

The semiconductor light-emitting device according to the embodiment 1-C-1 of the present invention can be configured so that, the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by Group V atoms, and the impurity in the fourth B compound semiconductor layer is silicon (Si).

The second object can be achieved by this configuration. The configuration is referred to as the "semiconductor light-emitting device according to an embodiment 1-C-2 of the present invention" for convenience sake. In addition, the fourth B compound semiconductor layer is partially or entirely in contact with a side of the active layer.

Alternatively, the semiconductor light-emitting device according to the embodiment 1-C-1 of the present invention can be configured so that the impurity in the fourth compound semiconductor layer includes an impurity at a substitution site occupied by a Group V atom, and silicon (Si). The second object can be achieved by this configuration. The configuration is referred to as the "semiconductor light-emitting device according to an embodiment 1-C-3 of the present invention" for convenience sake. In other words, the fourth compound semiconductor layer in the semiconductor light-emitting device according to the embodiment 1-C-3 of the present invention is co-doped with the impurity at a substitution site occupied by a Group V atom and silicon (Si) as an impurity.

The semiconductor light-emitting device according to the first embodiment of the present invention can be configured so that, the first compound semiconductor layer, the second compound semiconductor layer, the third compound semiconductor layer, and the fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with the active layer, the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group V atom, the substitution site of the impurity in the first B compound semiconductor layer is a site occupied by a Group III atom, the substitution site of the impurity in the second B compound semiconductor layer is a site occupied by a Group V atom, the substitution site of the impurity in the second A compound semiconductor layer is a site occupied by a Group III atom, and the substitution site of the impurity in the third compound semiconductor layer and the substitution site of the impurity in the fourth compound semiconductor layer are sites occupied by Group V atoms.

This configuration is referred to as the "semiconductor light-emitting device according to an embodiment 1-D-1 of the present invention" for convenience sake.

The semiconductor light-emitting device according to the embodiment 1-D-1 of the present invention can be configured so that, the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by Group V atoms, and the impurity in the fourth B compound semiconductor layer is silicon (Si).

The second object can be achieved by this configuration. The configuration is referred to as the "semiconductor light-emitting device according to an embodiment 1-D-2 of the present invention" for convenience sake. In addition, the fourth B compound semiconductor layer is partially or entirely in contact with a side of the active layer.

Alternatively, the semiconductor light-emitting device according to the embodiment 1-D-1 of the present invention can be configured so that the impurity in the fourth compound semiconductor layer includes an impurity at a substitution site occupied by a Group V atom, and silicon (Si). The second object can be achieved by this configuration. The configuration is referred to as the "semiconductor light-emitting device according to an embodiment 1-D-3 of the present invention" for convenience sake. In other words, the fourth compound semiconductor layer in the semiconductor light-emitting device according to the embodiment 1-D-3 of the present invention is co-doped with the impurity at a substitution site occupied by a Group V atom and silicon (Si) as an impurity.

Alternatively, the semiconductor light-emitting device according to the first embodiment of the present invention can be configured so that, the first compound semiconductor layer, the second compound semiconductor layer, the third compound semiconductor layer, and fourth compound semiconductor layer are composed of Group III-V compound semiconductors, the substitution site of the impurity in the first compound semiconductor layer is a site occupied by a Group III atom, the substitution site of the impurity in the second compound semiconductor layer is a site occupied by a Group V atom, and the substitution site of the impurity in the third compound semiconductor layer and the substitution site of the impurity in the fourth compound semiconductor layer are sites occupied by Group III atoms.

This configuration is referred to as the "semiconductor light-emitting device according to an embodiment 1-c-1 of the present invention" for convenience sake.

The semiconductor light-emitting device according to the embodiment 1-c-1 of the present invention can be configured so that, the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by Group III atoms, and the impurity in the third B compound semiconductor layer is carbon (C).

The second object can be achieved by this configuration. The configuration is referred to as the "semiconductor light-emitting device according to an embodiment 1-c-2 of the present invention" for convenience sake. In addition, the third B compound semiconductor layer is partially or entirely in contact with a side of the active layer.

Alternatively, the semiconductor light-emitting device according to the embodiment 1-c-1 of the present invention can be configured so that the impurity in the third compound semiconductor layer includes an impurity at a substitution site occupied by a Group III atom, and carbon (C). The second object can be achieved by this configuration. The configuration is referred to as the "semiconductor light-emitting device according to an embodiment 1-c-3 of the present invention" for convenience sake. In other words, the third compound semiconductor layer in the semiconductor light-emitting device according to the embodiment 1-c-3 of the present invention is co-doped with an impurity at a substitution site occupied by a Group III atom and carbon (C) as an impurity.

Alternatively, the semiconductor light-emitting device according to the first embodiment of the present invention can be configured so that, the first compound semiconductor layer, the second compound semiconductor layer, the third compound semiconductor layer, and fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with the active layer, the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group V atom, the substitution site of the impurity in the first B compound semiconductor layer is a site occupied by a Group III atom, the substitution site of the impurity in the second B compound semiconductor layer is a site occupied by a Group V atom, the substitution site of the impurity in the second A compound semiconductor layer is a site occupied by a Group III atom, and the substitution site of the impurity in the third compound semiconductor layer and the substitution site of the impurity in the fourth compound semiconductor layer are sites occupied by Group III atoms.

This configuration is referred to as the "semiconductor light-emitting device according to an embodiment 1-d-1 of the present invention" for convenience sake.

The semiconductor light-emitting device according to the embodiment 1-d-1 of the present invention can be configured so that, the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by Group III atoms, and the impurity in the third B compound semiconductor layer is carbon (C).

The second object can be achieved by this configuration. The configuration is referred to as the "semiconductor light-emitting device according to an embodiment 1-d-2 of the present invention" for convenience sake. In addition, the third B compound semiconductor layer is partially or entirely in contact with a side of the active layer.

Alternatively, the semiconductor light-emitting device according to the embodiment 1-d-1 of the present invention can be configured so that the impurity in the third compound semiconductor layer is composed of an impurity at a substitution site occupied by a Group III atom, and carbon (C). The second object can be achieved by this configuration. The configuration is referred to as the "semiconductor light-emitting device according to an embodiment 1-d-3 of the present invention" for convenience sake. In other words, the third compound semiconductor layer in the semiconductor light-emitting device according to the embodiment 1-d-3 of the present invention is co-doped with an impurity at a substitution site occupied by a Group III atom and carbon (C) as an impurity.

The above-described semiconductor devices with preferred configurations according to the first embodiment of the present invention, i.e., the semiconductor devices according to the embodiments 1-A-1, 1-a-1, 1-B-1, 1-b-1, 1-C-1, 1-c-1, and 1-D-1 of the present invention, can be configured so that, the current-blocking layer has a structure further including a fifth compound semiconductor layer having the second conductivity type, and the third compound semiconductor layer is sandwiched between the fourth compound semiconductor layer and the fifth compound semiconductor layer, and the impurity for imparting the first conductivity type to the third compound semiconductor layer includes the impurity in the third compound semiconductor layer at a substitution site which is competitive with the substitution site of the impurity in the fifth compound semiconductor layer, for imparting the second conductivity type to the fifth compound semiconductor layer. In addition, a fourth compound semiconductor layer/third compound semiconductor layer/fifth compound semiconductor layer laminated structure from below may be used, or a fifth compound semiconductor layer/third compound semiconductor layer/fourth compound semiconductor layer laminated structure from below may be used.

Alternatively, the above-described semiconductor device can be configured so that, the current-blocking layer has a structure further including a sixth compound semiconductor layer having the first conductivity type, and the fourth compound semiconductor layer is sandwiched between the third compound semiconductor layer and the sixth compound semiconductor layer, and the impurity for imparting the second conductivity type to the fourth compound semiconductor layer includes an impurity in the fourth compound semiconductor layer at a substitution site which is competitive with the substitution site of the impurity in the sixth compound semiconductor layer, for imparting the first conductivity type to the sixth compound semiconductor layer. In addition, a third compound semiconductor layer/fourth compound semiconductor layer/sixth compound semiconductor layer laminated structure from below may be used, or a sixth compound semiconductor layer/fourth compound semiconductor layer/third compound semiconductor layer laminated structure from below may be used.

In order to achieve the first object, a semiconductor light-emitting device according to a second embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, and the impurity for imparting the first conductivity type to the first compound semiconductor layer is different from the impurity for imparting the first conductivity type to the third compound semiconductor layer.

Specifically, the first compound semiconductor layer containing the impurity different from the impurity for imparting the first conductivity type to the third compound semiconductor layer is a portion in contact with at least the active layer. The active layer in contact with the first compound semiconductor layer includes a well layer or a confinement layer. This applies to the description below. By providing the confinement layer, light and/or carriers can be confined. In addition, a fourth compound semiconductor layer/third compound semiconductor layer laminated structure from below can be used, or a third compound semiconductor layer/fourth compound semiconductor layer laminated structure from below can be used.

In the semiconductor light-emitting device according to the second embodiment of the present invention, the impurity for imparting the first conductivity type to the third compound semiconductor layer preferably has lower dependence on plane orientation than that of the impurity for imparting the first conductivity type to the first compound semiconductor layer.

In the description below, at least one type of impurity selected from the group consisting of three types of impurities, selenium (Se), tellurium (Te), and sulfur (S), is referred to as a "Group VI impurity" for convenience sake, at least one type of impurity selected from the group consisting of two types of impurities, silicon (Si) and tin (Sn), is referred to as a "Group IV impurity" for convenience sake, and at least one type of impurity selected from the group consisting of four types of impurities, zinc (Zn), magnesium (Mg), beryllium (Be), and manganese (Mn), is referred to as a "Group II impurity" for convenience sake.

The semiconductor light-emitting device having the preferred form according to the second embodiment of the present invention can be configured so that, the first compound semiconductor layer, the second compound semiconductor layer, the third compound semiconductor layer, and the fourth compound semiconductor layer are composed of Group III-V compound semiconductors, the impurity for imparting n-type which is the first conductivity type to the first compound semiconductor layer is a group VI impurity, and the impurity for imparting n-type which is the first conductivity type to the third compound semiconductor layer is a group IV impurity.

This configuration is referred to as the "semiconductor light-emitting device according to an embodiment 2-A of the present invention" for convenience sake. The semiconductor light-emitting device according to the embodiment 2-A of the present invention has 3×2=6 combinations of (the impurity in the first compound semiconductor layer and the impurity in the third compound semiconductor layer).

Alternatively, the semiconductor light-emitting device having the preferred form according to the second embodiment of the present invention can be configured so that, the first compound semiconductor layer, the second compound semiconductor layer, the third compound semiconductor layer, and the fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with the active layer, the second compound semiconductor layer includes a second B compound semiconductor layer in contact with the active layer and a second A compound semiconductor layer provided on the second B compound semiconductor layer, the impurity for imparting n-type which is the first conductivity type to the first A compound semiconductor layer is a group IV impurity, the impurity for imparting n-type which is the first conductivity type to the first B compound semiconductor layer is a group VI impurity, the impurity for imparting p-type which is the second conductivity type to the second B compound semiconductor layer is a group II impurity, the impurity for imparting p-type which is the second conductivity type to the second A compound semiconductor layer is carbon (C), the impurity for imparting n-type which is the first conductivity type to the third compound semiconductor layer is a group IV impurity, and the impurity for imparting p-type which is the second conductivity type to the fourth compound semiconductor layer is a group II impurity.

This configuration is referred to as the "semiconductor light-emitting device according to an embodiment 2-B of the present invention" for convenience sake. The semiconductor light-emitting device according to the embodiment 2-B of the present invention has 2×3×4×1×2×4=192 combinations of (the impurity in the first A compound semiconductor layer, the impurity in the first B compound semiconductor layer, the impurity in the second B compound semiconductor layer, the impurity in the second A compound semiconductor layer, the impurity in the third compound semiconductor layer, and the impurity in the fourth compound semiconductor layer).

Alternatively, the semiconductor light-emitting device having the preferred form according to the second embodiment of the present invention can be configured so that, the first compound semiconductor layer, the second compound semiconductor layer, the third compound semiconductor layer, and the fourth compound semiconductor layer are composed of Group III-V compound semiconductors, the impurity for imparting p-type which is the first conductivity type to the first compound semiconductor layer is a group II impurity, and the impurity for imparting p-type which is the first conductivity type to the third compound semiconductor layer is carbon (C).

This configuration is referred to as the "semiconductor light-emitting device according to an embodiment 2-C of the present invention" for convenience sake. The semiconductor light-emitting device according to the embodiment 2-C of the present invention has 4×1=4 combinations of (the impurity in the first compound semiconductor layer and the impurity in the third compound semiconductor layer).

Alternatively, the semiconductor light-emitting device having the preferred form according to the second embodiment of the present invention can be configured so that, the first compound semiconductor layer, the second compound semiconductor layer, the third compound semiconductor layer, and the fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with the active layer, the second compound semiconductor layer includes a second B compound semiconductor layer in contact with the active layer and a second A compound semiconductor layer provided on the second B compound semiconductor layer, the impurity for imparting p-type which is the first conductivity type to the first A compound semiconductor layer is carbon (C), the impurity for imparting p-type which is the first conductivity type to the first B compound semiconductor layer is a group II impurity, the impurity for imparting n-type which is the second conductivity type to the second B compound semiconductor layer is a group VI impurity, the impurity for imparting n-type which is the second conductivity type to the second A compound semiconductor layer is a group IV impurity, the impurity for imparting p-type which is the first conductivity type to the third compound semiconductor layer is carbon (C), and the impurity for imparting n-type which is the second conductivity type to the fourth compound semiconductor layer is a group VI impurity.

This configuration is referred to as the "semiconductor light-emitting device according to an embodiment 2-D of the present invention" for convenience sake. The semiconductor light-emitting device according to the embodiment 2-D of the present invention has 1×4×3×2×1×3=72 combinations of (the impurity in the first A compound semiconductor layer, the impurity in the first B compound semiconductor layer, the impurity in the second B compound semiconductor layer, the impurity in the second A compound semiconductor layer, the impurity in the third compound semiconductor layer, and the impurity in the fourth compound semiconductor layer).

In order to achieve the first object, a semiconductor light-emitting device according to a third embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, and the impurity for imparting the second conductivity type to the second compound semiconductor layer is different from the impurity for imparting the second conductivity type to the fourth compound semiconductor layer.

Specifically, the second compound semiconductor layer containing the impurity different from the impurity for imparting the second conductivity type to the fourth compound semiconductor layer is a portion in contact with at least the active layer (including a well layer or a confinement layer). In addition, a fourth compound semiconductor layer/third compound semiconductor layer laminated structure from below can be used, or a third compound semiconductor layer/fourth compound semiconductor layer laminated structure from below can be used.

In the semiconductor light-emitting device according to the third embodiment of the present invention, the impurity for imparting the second conductivity type to the fourth compound semiconductor layer preferably has lower dependence on plane orientation than that of the impurity for imparting the second conductivity type to the second compound semiconductor layer.

The semiconductor light-emitting device having the preferred form according to the third embodiment of the present invention can be configured so that, the first compound semiconductor layer, the second compound semiconductor layer, the third compound semiconductor layer, and the fourth compound semiconductor layer are composed of Group III-V compound semiconductors, the impurity for imparting p-type which is the second conductivity type to the second compound semiconductor layer is a group II impurity, and the impurity for imparting p-type which is the second conductivity type to the fourth compound semiconductor layer is carbon (C).

This configuration is referred to as the "semiconductor light-emitting device according to an embodiment 3-a of the present invention" for convenience sake. The semiconductor light-emitting device according to the embodiment 3-a of the present invention has 4×1=4 combinations of (the impurity in the second compound semiconductor layer and the impurity in the fourth compound semiconductor layer).

Alternatively, the semiconductor light-emitting device having a preferred form according to the third embodiment of the present invention can be configured so that, the first compound semiconductor layer, the second compound semiconductor layer, the third compound semiconductor layer, and the fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with the active layer, the second compound semiconductor layer includes a second B compound semiconductor layer in contact with the active layer and a second A compound semiconductor layer provided on the second B compound semiconductor layer, the impurity for imparting n-type which is the first conductivity type to the first A compound semiconductor layer is a group IV impurity, the impurity for imparting n-type which is the first conductivity type to the first B compound semiconductor layer is a group VI impurity, the impurity for imparting p-type which is the second conductivity type to the second B compound semiconductor layer is a group II impurity, the impurity for imparting p-type which is the second conductivity type to the second A compound semiconductor layer is carbon (C), the impurity for imparting n-type which is the first conductivity type to the third compound semiconductor layer is a group VI impurity, and the impurity for imparting p-type which is the second conductivity type to the fourth compound semiconductor layer is carbon (C).

This configuration is referred to as the "semiconductor light-emitting device according to an embodiment 3-b of the present invention" for convenience sake. The semiconductor light-emitting device according to the embodiment 3-b of the present invention has 2×3×4×1×3×1=72 combinations of (the impurity in the first A compound semiconductor layer, the impurity in the first B compound semiconductor layer, the impurity in the second B compound semiconductor layer, the impurity in the second A compound semiconductor layer, the impurity in the third compound semiconductor layer, and the impurity in the fourth compound semiconductor layer).

Alternatively, the semiconductor light-emitting device having the preferred form according to the third embodiment of the present invention can be configured so that, the first compound semiconductor layer, the second compound semiconductor layer, the third compound semiconductor layer, and the fourth compound semiconductor layer are composed of Group III-V compound semiconductors, the impurity for imparting n-type which is the second conductivity type the second compound semiconductor layer is a group VI impurity, and the impurity for imparting n-type which is the second conductivity type to the fourth compound semiconductor layer is a group IV impurity.

This configuration is referred to as the "semiconductor light-emitting device according to an embodiment 3-c of the present invention" for convenience sake. The semiconductor light-emitting device according to the embodiment 3-c of the present invention has 2×3=6 combinations of (the impurity in the second compound semiconductor layer and the impurity in the fourth compound semiconductor layer).

Alternatively, the semiconductor light-emitting device having the preferred form according to the third embodiment of the present invention can be configured so that, the first compound semiconductor layer, the second compound semiconductor layer, the third compound semiconductor layer, and the fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with the active layer, the second compound semiconductor layer includes a second B compound semiconductor layer in contact with the active layer and a second A compound semiconductor layer provided on the second B compound semiconductor layer, the impurity for imparting p-type which is the first conductivity type to the first A compound semiconductor layer is carbon (C), the impurity for imparting p-type which is the first conductivity type to the first B compound semiconductor layer is a group II impurity, the impurity for imparting n-type which is the second conductivity type to the second B compound semiconductor layer is a group VI impurity, the impurity for imparting n-type which is the second conductivity type the second A compound semiconductor layer is a group IV impurity, the impurity for imparting p-type which is the first conductivity type to the third compound semiconductor layer is a group II impurity, and the impurity for imparting n-type which is the second conductivity type to the fourth compound semiconductor layer is a group IV impurity.

This configuration is referred to as the "semiconductor light-emitting device according to an embodiment 3-d of the present invention" for convenience sake. The semiconductor light-emitting device according to the embodiment 3-d of the present invention has 1×4×3×2×4×2=192 combinations of (the impurity in the first A compound semiconductor layer, the impurity in the first B compound semiconductor layer, the impurity in the second B compound semiconductor layer, the impurity in the second A compound semiconductor layer, the impurity in the third compound semiconductor layer, and the impurity in the fourth compound semiconductor layer).

In order to achieve the first object, a semiconductor light-emitting device according to a fourth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, the first compound semiconductor layer, the second compound semiconductor layer, the third compound semiconductor layer, and the fourth compound semiconductor layer are composed of Group III-V compound semiconductors, the impurity for imparting n-type which is the first conductivity type to the first compound semiconductor layer is a group VI impurity, and the impurity for imparting n-type which is the first conductivity type to the third compound semiconductor layer is a group IV impurity.

The semiconductor light-emitting device according to the fourth embodiment of the present invention has 3×2=6 combinations of (the impurity in the first compound semiconductor layer and the impurity in the third compound semiconductor layer).

Specifically, the first compound semiconductor layer containing a group VI impurity is a portion in contact with at least the active layer (including a well layer or a confinement layer). In addition, a fourth compound semiconductor layer/third compound semiconductor layer laminated structure from below can be used, or a third compound semiconductor layer/fourth compound semiconductor layer laminated structure from below can be used.

In order to achieve the first object, a semiconductor light-emitting device according to a fifth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, the first compound semiconductor layer, the second compound semiconductor layer, the third compound semiconductor layer, and the fourth compound semiconductor layer are composed of Group III-V compound semiconductors, the impurity for imparting p-type which is the second conductivity type to the second compound semiconductor layer is a group II impurity, and the impurity for imparting p-type which is the second conductivity type to the fourth compound semiconductor layer is carbon (C).

The semiconductor light-emitting device according to the fifth embodiment of the present invention has 4×1=4 combinations of (the impurity in the second compound semiconductor layer and the impurity in the fourth compound semiconductor layer).

Specifically, the second compound semiconductor layer containing a group II impurity is a portion in contact with at least the active layer (including a well layer or a confinement layer). In addition, a fourth compound semiconductor layer/third compound semiconductor layer laminated structure from below can be used, or a third compound semiconductor layer/fourth compound semiconductor layer laminated structure from below can be used.

In order to achieve the first object, a semiconductor light-emitting device according to a sixth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, the first compound semiconductor layer, the second compound semiconductor layer, the third compound semiconductor layer, and the fourth compound semiconductor layer are composed of Group III-V compound semiconductors, the impurity for imparting p-type which is the first conductivity type to the first compound semiconductor layer is a group II impurity, and the impurity for imparting p-type which is the first conductivity type to the third compound semiconductor layer is carbon (C).

The semiconductor light-emitting device according to the sixth embodiment of the present invention has 4×1=4 combinations of (the impurity in the first compound semiconductor layer and the impurity in the third compound semiconductor layer).

Specifically, the first compound semiconductor layer containing a group II impurity is a portion in contact with at least the active layer (including a well layer or a confinement layer). In addition, a fourth compound semiconductor layer/third compound semiconductor layer laminated structure from below can be used, or a third compound semiconductor layer/fourth compound semiconductor layer laminated structure from below can be used.

In order to achieve the first object, a semiconductor light-emitting device according to a seventh embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, the first compound semiconductor layer, the second compound semiconductor layer, the third compound semiconductor layer, and the fourth compound semiconductor layer are composed of Group III-V compound semiconductors, the impurity for imparting n-type which is the second conductivity type to the second compound semiconductor layer is a group VI impurity, and the impurity for imparting n-type which is the second conductivity type to the third compound semiconductor layer is a group IV impurity.

The semiconductor light-emitting device according to the seventh embodiment of the present invention has 3×2=6 combinations of (the impurity in the second compound semiconductor layer and the impurity in the fourth compound semiconductor layer).

Specifically, the second compound semiconductor layer containing a group VI impurity is a portion in contact with at least the active layer (including a well layer or a confinement layer). In addition, a fourth compound semiconductor layer/third compound semiconductor layer laminated structure from below can be used, or a third compound semiconductor layer/fourth compound semiconductor layer laminated structure from below can be used.

In order to achieve the first object, a semiconductor light-emitting device according to an eighth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a laminated structure in which at least a fourth compound semiconductor layer having the second conductivity type and a third compound semiconductor layer having the first conductivity type are laminated in order, an impurity for imparting the second conductivity type to the fourth compound semiconductor layer includes an impurity in the fourth compound semiconductor layer at a substitution site which is competitive with the substitution site of the impurity in the third compound semiconductor layer, for imparting the first conductivity type to the third compound semiconductor layer and an impurity at a substitution site which is competitive with the substitution site of the impurity in the first compound semiconductor layer, for imparting the first conductivity type to the first compound semiconductor layer, an impurity for imparting the second conductivity type to the second compound semiconductor layer includes an impurity in the second compound semiconductor layer at a substitution site which is competitive with the substitution site of an impurity in the third compound semiconductor layer, for imparting the first conductivity type to the third compound semiconductor layer, and when an alternative route passing through the first compound semiconductor layer, the current-blocking layer, and the second compound semiconductor layer is assumed, at least three pn junction interfaces composed of the interfaces between the respective compound semiconductor layers are present in the alternative route.

The semiconductor light-emitting device according to the eighth embodiment of the present invention can be configured so that the fourth compound semiconductor layer is in contact with the side of the first compound semiconductor layer, and the third compound semiconductor layer is in contact with the side of the second compound semiconductor layer. In this case, the alternative route is composed of the first compound semiconductor layer, the fourth compound semiconductor layer, the third compound semiconductor layer, and the second compound semiconductor layer, and the pn junction interfaces include the three interfaces of the side of the first compound semiconductor layer/the fourth compound semiconductor layer, the fourth compound semiconductor layer/the third compound semiconductor layer, and the third compound semiconductor layer/the side of the second compound semiconductor layer.

Alternatively, the semiconductor light-emitting device according to the eighth embodiment of the present invention can be configured so that, the first compound semiconductor layer includes a first A compound semiconductor layer and a first B compound semiconductor layer provided on the first A compound semiconductor layer so as to be in contact with the active layer, the impurity for imparting the first conductivity type to the first B compound semiconductor layer includes an impurity in the first B compound semiconductor layer at a substitution site which is uncompetitive with the substitution site of the impurity in the first A compound semiconductor layer, for imparting the first conductivity type to the first A compound semiconductor layer, and the impurity at a substitution site uncompetitive with the substitution site of the impurity in the second compound semiconductor layer, for imparting the second conductivity type to the second compound semiconductor layer. In this case, the impurity for imparting the first conductivity type to the first A compound semiconductor layer includes an impurity in the first A compound semiconductor layer at a substitution site which is competitive with the substitution site of the impurity in the fourth compound semiconductor layer, for imparting the second conductivity type to the fourth compound semiconductor layer.

By the way, in the case of the configuration using the first B compound semiconductor layer, the relationship between the first B compound semiconductor layer and the fourth compound semiconductor layer in contact with the side of the first B compound semiconductor layer may be a relationship in which substitution sites of impurities are uncompetitive with each other. In such a case, impurity diffusion first occurs between the side of the first B compound semiconductor layer and the fourth compound semiconductor layer and then reaches the third compound semiconductor layer constituting the current-blocking layer, thereby possibly forming a current leak path.

In such a case, therefore, it is possible to form a structure in which a sixth compound semiconductor layer having the first conductivity type is provided below the fourth compound semiconductor layer, the impurity for imparting the first conductivity type to the sixth compound semiconductor layer includes an impurity in the sixth compound semiconductor layer at a substitution site which is competitive with the substitution site of the impurity in the first compound semiconductor layer (or the first A compound semiconductor layer), for imparting the first conductivity type to the first compound semiconductor layer (or the first A compound semiconductor layer), and the sixth compound semiconductor layer is in contact with the side of the first compound semiconductor layer (at least a portion of the side of the first A compound semiconductor layer and the whole side of the first b compound semiconductor layer), and the third compound semiconductor layer is in contact with the side of the second compound semiconductor layer. By employing this structure, the first B compound semiconductor layer and the fourth compound semiconductor layer which have uncompetitive impurity substitute sites are not in contact with each other, and thus impurity diffusion can be prevented. In this case, an alternative route includes the first compound semiconductor layer (the first A compound semiconductor layer and the first B compound semiconductor layer), the sixth compound semiconductor layer, the fourth compound semiconductor layer, the third compound semiconductor layer, and the second compound semiconductor layer, and the pn junction interfaces include the three interfaces of the sixth compound semiconductor layer/the fourth compound semiconductor layer, the fourth compound semiconductor layer/the third compound semiconductor layer, and the third compound semiconductor layer/the side of the second compound semiconductor layer.

Alternatively, in this case, an impurity diffusion barrier layer is preferably provided in the current-blocking layer in order to prevent the occurrence of a leakage current due to impurity diffusion from the first B compound semiconductor layer to the current-blocking layer. Specifically, a seventh compound semiconductor layer having the second conductivity type may be inserted as the impurity diffusion barrier layer into the fourth compound semiconductor layer having the second conductivity type, the fourth compound semiconductor layer and the seventh compound semiconductor layer having different impurity substitution sites. More specifically, at least one impurity diffusion barrier layer (e.g., the seventh compound semiconductor layer) having the second conductivity type may be inserted into the fourth compound semiconductor layer constituting the current-blocking layer and having the second conductivity type, and impurities may be selected so that the impurity substitution site in the fourth compound semiconductor layer is different from that in the impurity diffusion barrier layer (e.g., the seventh compound semiconductor layer when the impurity diffusion barrier layer is provided). By employing this configuration, it is possible to more securely prevent the phenomenon that a current leak path is formed in the alternative route due to impurity diffusion into the current-blocking layer.

Alternatively, the semiconductor light-emitting device according to the eighth embodiment of the present invention can be configured so that, the second compound semiconductor layer includes a second B compound semiconductor layer in contact with the active layer and a second A compound semiconductor layer provided on the second B compound semiconductor layer, the impurity for imparting the second conductivity type to the second B compound semiconductor layer includes the impurity in the second B compound semiconductor layer at a substitution site which is uncompetitive with the substitution site of the impurity in the second A compound semiconductor layer, for imparting the second conductivity type to the second A compound semiconductor layer, and the impurity uncompetitive with the substitution site of the impurity in the first compound semiconductor layer, for imparting the first conductivity type to the first compound semiconductor layer. In this case, the impurity for imparting the second conductivity type to the second A compound semiconductor layer includes the impurity in the second A compound semiconductor layer at a substitution site which is competitive with the substitution site of the impurity in the third compound semiconductor layer, for imparting the first conductivity type to the third compound semiconductor layer.

By the way, in the case of the configuration using the second B compound semiconductor layer, the relationship between the second B compound semiconductor layer and the third compound semiconductor layer in contact with the side of the second B compound semiconductor layer may be a relationship in which substitution sites of impurities are uncompetitive with each other. In such a case, impurity diffusion first occurs between the side of the second B compound semiconductor layer and the third compound semiconductor layer and then reaches the fourth compound semiconductor layer constituting the current-blocking layer, thereby possibly forming a current leak path.

In such a case, therefore, it is possible to form a structure in which a fifth compound semiconductor layer having the second conductivity type is provided on the third compound semiconductor layer, the impurity for imparting the second conductivity type to the fifth compound semiconductor layer includes an impurity in the fifth compound semiconductor layer at a substitution site which is competitive with the substitution site of the impurity in the second compound semiconductor layer (or the second A compound semiconductor layer), for imparting the second conductivity type to the second compound semiconductor layer (or the second A compound semiconductor layer), and the fourth compound semiconductor layer is in contact with the side of the first compound semiconductor layer, and the fifth compound semiconductor layer is in contact with the side of the second compound semiconductor layer (at least a portion of the side of the second A compound semiconductor layer and the whole side of the second B compound semiconductor layer). By employing this structure, the second B compound semiconductor layer and the fourth compound semiconductor layer which have uncompetitive impurity substitute sites are not in contact with each other, and thus impurity diffusion can be prevented. In this case, an alternative route includes the first compound semiconductor layer, the fourth compound semiconductor layer, the third compound semiconductor layer, the fifth compound semiconductor layer, and the second compound semiconductor layer (the second B compound semiconductor layer and the second A compound semiconductor layer), and the pn junction interfaces include the three interfaces of the side of the first compound semiconductor layer/the fourth compound semiconductor layer, the fourth compound semiconductor layer/the third compound semiconductor layer, and the third compound semiconductor layer/the fifth compound semiconductor layer.

Alternatively, in such a case, the impurity diffusion barrier layer is preferably provided in the current-blocking layer in order to prevent the occurrence of a leakage current due to impurity diffusion from the second B compound semiconductor layer to the current-blocking layer. Specifically, an eighth compound semiconductor layer having the first conductivity type may be inserted as the impurity diffusion barrier layer into the third compound semiconductor layer having the first conductivity type, the third compound semiconductor layer and the eighth compound semiconductor layer having different impurity substitution sites. More specifically, at least one impurity diffusion barrier layer (e.g., the eighth compound semiconductor layer) having the first conductivity type may be inserted into the third compound semiconductor layer constituting the current-blocking layer and having the first conductivity type, and impurities may be selected so that the impurity substitution site in the third compound semiconductor layer is different from that in the impurity diffusion barrier layer (e.g., the eighth compound semiconductor layer when the impurity diffusion barrier layer is provided). By employing this configuration, it is possible to more securely prevent the phenomenon that a current leak path is formed in the alternative route due to impurity diffusion into the current-blocking layer.

In the semiconductor light-emitting device according to the eighth embodiment of the present invention, the first compound semiconductor layer, the second compound semiconductor layer, the fourth compound semiconductor layer, and the third compound semiconductor layer are composed of Group III-V compound semiconductors. Alternatively, the first A compound semiconductor layer, the first B compound semiconductor layer, the second compound semiconductor layer, the fourth compound semiconductor layer, and the third compound semiconductor layer are composed of Group III-V compound semiconductors. Alternatively, the first compound semiconductor layer, the second B compound semiconductor layer, the second A compound semiconductor layer, the fourth compound semiconductor layer, and the third compound semiconductor layer are composed of Group III-V compound semiconductors.

Further, it is possible to make a configuration in which the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are sites occupied by group III atoms. This configuration is referred to as the "semiconductor light-emitting device according to an embodiment 8-A of the present invention" for convenience sake. In addition, it is possible to make a structure in which the fourth compound semiconductor layer is in contact with the side of the first compound semiconductor layer, and the third compound semiconductor layer is in contact with the side of the second compound semiconductor layer.

Here, the semiconductor light-emitting device according to the embodiment 8-A of the present invention can be configured so that, the impurity for imparting n-type which is the first conductivity type to the first compound semiconductor layer and the third compound semiconductor layer is a group IV impurity, and the impurity for imparting p-type which is the second conductivity type to the second compound semiconductor layer and the fourth compound semiconductor layer is a group II impurity. This configuration is referred to as the "semiconductor light-emitting device according to an embodiment 8-A-1 of the present invention" for convenience sake. the Semiconductor Light-Emitting Device According to the embodiment 8-A-1 of the present invention has $2\times4\times4\times2=64$ combinations of (the impurity in the first compound semiconductor layer, the impurity in the second compound semiconductor layer, the impurity in the fourth compound semiconductor layer, and the impurity in the third compound semiconductor layer).

Alternatively, the semiconductor light-emitting device according to the embodiment 8-A of the present invention can be configured so that, the impurity for imparting p-type which is the first conductivity type to the first compound semiconductor layer and the third compound semiconductor layer is a group II impurity, and the impurity for imparting n-type which is the second conductivity type to the second compound semiconductor layer and the fourth compound semiconductor layer is a group IV impurity. This configuration is referred to as the "semiconductor light-emitting device according to an embodiment 8-A-2 of the present invention" for convenience sake. The semiconductor light-emitting device according to the embodiment 8-A-2 of the present invention has $4\times2\times2\times4=64$ combinations of (the impurity in the first compound semiconductor layer, the impurity in the second compound semiconductor layer, the impurity in the fourth compound semiconductor layer, and the impurity in the third compound semiconductor layer).

Alternatively, it is possible to make a configuration in which the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are sites occupied by group V atoms. This configuration is referred to as the "semiconductor light-emitting device according to an embodiment 8-a of the present invention" for convenience sake. In addition, it is possible to make a structure in which the fourth compound semiconductor layer is in contact with the side of the first compound semiconductor layer, and the third compound semiconductor layer is in contact with the side of the second compound semiconductor layer.

Here, the semiconductor light-emitting device according to the embodiment 8-a of the present invention can be configured so that, the impurity for imparting n-type which is the first conductivity type to the first compound semiconductor layer and the third compound semiconductor layer is a group VI impurity, and the impurity for imparting p-type which is the second conductivity type to the second compound semiconductor layer and the fourth compound semiconductor layer is carbon (C). This configuration is referred to as the "semiconductor light-emitting device according to an embodiment 8-a-1 of the present invention" for convenience sake. The semiconductor light-emitting device according to the embodiment 8-a-1 of the present invention has $3\times1\times1\times3=9$ combinations of (the impurity in the first compound semiconductor layer, the impurity in the second compound semiconductor layer, the impurity in the fourth compound semiconductor layer, and the impurity in the third compound semiconductor layer).

Alternatively, the semiconductor light-emitting device according to the embodiment 8-a of the present invention can be configured so that, the impurity for imparting p-type which is the first conductivity type to the first compound semiconductor layer and the third compound semiconductor layer is carbon (C), and the impurity for imparting n-type which is the second conductivity type to the second compound semiconductor layer and the fourth compound semiconductor layer is a group VI impurity. This configuration is referred to as the "semiconductor light-emitting device according to an embodiment 8-a-2 of the present invention" for convenience sake. The semiconductor light-emitting device according to the embodiment 8-a-2 of the present invention has $1\times3\times3\times1=9$ combinations of (the impurity in the first compound semiconductor layer, the impurity in the second compound semiconductor layer, the impurity in the fourth compound semiconductor layer, and the impurity in the third compound semiconductor layer).

Alternatively, it is possible to make a configuration in which the substitution site of the impurity in the first A compound semiconductor layer, the substitution site of the impurity in the second compound semiconductor layer, the substitution site of the impurity in the fourth compound semiconductor layer, and the substitution site of the impurity in the third compound semiconductor layer are sites occupied by group III atoms, and the substitution site of the impurity in the first B compound semiconductor layer is a site occupied by a group V atom. This configuration is referred to as the "semiconductor light-emitting device according to an embodiment 8-B of the present invention" for convenience sake.

Here, the semiconductor light-emitting device according to the embodiment 8-B of the present invention can be configured so that, the impurity for imparting n-type which is the first conductivity type to the first B compound semiconductor layer and the third compound semiconductor layer is a group VI impurity, the impurity for imparting n-type which is the first conductivity type to the first A compound semiconductor layer and the third compound semiconductor layer is a group IV impurity, and the impurity for imparting p-type which is the second conductivity type to the second compound semiconductor layer and the fourth compound semiconductor layer is a group II impurity. This configuration is referred to as the "semiconductor light-emitting device according to an embodiment 8-B-1 of the present invention" for convenience sake. The semiconductor light-emitting device according to the embodiment 8-B-1 of the present invention has 2×3×4×4×2=192 combinations of (the impurity in the first A compound semiconductor layer, the impurity in the first B compound semiconductor layer, the impurity in the second compound semiconductor layer, the impurity in the fourth compound semiconductor layer, and the impurity in the third compound semiconductor layer).

In this case, it is possible to form a structure in which a sixth compound semiconductor layer having the first conductivity type is provided below the fourth compound semiconductor layer, the impurity for imparting the first conductivity type to the sixth compound semiconductor layer and the first A compound semiconductor layer is a group IV impurity, and the sixth compound semiconductor layer is in contact with the side of the first compound semiconductor layer (at least a portion of the side of the first A compound semiconductor layer and the whole side of the first B compound semiconductor layer), and the third compound semiconductor layer is in contact with the side of the second compound semiconductor layer.

Alternatively, the semiconductor light-emitting device according to the embodiment 8-B of the present invention can be configured so that, the impurity for imparting p-type which is the first conductivity type to the first A compound semiconductor layer and the third compound semiconductor layer is a group II impurity, the impurity for imparting p-type which is the first conductivity type to the first B compound semiconductor layer is carbon (C), and the impurity for imparting n-type which is the second conductivity type to the second compound semiconductor layer and the fourth compound semiconductor layer is a group IV impurity. This configuration is referred to as the "semiconductor light-emitting device according to an embodiment 8-B-2 of the present invention" for convenience sake. The semiconductor light-emitting device according to the embodiment 8-B-2 of the present invention has 4×1×2×2×4=64 combinations of (the impurity in the first A compound semiconductor layer, the impurity in the first B compound semiconductor layer, the impurity in the second compound semiconductor layer, the impurity in the fourth compound semiconductor layer, and the impurity in the third compound semiconductor layer).

In such a case, it is possible to form a structure in which a sixth compound semiconductor layer having the first conductivity type is provided below the fourth compound semiconductor layer, the impurity for imparting the first conductivity type to the sixth compound semiconductor layer and the first A compound semiconductor layer is a group II impurity, and the sixth compound semiconductor layer is in contact with the side of the first compound semiconductor layer (at least a portion of the side of the first A compound semiconductor layer and the whole side of the first B compound semiconductor layer), and the third compound semiconductor layer is in contact with the side of the second compound semiconductor layer.

Alternatively, it is possible to make a configuration in which the substitution site of the impurity in the first A compound semiconductor layer, the substitution site of the impurity in the second compound semiconductor layer, the substitution site of the impurity in the fourth compound semiconductor layer, and the substitution site of the impurity in the third compound semiconductor layer are sites occupied by group V atoms, and the substitution site of the impurity in the first B compound semiconductor layer is a site occupied by a group III atom. This configuration is referred to as the "semiconductor light-emitting device according to an embodiment 8-b of the present invention" for convenience sake.

Here, the semiconductor light-emitting device according to the embodiment 8-b of the present invention can be configured so that, the impurity for imparting n-type which is the first conductivity type to the first A compound semiconductor layer and the third compound semiconductor layer is a group VI impurity, the impurity for imparting n-type which is the first conductivity type to the first B compound semiconductor layer is a group IV impurity, and the impurity for imparting p-type which is the second conductivity type to the second compound semiconductor layer and the fourth compound semiconductor layer is carbon (C). This configuration is referred to as the "semiconductor light-emitting device according to an embodiment 8-b-1 of the present invention" for convenience sake. The semiconductor light-emitting device according to the embodiment 8-b-1 of the present invention has 3×2×1×1×3=18 combinations of (the impurity in the first A compound semiconductor layer, the impurity in the first B compound semiconductor layer, the impurity in the second compound semiconductor layer, the impurity in the fourth compound semiconductor layer, and the impurity in the third compound semiconductor layer).

In this case, it is possible to form a structure in which a sixth compound semiconductor layer having the first conductivity type is provided below the fourth compound semiconductor layer, the impurity for imparting the first conductivity type to the sixth compound semiconductor layer and the first A compound semiconductor layer is a group VI impurity, and the sixth compound semiconductor layer is in contact with the side of the first compound semiconductor layer (at least a portion of the side of the first A compound semiconductor layer and the whole side of the first B compound semiconductor layer), and the third compound semiconductor layer is in contact with the side of the second compound semiconductor layer.

Alternatively, the semiconductor light-emitting device according to the embodiment 8-b of the present invention can be configured so that, the impurity for imparting p-type which is the first conductivity type to the first A compound semiconductor layer and the third compound semiconductor layer is carbon (C), the impurity for imparting p-type which is the first conductivity type to the first B compound semiconductor layer is a group II impurity, and the impurity for imparting n-type which is the second conductivity type to the second compound semiconductor layer and the fourth compound semiconductor layer is a group VI impurity. This configuration is referred to as the "semiconductor light-emitting device according to an embodiment 8-b-2 of the present invention" for convenience sake. The semiconductor light-emitting device according to the embodiment 8-b-2 of the present invention has 1×4×3×3×1=36 combinations of (the impurity in the first A compound semiconductor layer, the impurity in the first B compound semiconductor layer, the impurity in the second compound semiconductor layer, the impurity in the fourth compound semiconductor layer, and the impurity in the third compound semiconductor layer).

In this case, it is possible to form a structure in which a sixth compound semiconductor layer having the first conductivity type is provided below the fourth compound semiconductor layer, the impurity for imparting the first conductivity type to the sixth compound semiconductor layer and the first A compound semiconductor layer is carbon (C), and the sixth compound semiconductor layer is in contact with the side of the first compound semiconductor layer (at least a portion of the side of the first A compound semiconductor layer and the whole side of the first B compound semiconductor layer), and the third compound semiconductor layer is in contact with the side of the second compound semiconductor layer.

Alternatively, it is possible to make a configuration in which the substitution site of the impurity in the first compound semiconductor layer, the substitution site of the impurity in the second A compound semiconductor layer, the substitution site of the impurity in the fourth compound semiconductor layer, and the substitution site of the impurity in the third compound semiconductor layer are sites occupied by group III atoms, and the substitution site of the impurity in the second B compound semiconductor layer is a site occupied by a group V atom. This configuration is referred to as the "semiconductor light-emitting device according to an embodiment 8-C of the present invention" for convenience sake.

Here, the semiconductor light-emitting device according to the embodiment 8-C of the present invention can be configured so that, the impurity for imparting n-type which is the first conductivity type to the first compound semiconductor layer and the third compound semiconductor layer is a group IV impurity, the impurity for imparting p-type which is the second conductivity type to the second A compound semiconductor layer and the fourth compound semiconductor layer is a group II impurity, and the impurity for imparting p-type which is the second conductivity type to the second B compound semiconductor layer is carbon (C). This configuration is referred to as the "semiconductor light-emitting device according to an embodiment 8-C-1 of the present invention" for convenience sake. The semiconductor light-emitting device according to the embodiment 8-C-1 of the present invention has 2×4×1×4×2=64 combinations of (the impurity in the first compound semiconductor layer, the impurity in the second A compound semiconductor layer, the impurity in the second B compound semiconductor layer, the impurity in the fourth compound semiconductor layer, and the impurity in the third compound semiconductor layer).

In this case, it is possible to form a structure in which a fifth compound semiconductor layer having the second conductivity type is provided on the third compound semiconductor layer, the impurity for imparting the second conductivity type to the fifth compound semiconductor layer and the second A compound semiconductor layer is a group II impurity, and the fifth compound semiconductor layer is in contact with the side of the second compound semiconductor layer (at least a portion of the side of the second A compound semiconductor layer and the whole side of the second B compound semiconductor layer), and the fourth compound semiconductor layer is in contact with the side of the first compound semiconductor layer.

Alternatively, the semiconductor light-emitting device according to the embodiment 8-C of the present invention can be configured so that, the impurity for imparting p-type which is the first conductivity type to the first compound semiconductor layer and the third compound semiconductor layer is a group II impurity, the impurity for imparting n-type which is the second conductivity type to the second A compound semiconductor layer and the fourth compound semiconductor layer is a group IV impurity, and the impurity for imparting n-type which is the second conductivity type to the second B compound semiconductor layer is a group VI impurity. This configuration is referred to as the "semiconductor light-emitting device according to an embodiment 8-C-2 of the present invention" for convenience sake. The semiconductor light-emitting device according to the embodiment 8-C-2 of the present invention has 4×2×3×2×4=192 combinations of (the impurity in the first compound semiconductor layer, the impurity in the second A compound semiconductor layer, the impurity in the second B compound semiconductor layer, the impurity in the fourth compound semiconductor layer, and the impurity in the third compound semiconductor layer).

In this case, it is possible to form a structure in which a fifth compound semiconductor layer having the second conductivity type is provided on the third compound semiconductor layer, the impurity for imparting the second conductivity type to the fifth compound semiconductor layer and the second A compound semiconductor layer is a group IV impurity, and the fifth compound semiconductor layer is in contact with the side of the second compound semiconductor layer (at least a portion of the side of the second A compound semiconductor layer and the whole side of the second B compound semiconductor layer), and the fourth compound semiconductor layer is in contact with the side of the first compound semiconductor layer.

Alternatively, it is possible to make a configuration in which the substitution site of the impurity in the first compound semiconductor layer, the substitution site of the impurity in the second A compound semiconductor layer, the substitution site of the impurity in the fourth compound semiconductor layer, and the substitution site of the impurity in the third compound semiconductor layer are sites occupied by group V atoms, and the substitution site of the impurity in the second B compound semiconductor layer is a site occupied by a group III atom. This configuration is referred to as the "semiconductor light-emitting device according to an embodiment 8-c of the present invention" for convenience sake.

Here, the semiconductor light-emitting device according to the embodiment 8-c of the present invention can be configured so that, the impurity for imparting n-type which is the first conductivity type to the first compound semiconductor layer and the third compound semiconductor layer is a group VI impurity, the impurity for imparting p-type which is the second conductivity type to the second A compound semiconductor layer and the fourth compound semiconductor layer is carbon (C), and the impurity for imparting p-type which is the second conductivity type to the second B compound semiconductor layer is a group II impurity. This configuration is referred to as the "semiconductor light-emitting device according to an embodiment 8-c-1 of the present invention" for convenience sake. The semiconductor light-emitting device according to the embodiment 8-c-1 of the present invention has 3×1×4×1×3=36 combinations of (the impurity in the first compound semiconductor layer, the impurity in the second A compound semiconductor layer, the impurity in the second B compound semiconductor layer, the impurity in the fourth compound semiconductor layer, and the impurity in the third compound semiconductor layer).

In such a case, it is possible to form a structure in which a fifth compound semiconductor layer having the second conductivity type is provided on the third compound semiconductor layer, the impurity for imparting the second conductivity type to the fifth compound semiconductor layer and the second A compound semiconductor layer is carbon (C), and the fifth compound semiconductor layer is in contact with the side of the second compound semiconductor layer (at least a portion of the side of the second A compound semiconductor layer and the whole side of the second B compound semiconductor layer), and the fourth compound semiconductor layer is in contact with the side of the first compound semiconductor layer.

Alternatively, the semiconductor light-emitting device according to the embodiment 8-c of the present invention can be configured so that, the impurity for imparting p-type which is the first conductivity type to the first compound semiconductor layer and the third compound semiconductor layer is carbon (C), the impurity for imparting n-type which is the second conductivity type to the second A compound semiconductor layer and the fourth compound semiconductor layer is a group VI impurity, and the impurity for imparting n-type which is the second conductivity type to the second B compound semiconductor layer is a group IV impurity. This configuration is referred to as the "semiconductor light-emitting device according to an embodiment 8-c-2 of the present invention" for convenience sake. The semiconductor light-emitting device according to the embodiment 8-c-2 of the present invention has 1×3×2×3×1=9 combinations of (the impurity in the first compound semiconductor layer, the impurity in the second A compound semiconductor layer, the impurity in the second B compound semiconductor layer, the impurity in the fourth compound semiconductor layer, and the impurity in the third compound semiconductor layer).

In this case, it is possible to form a structure in which a fifth compound semiconductor layer having the second conductivity type is provided on the third compound semiconductor layer, the impurity for imparting the second conductivity type to the fifth compound semiconductor layer and the second A compound semiconductor layer is a group VI impurity, and the fifth compound semiconductor layer is in contact with the side of the second compound semiconductor layer (at least a portion of the side of the second A compound semiconductor layer and the whole side of the second B compound semiconductor layer), and the fourth compound semiconductor layer is in contact with the side of the first compound semiconductor layer.

Alternatively, in the semiconductor light-emitting device according to the eighth embodiment of the present invention, a plurality of compound semiconductor layers may be provided between the fourth compound semiconductor layer and the third compound semiconductor layer which constitute the current-blocking layer. In other words, a configuration can be made, in which at least two compound semiconductor layers including a compound semiconductor layer having the first conductivity type and a compound semiconductor layer having the second conductivity type are further laminated in order between the fourth compound semiconductor layer and the third compound semiconductor layer. Specifically, when the first conductivity type and the second conductivity type are n-type and p-type, respectively, the current-blocking layer may be configured in a four-layer laminated structure including the p-type fourth compound semiconductor layer, a n-type compound semiconductor layer, a p-type compound semiconductor layer, and the n-type third compound semiconductor layer; a six-layer laminated structure including the p-type fourth compound semiconductor layer, a n-type compound semiconductor layer, a p-type compound semiconductor layer, a n-type compound semiconductor layer, a p-type compound semiconductor layer, and the n-type third compound semiconductor layer; or an eight-layer laminated structure including the p-type fourth compound semiconductor layer, a n-type compound semiconductor layer, a p-type compound semiconductor layer, a n-type compound semiconductor layer, a p-type compound semiconductor layer, a n-type compound semiconductor layer, a p-type compound semiconductor layer, and the n-type third compound semiconductor layer. Such a laminated structure may be expressed as "the p-type fourth compound semiconductor layer, (a n-type compound semiconductor layer, a p-type compound semiconductor layer)$_m$, and the n-type third compound semiconductor layer (wherein m=1, 2, 3 . . . )". Alternatively, specifically when the first conductivity type and the second conductivity type are p-type and n-type, respectively, the current-blocking layer may be configured in a laminated structure of the n-type fourth compound semiconductor layer, (a p-type compound semiconductor layer, a n-type compound semiconductor layer)$_m$, and the p-type third compound semiconductor layer (wherein m=1, 2, 3 . . . ). In this way, when the current-blocking layer is configured in a multilayer structure, even if a relative position between the light-emitting portion and the current-blocking layer shifts, it is possible to more securely prevent the phenomenon that a current leak path is formed in the alternative route. Further, even when the current-blocking layer is configured in a multilayer structure, it is desirable not to increase the thickness of the current-blocking layer and more desirable that at least one pn interface (or a np interface) of the compound semiconductor layers constituting the current-blocking layer is brought into contact with a side of the active layer. The contact area with the side of the light-emitting portion per layer of the compound semiconductor layers constituting the current-blocking layer is decreased, and consequently, the electric resistance value is increased. Therefore, a current leakage can be further suppressed, thereby permitting an attempt to improve optical output.

Further, as a more desirable form for the contact area with the side of the light-emitting portion per layer of the compound semiconductor layers constituting the current-blocking layer, it is preferred that the width of the contact area (the length of the contact area along the vertical direction of the side of the light-emitting portion) per layer of the compound semiconductor layers constituting the current-blocking layer is smaller than the width of the active layer (the length of the active layer in the vertical direction of the side of the light-emitting portion) which is sandwiched between the first compound semiconductor layer (or the first B compound semiconductor layer) and the second compound semiconductor layer (or the second B compound semiconductor layer). Alternatively, when the active layer has a quantum well structure, it is preferred that the width of the contact area per layer of the compound semiconductor layers constituting the current-blocking layer is smaller than the width (the length of a well layer along the vertical direction of the light-emitting portion) per layer of well layers constituting the quantum well structure. This structure has the problem in which the thickness of each of the compound semiconductor layers constituting the current-blocking layer must be significantly decreased, and thus in a conventional technique, as described above, the current-blocking layer including the {311}B plane and the higher-order crystal plane partially disappears or conversely significantly increases in thickness due to neutralization of the conductivity types which is caused by impurity mutual diffusion at the n-type compound semiconductor layer/the p-type compound semiconductor layer (or the p-type compound semiconductor layer/the n-type compound semiconductor layer) interface. However, in the semiconductor light-emitting device of the present invention, when a desired conductivity type is obtained for each of the compound semiconductor layers constituting the current-blocking layer, a combination of conductivity types is determined by general consideration of a competitive relationship between impurity substitution sites from the viewpoint of suppression of a leakage current. Therefore, even when the thickness of each of the compound semiconductor layers constituting the current-blocking layer is significantly decreased, it is possible to suppress the neutralization of conductivity type due to impurity mutual diffusion to improve the current blocking quality of the current-blocking layer itself and further to realize a structure for securely suppressing a current leakage from the side of the light-emitting portion.

In order to achieve the second object, a semiconductor light-emitting device according to a ninth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by group III atoms, and the impurity in the fourth B compound semiconductor layer is carbon (C). The fourth B compound semiconductor layer is partially or entirely in contact with a side of the active layer.

In order to achieve the second object, a semiconductor light-emitting device according to a tenth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, and the impurity in the fourth compound semiconductor layer includes an impurity at a substitution site occupied by a group III atom and a carbon (C). In other words, the fourth compound semiconductor layer in the semiconductor light-emitting device according to the tenth embodiment of the present invention is co-doped with an impurity at a substitution site occupied by a Group III atom and carbon (C) as an impurity.

In order to achieve the second object, a semiconductor light-emitting device according to an eleventh embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by group V atoms, and the impurity in the fourth B compound semiconductor layer is silicon (Si). The fourth B compound semiconductor layer is partially or entirely in contact with a side of the active layer.

In order to achieve the second object, a semiconductor light-emitting device according to a twelfth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, and the impurity in the fourth compound semiconductor layer includes an impurity at a substitution site occupied by a group V atom and silicon (Si). In other words, the fourth compound semiconductor layer in the semiconductor light-emitting device according to the twelfth embodiment of the present invention is co-doped with an impurity at a substitution site occupied by a Group V atom and silicon (Si) as an impurity.

In order to achieve the second object, a semiconductor light-emitting device according to a thirteenth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by group V atoms, and the impurity in the third B compound semiconductor layer is silicon (Si). The third B compound semiconductor layer is partially or entirely in contact with a side of the active layer.

In order to achieve the second object, a semiconductor light-emitting device according to a fourteenth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, and the impurity in the third compound semiconductor layer includes an impurity at a substitution site occupied by a group V atom and silicon (Si). In other words, the third compound semiconductor layer in the semiconductor light-emitting device according to the fourteenth embodiment of the present invention is co-doped with an impurity at a substitution site occupied by a Group V atom and silicon (Si) as an impurity.

In order to achieve the second object, a semiconductor light-emitting device according to a fifteenth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by group III atoms, and the impurity in the third B compound semiconductor layer is carbon (C). The third B compound semiconductor layer is partially or entirely in contact with a side of the active layer.

In order to achieve the second object, a semiconductor light-emitting device according to a sixteenth embodiment of the present invention includes:

(A) a light-emitting portion composed of a laminated structure in which a first compound semiconductor layer having a first conductivity type, an active layer, and a second compound semiconductor layer having a second conductivity type are laminated in order, and (B) a current-blocking layer provided in contact with the side of the light-emitting portion, wherein the current-blocking layer is composed of a third compound semiconductor layer having the first conductivity type and a fourth compound semiconductor layer having the second conductivity type and being in contact with the third compound semiconductor layer, and the impurity in the third compound semiconductor layer includes an impurity at a substitution site occupied by a group III atom and carbon (C). In other words, the third compound semiconductor layer in the semiconductor light-emitting device according to the sixteenth embodiment of the present invention is co-doped with an impurity at a substitution site occupied by a Group III atom and carbon (C) as an impurity.

In the above-described semiconductor light-emitting devices including the various preferred configurations and forms according to the first to sixteenth embodiments of the present invention, the opposing sides of the laminated structure are preferably composed of the {111}B plane. In addition, in this case, the light-emitting portion can be configured to be formed on a light-emitting portion forming region of the substrate, the light-emitting portion forming region of the substrate including a projecting portion which is formed on a {100} plane as a main surface of the substrate, which extends in substantially the {110}A crystal plane direction, and which has the {100} plane as a top surface. Further, the third compound semiconductor layer can be configured to include a {311}B crystal plane region extending from the side of the light-emitting portion, a {100} crystal plane region extending along the main surface of the substrate, and a {hll}B crystal plane region (wherein h is an integer of 4 or more) positioned between the {311}B crystal plane region and the {100} crystal plane region. Alternatively, the fourth compound semiconductor layer can be configured to include a {311}B crystal plane region extending from the side of the light-emitting portion, a {100} crystal plane region extending along the main surface of the substrate, and a {hll}B crystal plane region (wherein h is an integer of 4 or more) positioned between the {311}B crystal plane region and the {100} crystal plane region.

In the above-described semiconductor light-emitting devices including the various preferred configurations and forms according to the first to sixteenth embodiments of the present invention (hereinafter may be simply generically named the "semiconductor light-emitting device of the present invention", as the substrate, a GaN substrate, a GaP substrate, a GaAs substrate, an AlN substrate, an AlP substrate, an InN substrate, an InP substrate, an AlGaInN substrate, an AlGaN substrate, an AlInN substrate, a GaInN substrate, an AlGaInP substrate, an AlGaP substrate, an AlInP substrate, a GaInP substrate, and a ZnS substrate can be exemplified. In particular, a substrate having a zinc blende-type crystal structure or a substrate having a crystal film formed thereon is preferably used. As an atom constituting the substrate having a zinc blende-type crystal structure, at least As, Sb, Bi, or the like can be used. A substrate containing such an atom added thereto, consequently containing the atom as a mixed crystal, is more preferably used. Further, such a substrate having an underlying layer and a buffer layer formed on the surface (main surface) thereof can be used as the substrate. In addition, in crystal growth using such a substrate, at least one of As, Sb, and Bi is preferably added as a group V material or used as a mixed crystal. Consequently, crystal growth conditions for preventing migration of group III atoms can be easily set, thereby permitting the formation of a group V trimer on the {111}B plane as the uppermost surface and the formation of the {111}B plane as a non-growth plane.

In the semiconductor light-emitting device of the present invention, as the various compound semiconductor layers including the active layer, for example, a GaInNAs compound semiconductor (a GaInAs mixed crystal or containing a GaNAs mixed crystal), an AlGaInP compound semiconductor, an AlGaInAs compound semiconductor, a GaInAs compound semiconductor, a GaInAsP compound semiconductor, a GaInP compound semiconductor, a GaP compound semiconductor, and an InP compound semiconductor can be exemplified. As a method (deposition method) for forming the various compound semiconductor layers including the active layer, a metalorganic chemical vapor deposition method (MOCVD method or MOVPE method), a metalorganic molecular beam epitaxial method (MOMBE method), and a hydride vapor phase epitaxial method (HVPE method) in which a halogen contributes to transport or reaction can be used. In addition, as the semiconductor light-emitting device, a semiconductor laser and a light-emitting diode (LED) can be used.

In the semiconductor light-emitting device according to the first embodiment of the present invention, the impurity for imparting the first conductivity type to the third compound semiconductor layer constituting the current-blocking layer includes an impurity in the third compound semiconductor layer at a substitution site which is competitive with the substitution site of an impurity in the fourth compound semiconductor layer, for imparting the second conductivity type to the fourth compound semiconductor layer. Therefore, impurity inter-diffusion little occurs between the n-type compound semiconductor layer and the p-type compound semiconductor layer which constitute the current-blocking layer. As a result, it is possible to avoid the problem in which the current-blocking layer disappears or decreases in thickness, and thus the effect of the current-blocking layer is not stabilized, thereby increasing a leakage current. In addition, the impurity for imparting the first conductivity type to the first compound semiconductor layer includes an impurity in the first compound semiconductor layer at a substitution site which is uncompetitive with the substitution site of the impurity in the second compound semiconductor layer, for imparting the second conductivity type to the second compound semiconductor layer. Therefore, pn-junction control to be designed by intentional impurity inter-diffusion between the first compound semiconductor layer and the second compound semiconductor layer can be easily finely designed by controlling the impurity concentration and the doping position in each layer, thereby permitting an attempt to improve emission characteristics.

In the semiconductor light-emitting device according to the second embodiment of the present invention, the impurity for imparting the first conductivity type to the first compound semiconductor layer is different from the impurity for imparting the first conductivity type to the third compound semiconductor layer. In addition, in the semiconductor light-emitting device according to the third embodiment of the present invention, the impurity for imparting the second conductivity type to the second compound semiconductor layer is different from the impurity for imparting the second conductivity type to the fourth compound semiconductor layer. Further, in the semiconductor light-emitting device according to the fourth embodiment of the present invention, the impurity for imparting n-type which is the first conductivity type to the first compound semiconductor layer is a group VI impurity, and the impurity for imparting n-type which is the first conductivity type to the third compound semiconductor layer is a group IV impurity. In addition, in the semiconductor light-emitting device according to the fifth embodiment of the present invention, the impurity for imparting p-type which is the second conductivity type to the second compound semiconductor layer is a group II impurity, and the impurity for imparting p-type which is the second conductivity type to the fourth compound semiconductor layer is carbon (C). Further, in the semiconductor light-emitting device according to the sixth embodiment of the present invention, the impurity for imparting p-type which is the first conductivity type to the first compound semiconductor layer is a group II impurity, and the impurity for imparting p-type which is the first conductivity type to the third compound semiconductor layer is carbon (C). In addition, in the semiconductor light-emitting device according to the seventh embodiment of the present invention, the impurity for imparting n-type which is the second conductivity type to the second compound semiconductor layer is a group VI impurity, and the impurity for imparting n-type which is the second conductivity type to the fourth compound semiconductor layer is a group IV impurity. By employing these configurations and structures, it is possible to achieve a configuration and structure in which impurity inter-diffusion little occurs between the n-type compound semiconductor layer and the p-type compound semiconductor layer which constitute the current-blocking layer. As a result, it is possible to avoid the problem in which the current-blocking layer disappears or decreases in thickness, and thus the effect of the current-blocking layer is not stabilized, thereby increasing a leakage current.

Further, in the semiconductor light-emitting device according to the eighth embodiment of the present invention, when an alternative route passing through the first compound semiconductor layer, the current-blocking layer, and the second compound semiconductor layer is assumed, at least three pn junction interfaces composed of the interfaces between the respective compound semiconductor layers are present in the alternate route. In addition, the impurity for imparting a predetermined conductivity type to each of the compound semiconductor layers includes the impurity in each compound semiconductor layer at a substitution site which is competitive with the substitution site of the impurity in an adjacent compound semiconductor layer, for imparting a predetermined conductivity type to the adjacent compound semiconductor layer. Therefore, impurity inter-diffusion little occurs between the n-type compound semiconductor layer and the p-type compound semiconductor layer which constitute the current-blocking layer, and impurity inter-diffusion little occurs between the n-type compound semiconductor layer and the p-type compound semiconductor layer which constitute the current-blocking layer and the p-type compound semiconductor layer and the n-type compound semiconductor layer which constitute the light-emitting portion. As a result, it is possible to avoid the problem in which the current-blocking layer disappears or decreases in thickness, and thus the effect of the current-blocking layer is not stabilized, thereby increasing a leakage current.

The semiconductor light-emitting device according to each of the ninth, eleventh, thirteenth, and fifteenth embodiments of the present invention has the third compound semiconductor layer including at least three layers or the fourth compound semiconductor layer including at least three layers, and the third B compound semiconductor layer or the fourth B compound semiconductor layer in contact with a side of the active layer contains carbon (C) or silicon (Si) which is the impurity with relatively low diffusibility. Therefore, impurity diffusion into the active layer from the compound semiconductor layer in contact with a side of the active layer can be decreased. On the other hand, the semiconductor light-emitting device according to each of the tenth, twelfth, fourteenth, and sixteenth embodiments of the present invention has the third compound semiconductor layer or the fourth compound semiconductor layer which is composed of a compound semiconductor layer co-doped with carbon (C) or silicon (Si) which is an impurity with relatively low diffusibility. Therefore, impurity diffusion into the active layer from the compound semiconductor layer in contact with a side of the active layer can be decreased.

BEST MODE FOR CARRYING OUT THE INVENTION

The present invention will be described below with reference to the drawings on the basis of examples.

EXAMPLE 1

Example 1 relates to semiconductor light-emitting devices according to a first embodiment of the present invention (more specifically, an embodiment 1-A-1), a second embodiment of the present invention (more specifically, an embodiment 2-A), and a fourth embodiment of the present invention.

In Example 1 or Examples 2 to 25 described below, at least one type of impurity (group VI impurity) selected from the group consisting of selenium (Se), tellurium (Te), and sulfur (S), specifically selenium (Se), is used, at least one type of impurity (group IV impurity) selected from the group consisting of silicon (Si) and tin (Sn), specifically silicon (Si), is used, and at least one type of impurity (group II impurity) selected from the group consisting of zinc (Zn), magnesium (Mg), beryllium (Be), and manganese (Mn), specifically zinc (Zn), is used. However, impurities are not limited to these.

In addition, each of the semiconductor light-emitting devices in Example 1 or Examples 2 to 25 described below is composed of a semiconductor laser, more specifically a SDH-type semiconductor laser.

Figure 1:
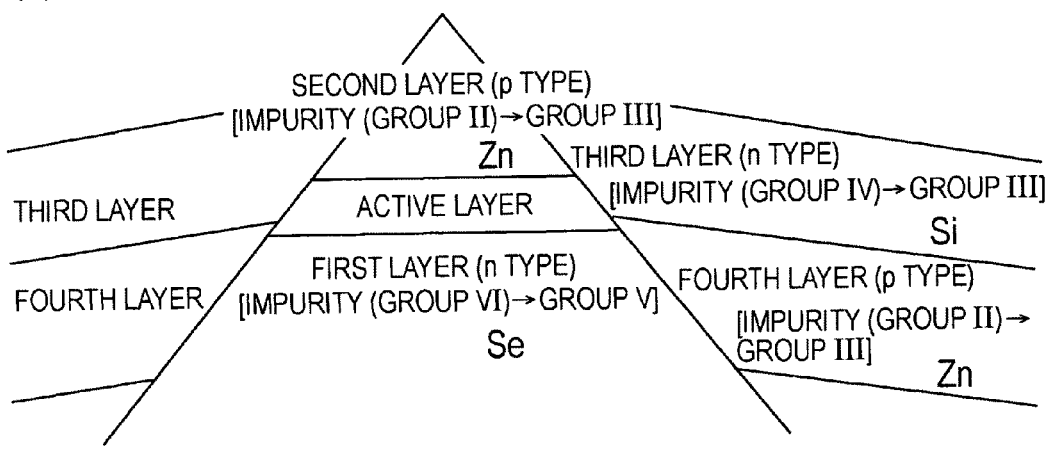
FIGS. 1(A) and (B) are conceptual views of semiconductor light-emitting devices of Example 1 and Example 5, respectively.
Figure 1:
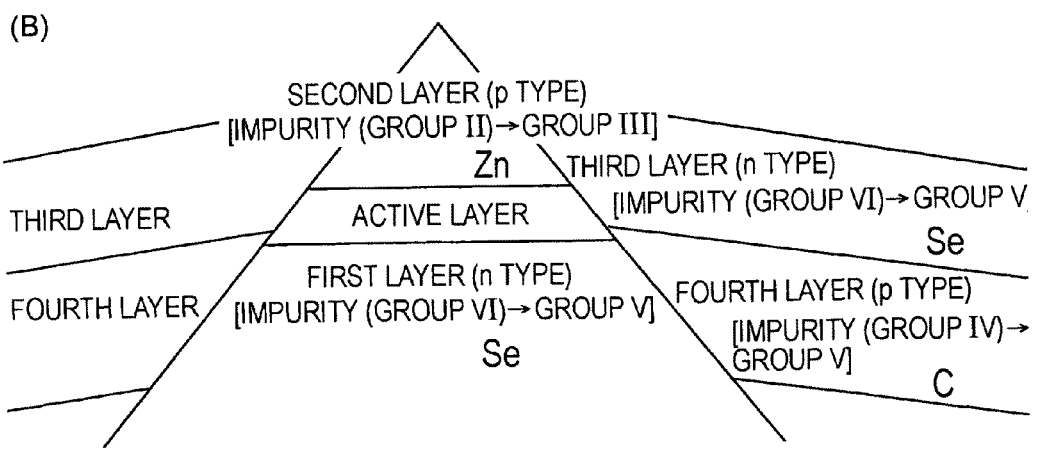

Here, as shown in a conceptual view of FIG. 1(A), a schematic partial sectional view of FIG. 23(A), and an enlarged schematic partial sectional view of FIG. 23(B), the semiconductor light-emitting device of Example 1 according to the first embodiment of the present invention is a semiconductor light-emitting device provided with:

(A) a light-emitting portion 20 composed of a laminated structure in which a first compound semiconductor layer 21 having a first conductivity type (in Example 1, n-type), an active layer 23, and second compound semiconductor layers 22A and 22B having a second conductivity type (in Example 1, p-type) are laminated in order, and (B) a current-blocking layer 40 provided in contact with the side of the light-emitting portion 20, wherein the current-blocking layer 40 is composed of a third compound semiconductor layer 43 having the first conductivity type (n-type) and a fourth compound semiconductor layer 44 having the second conductivity type (p-type) and being in contact with the third compound semiconductor layer 43. In order to simplify the drawings, the second compound semiconductor layers 22A and 22B are shown as one layer (second compound semiconductor layer 22) in the drawings.

In each of FIGS. 1(A) and (B) to 22(A) to (B), a "compound semiconductor layer" is simply expressed as a "layer". Namely, for example, a first layer represents a first compound semiconductor layer. Here, in an example shown in FIG. 23(B), the third compound semiconductor layer 43 is formed on the fourth compound semiconductor layer 44. In addition, a pn junction interface between the fourth compound semiconductor layer 44 (p-type) and the third compound semiconductor layer 43 (n-type) formed thereon extends along the {311}B crystal plane, and the ends of the pn junction interface are in contact with the light-emitting portion 20 (particularly, a side of the active layer 23) to form two new junction interfaces. Namely, a current path having a pnpn junction structure including a second compound semiconductor layers 23A, 23B/third compound semiconductor layer 43 pn junction interface, a third compound semiconductor layer 43/fourth compound semiconductor layer 44 np junction interface, and a fourth compound semiconductor layer 44/first compound semiconductor layer 21 pn junction interface is formed, thereby providing a preferred design as a current-blocking structure.

On the other hand, contrary to this laminated structure, the third compound semiconductor layer 43 (n-type) and the fourth compound semiconductor layer 44 (p-type) may be formed in a reversed positional relation therebetween. In addition, in this case, a pn junction interface between the fourth compound semiconductor layer 44 (p-type) and the third compound semiconductor layer 43 (n-type) provided below it extends along the {311}B crystal plane, and the ends of the pn junction interface are in contact with the light-emitting portion 20 (particularly, a side of the active layer 23) to form two new junction interfaces.

Namely, there are a second compound semiconductor layers 23A, 23B/fourth compound semiconductor layer 44 pp junction interface, a fourth compound semiconductor layer 44/third compound semiconductor layer 43 pn junction interface, and a third compound semiconductor layer 43/first compound semiconductor layer 21 nn junction interface. In this way, a ppnn junction structure of the second compound semiconductor layers 23A, 23B/the fourth compound semiconductor layer 44/the third compound semiconductor layer 43/the first compound semiconductor layer 21 is formed. However, the contact area (particularly the nn contact area) between the current-blocking layer 40 and the light-emitting portion 20 can be decreased to increase the resistance of the contact area, thereby permitting a design preferred as a current-blocking structure.

Further, the impurity for imparting the first conductivity type (n-type) to the first compound semiconductor layer 21 includes an impurity contained in the first compound semiconductor layer 21 at a substitution site which is uncompetitive with the substitution site of the impurity contained in the second compound semiconductor layers 22A and 22B, for imparting the second conductivity type (p-type) to the second compound semiconductor layers 22A and 22B. Further, the impurity for imparting the first conductivity type (n-type) to the third compound semiconductor layer 43 includes an impurity contained in the third compound semiconductor layer 43 at a substitution site which is competitive with the substitution site of the impurity contained in the fourth compound semiconductor layer 44 in contact with the third compound semiconductor layer 43, for imparting the second conductivity type (p-type) to the fourth compound semiconductor layer 44.

Specifically, when the semiconductor light-emitting device of Example 1 is described with reference to the embodiment 1-A-1 of the present invention, the first compound semiconductor layer 21, the second compound semiconductor layers 22A and 22B, the third compound semiconductor layer 43, and the fourth compound semiconductor layer 44 are composed of Group III-V compound semiconductors, the substitution site of the impurity in the first compound semiconductor layer 21 is a site occupied by a Group V atom, the substitution site of the impurity in the second compound semiconductor layers 22A and 22B is a site occupied by a Group III atom, and the substitution site of the impurity in the third compound semiconductor layer 43 and the substitution site of the impurity in the fourth compound semiconductor layer 44 are sites occupied by Group III atoms.

Alternatively, when described with reference to the second embodiment of the present invention, the semiconductor light-emitting device of Example 1 includes:

(A) a light-emitting portion 20 composed of a laminated structure in which a first compound semiconductor layer 21 having a first conductivity type (n-type), an active layer 23, and second compound semiconductor layers 22A and 22B having a second conductivity type (p-type) are laminated in order, and (B) a current-blocking layer 40 provided in contact with the side of the light-emitting portion 20.

In addition, the current-blocking layer 40 is composed of a third compound semiconductor layer 43 having the first conductivity type (n-type) and a fourth compound semiconductor layer 44 having the second conductivity type (p-type) and being in contact with the third compound semiconductor layer 43, and the impurity for imparting the first conductivity type (n-type) to the first compound semiconductor layer 21 is different from the impurity for imparting the first conductivity type (n-type) to the third compound semiconductor layer 43.

Specifically, when the semiconductor light-emitting device of Example 1 is described with reference to the embodiment 2-A of the present invention, the first compound semiconductor layer 21, the second compound semiconductor layers 22A and 22B, the third compound semiconductor layer 43, and the fourth compound semiconductor layer 44 are composed of Group III-V compound semiconductors, the impurity for imparting n-type which is the first conductivity type to the first compound semiconductor layer 21 is a group VI impurity, and the impurity for imparting n-type which is the first conductivity type to the third compound semiconductor layer is a group IV impurity.

Alternatively, when described with reference to the fourth embodiment of the present invention, the semiconductor light-emitting device of Example 1 includes:

(A) a light-emitting portion 20 composed of a laminated structure in which a first compound semiconductor layer 21 having a first conductivity type, an active layer 23, and second compound semiconductor layers 22A and 22B having a second conductivity type are laminated in order, and (B) a current-blocking layer 40 provided in contact with the side of the light-emitting portion 20.

In addition, the current-blocking layer 40 is composed of a third compound semiconductor layer 43 having the first conductivity type and a fourth compound semiconductor layer 44 having the second conductivity type and being in contact with the third compound semiconductor layer 43, the first compound semiconductor layer 21, the second compound semiconductor layers 22A and 22B, the third compound semiconductor layer 43, and the fourth compound semiconductor layer 44 are composed of Group III-V compound semiconductors, the impurity for imparting n-type which is the first conductivity type to the first compound semiconductor layer 21 is a group VI impurity, and the impurity for imparting n-type which is the first conductivity type to the third compound semiconductor layer 43 is a group IV impurity.

Specifically, in the semiconductor light-emitting device of Example 1, each of the layers has the configuration shown in Table 1A or 1B below, but the first compound semiconductor layer 21, the second compound semiconductor layers 22A and 22B, and the compound semiconductor layers constituting the current-blocking layer 40 are composed of compound semiconductors having a larger band gap, i.e., a lower refractive index, than that of the compound semiconductor layer constituting the active layer 23. In an example shown in Table 1A, the third compound semiconductor layer 43 is laminated on the fourth compound semiconductor layer 44, while in an example shown in Table 1B, the fourth compound semiconductor layer 44 is laminated on the third compound semiconductor layer 43. In the laminated structure shown in Table 1A, Table 1B, Table 2A, Table 2B, Table 3A, Table 3B, Table 4A, Table 4B, Table 5A, Table 5B, Table 6A, Table 6B, Table 7A, Table 7B, Table 8A, Table 8B, or Table 9A to Table 9L described below, a layer described in an upper line is positioned in an upper layer.

In Table 1A, Table 1B, Table 2A, Table 2B, Table 5A, Table 5BA, Table 6A, Table 6B, Table 9A, Table 9C, Table 9E, Table 9G, Table 9I, and Table 9K, the active layer having the structure shown in the table below is expressed as the "active layer-A". In the laminated structured, a layer described in an upper line is positioned in an upper layer.

[Active Layer-A]
  Confinement layer . . . p-$Al_{0.3}Ga_{0.7}As$:Zn
  Confinement layer . . . i-$Al_{0.3}Ga_{0.7}As$
  Multiquantum well structure . . . i-$Al_{0.1}Ga_{0.9}As$ (well layer)
  i-$Al_{0.3}Ga_{0.7}As$ (barrier layer), and
  i-$Al_{0.1}Ga_{0.9}As$ (well layer)
  Confinement layer . . . i-$Al_{0.3}Ga_{0.7}As$
  Confinement layer . . . n-$Al_{0.3}Ga_{0.7}As$:Se In Table 3A, Table 3B, Table 4A, Table 4B, Table 7A, Table 7B, Table 8A, Table 8B, Table 9B, Table 9D, Table 9F, Table 9H, Table 9J, and Table 9L, the active layer having the structure shown in the table below is expressed as the "active layer-B". In the laminated structure, a layer described in an upper line is positioned in an upper layer.

[Active Layer-B]
  Confinement layer . . . n-$Al_{0.3}Ga_{0.7}As$:Se
  Confinement layer . . . i-$Al_{0.3}Ga_{0.7}As$
  Multiquantum well structure . . . i-$Al_{0.1}Ga_{0.9}As$ (well layer)
  i-$Al_{0.3}Ga_{0.7}As$ (barrier layer), and
  i-$Al_{0.1}Ga_{0.9}As$ (well layer)
  Confinement layer . . . i-$Al_{0.3}Ga_{0.7}As$
  Confinement layer . . . p-$Al_{0.3}Ga_{0.7}As$:Zn

TABLE 1A

| (Configuration of light-emitting portion) | |
|---|---|
| Second compound semiconductor layer 22B | p-$Al_{0.47}Ga_{0.53}As$:Zn |
| Second compound semiconductor layer 22A | p-$Al_{0.4}Ga_{0.6}As$:Zn |
| Active layer 23 | [active layer-A] |
| First compound semiconductor layer 21 | n-$Al_{0.4}Ga_{0.6}As$:Se |
| (Current-blocking layer) | |
| Buried layer 31 | p-$Al_{0.47}Ga_{0.53}As$:Zn |
| Third compound semiconductor layer 43 | n-$Al_{0.47}Ga_{0.53}As$:Si |

TABLE 1A-continued

| | |
|---|---|
| Fourth compound semiconductor layer 44 | p-$Al_{0.47}Ga_{0.53}As:Zn$ |
| Current-blocking layer positioning layer 30 (Whole) | p-$Al_{0.47}Ga_{0.53}As:Zn$ |
| Contact layer 32 | p-GaAs:Zn (or C) |

(Note 1)
The current-blocking layer positioning layer 30 is formed following the formation of the second compound semiconductor layer 22B.
(Note 2)
The fourth compound semiconductor layer 44 is formed continuously following the formation of the current-blocking layer positioning layer 30 so that substantially no interface is present between the fourth compound semiconductor layer 44 and the current-blocking layer positioning layer 30.
(Note 3)
A fifth compound semiconductor layer composed of p-$Al_{0.47}Ga_{0.53}As:Zn$ (corresponding to the portion of the buried layer 31 which forms the interface with the third compound semiconductor layer 43) can be considered to be formed between the third compound semiconductor layer 43 and the buried layer 31.

TABLE 1B (Configuration of light-emitting portion)

| | |
|---|---|
| Second compound semiconductor layer 22B | p-$Al_{0.47}Ga_{0.53}As:Zn$ |
| Second compound semiconductor layer 22A | p-$Al_{0.4}Ga_{0.6}As:Zn$ |
| Active layer 23 | [active layer-A] |
| First compound semiconductor layer 21 | n-$Al_{0.4}Ga_{0.6}As:Se$ |

(Current-blocking layer)

| | |
|---|---|
| Buried layer 31 | p-$Al_{0.47}Ga_{0.53}As:Zn$ |
| Fourth compound semiconductor layer 44 | p-$Al_{0.47}Ga_{0.53}As:Zn$ |
| Third compound semiconductor layer 43 | n-$Al_{0.47}Ga_{0.53}As:Si$ |
| Current-blocking layer positioning layer 30 (Whole) | p-$Al_{0.47}Ga_{0.53}As:Zn$ |
| Contact layer 32 | p-GaAs:Zn (or C) |

(Note 1)
The current-blocking layer positioning layer 30 is formed following the formation of the second compound semiconductor layer 22B.
(Note 2)
The buried layer 31 is formed continuously following the formation of the fourth compound semiconductor layer 44 so that substantially no interface is present between the buried layer 31 and the fourth compound semiconductor layer 44.
(Note 3)
A fifth compound semiconductor layer composed of p-$Al_{0.47}Ga_{0.53}As:Zn$ (corresponding to the portion of the current-blocking layer positioning layer 30 which forms the interface with the third compound semiconductor layer 43) can be considered to be formed between the third compound semiconductor layer 43 and the current-blocking layer positioning layer 30.

In the semiconductor light-emitting device of Example 1 or Example 2 to Example 25 described below, the light-emitting portion 20 is formed on a light-emitting portion forming region 11 of the substrate 10. The light-emitting portion forming region 11 of the substrate 10 includes a projecting portion which is formed on the {100} plane as the main surface of the substrate 10, which extends in the {110}A plane direction (in the example shown in the drawing, the [011] A plane direction), and which has the {100} plane (in the example shown in the drawing, the (100) plane) as a top surface. Further, the substrate 10 includes a GaAs substrate, and the conductivity type of the substrate 10 is the same as that of the first compound semiconductor layer. In addition, the light-emitting portion forming region 11 has a so-called mesa structure (projecting portion). In the semiconductor light-emitting device of Example 1 or Example 2 to Example 25 described below, the opposing side surfaces of the laminated structure (the light-emitting portion 20) are composed of the {111}B plane (more specifically, the (11-1)B plane and (1-11)B plane).

Further, the third compound semiconductor layer 43 constituting a portion of the current-blocking layer is composed of, a {311}B crystal plane region (more specifically, a (31-1)B plane and a (3-11)B plane) extending from the side of the light-emitting portion 20, a {100} crystal plane region extending along the main surface of the substrate 10, and a {h11}B crystal plane region (more specifically, the (h1-1)B plane and a (h-11)B plane, wherein h is an integer of 4 or more) positioned between the {311}B crystal plane region and the {100} crystal plane region. For convenience sake, the {h11}B crystal plane region (wherein h is an integer of 4 or more) is referred to as the "higher-order crystal plane region".

Further, like the third compound semiconductor layer 43, the fourth compound semiconductor layer 44 formed below the third compound semiconductor layer 43 is composed of, a {311}B crystal plane region extending from the side of the light-emitting portion 20, a {100} crystal plane region extending along the main surface of the substrate 10, and a higher-order crystal plane region positioned between the {311}B crystal plane region and the {100} crystal plane region.

In addition, in the semiconductor light-emitting devices of Example 2 to Example 25 described below, the third compound semiconductor layer 43 and the fourth compound semiconductor layer 44 have basically the same structures as the above except the vertical positional relationship between the layers and except when the third B compound semiconductor layer or the fourth B compound semiconductor layer is provided.

In the semiconductor light-emitting device of Example 1, the buffer layer 12 having the first conductivity type and composed of GaAs, the first compound semiconductor layer 21, the active layer 23, and the second compound semiconductor layer 22A are successively formed on the light-emitting portion forming region 11 (on the {110} plane of the projecting portion or on the surface of the projection surface) which has a mesa structure provided on the substrate 10, and the second compound semiconductor layer 22B is further formed on the second compound semiconductor layer 22A to form the top. Here, the light-emitting portion 20 including the second compound semiconductor layer 22B has a triangular sectional shape in a section of the light-emitting portion forming region 11 taken along the {011}A plane, and the side of the light-emitting portion 20 includes the {111}B plane as described above. The light-emitting portion 20 having a triangular sectional shape can be accurately formed by changing the compositions of the second compound semiconductor layer 22A and the second compound semiconductor layer 22B. In the MOCVD method (also referred to as the MOVPE method), the {111}B plane is generally known as a non-growth plane covered with As trimer except the particular crystal growth conditions. Therefore, in the case of the SDH-type semiconductor laser, when the light-emitting portion 20 having the {111}B plane as the inclined surface (side) is formed, "self-growth termination" is maintained in crystal growth of the light-emitting portion even if the MOCVD is then continued. The {111}B plane is at an angle of 54.7 degrees. A portion having a triangular sectional shape can be formed of only the light-emitting portion 20.

On the other hand, the same structure as the light-emitting portion 20, the current-blocking layer positioning layer 30 (substantially continued from the second compound semiconductor layer 29), the current-blocking layer 40, and the buried layer (buried cladding layer) 31 are formed in order on the {100} plane (in the example shown in the drawing, the portion of the (100) plane) (referred to as the "recess surface" for convenience sake) as the main surface of the substrate.

In addition, the whole is covered with the contact layer (cap layer) 32 having the second conductivity type and composed of GaAs. Further, a first electrode 51 is formed on the back surface of the substrate 10, and a second electrode 52 is formed on the contact layer (cap layer) 32.

The semiconductor light-emitting devices of Example 2 to Example 25 described below have the same structure as the above except when the third B compound semiconductor layer or the fourth B compound semiconductor layer is provided.

The semiconductor light-emitting device of Example 1 can be manufactured, for example, on the basis of the method described below.

Figure 24:
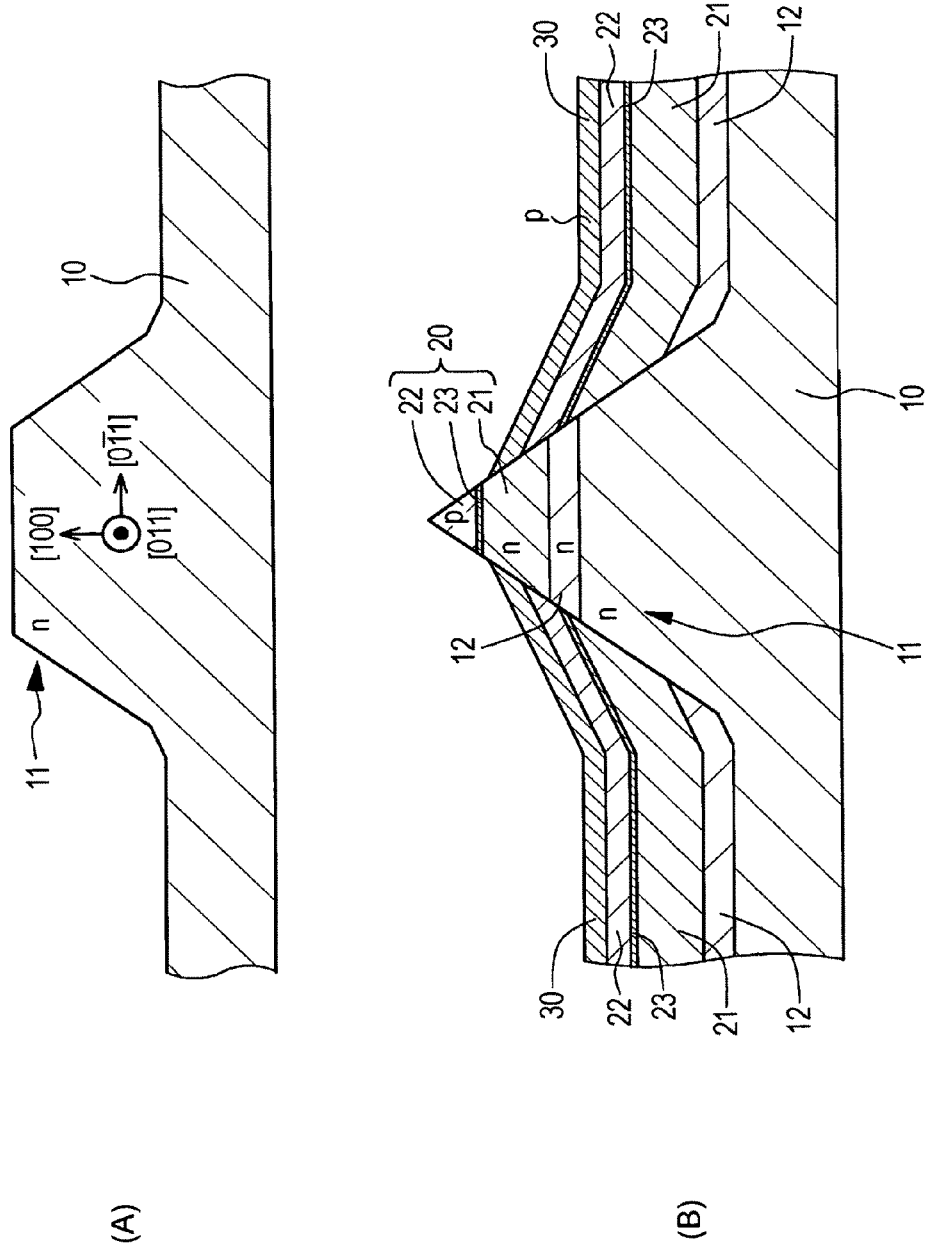
FIGS. 24(A) and (B) are schematic partial sectional views of a substrate, etc., for illustrating a method for manufacturing the semiconductor light-emitting device of Example 1.

First, a stripe-shaped etching mask having a required width is formed on the {100} crystal plane, e.g., the main surface composed of the {100} crystal plane, of the substrate 10 composed of n-GaAs so as to extend in the [011]A direction on the basis of a photolithographic technique, and the main surface is wet-etched with an etching solution containing, for example, $H_2SO_4$, $H_2O_2$, and $H_2O$ at a ratio of 3:1:1 using the etching mask to form the light-emitting portion forming region 11 extending in the [011]A direction. The width direction of the light-emitting portion forming region 11 is parallel to the [0-11]B direction. Then, the etching mask is removed. As a result, the structure shown in FIG. 24(A) can be obtained. In the light-emitting portion forming region 11, an inclined surface (side) composed of the {111}B plane is formed.

[Step-110]

Then, on the basis of the usual MOCVD method, i.e., the MOCVD method using an organic metal and hydrogen compound as raw material gases, the buffer layer 12, the first compound semiconductor layer 21, the active layer 23, and the second compound semiconductor layers 22A and 22B are epitaxially grown on the projection surface and the recess surface. In this growth, the inclined surface (side) of the compound semiconductor layer of the projection surface is composed of the {111}B plane which is the non-growth plane as described above. Therefore, the buffer layer 12, the first compound semiconductor layer 21, the active layer 23, and the second compound semiconductor layers 22A and 22B are formed (laminated) in a state in which these layers are divided between the region on the projection surface and the region on the recess surface. Consequently, the structure shown in FIG. 24(B) can be obtained.

The laminated structure of the light-emitting portion 20 having a triangular section can be obtained on the light-emitting portion forming region 11 (projection surface) by appropriately selecting the width and depth of the light-emitting portion forming region 11 (projection surface) and appropriately selecting the thickness of each of the buffer layer 12, the first compound semiconductor layer 21, the active layer 23, and the second compound semiconductor layers 22A and 22B.

[Step-120]

Figure 25:
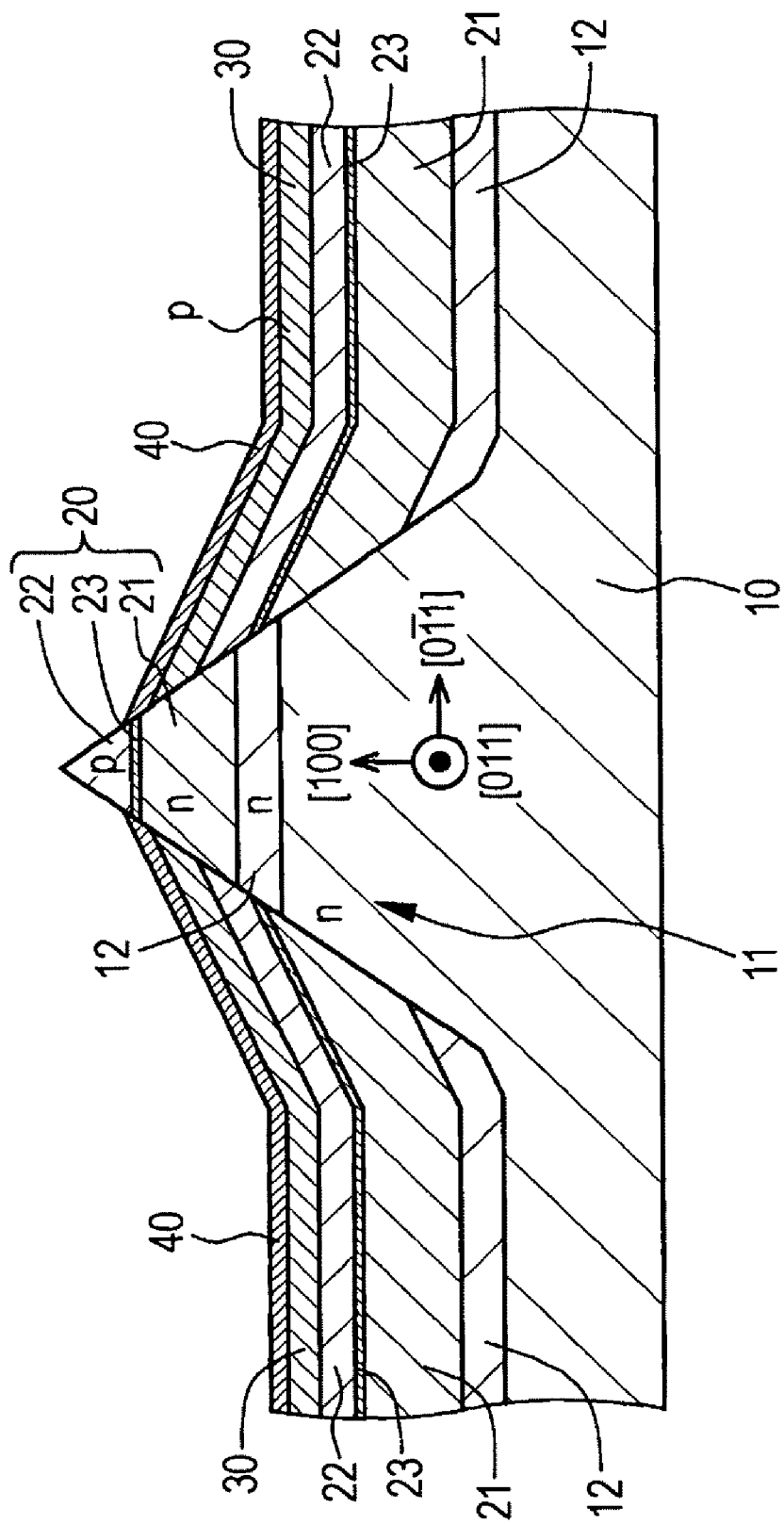
FIG. 25 is a schematic partial sectional view of a substrate, etc., for illustrating the method for manufacturing the semiconductor light-emitting device of Example 1 following FIG. 24(B).

Then, the current-blocking layer positioning layer 30 is formed over the entire surface following the formation of the second compound semiconductor layer 22B on the basis of the MOCVD method, and further the current-blocking layer 40 composed of, for example, the fourth compound semiconductor layer 44 and the third compound semiconductor layer 43 is formed in turn on the basis of the MOCVD method (refer to FIG. 25). The current-blocking layer 40 is not grown on the {111}B plane. In addition, the current-blocking layer 40 is formed so that the ends of the current-blocking layer 40 cover at least a side of the active layer 23. This configuration and structure can be achieved by appropriately selecting the thickness of the current-blocking layer positioning layer 30. The configurations and structures of the third compound semiconductor layer 43 and the fourth compound semiconductor layer 44 are as described above.

[Step-130]

Then, the buried layer 31 and the contact layer (cap layer) 32 are successively formed over the entire surface on the basis of the MOCVD method. Namely, when MOCVD is continued, consequently, the buried layer 31 composed of a compound semiconductor formed by crystal growth from the recess surface completely covers the light-emitting portion 20 under self-growth termination. Then, the second electrode 52 is formed on the contact layer 32 on the basis of a vacuum deposition method. On the other hand, the back surface of the substrate 10 is lapped to a proper thickness, and then the first electrode 51 is formed on the basis of a vacuum deposition method.

[Step-140]

Then, individual semiconductor light-emitting devices are separated to obtain semiconductor light-emitting devices.

The light-emitting devices of Example 2 to Example 25 described below can be manufactured on the basis of basically the same method as the above-described method.

By the way, in [Step-120], the current-blocking layer 40 composed of the fourth compound semiconductor layer 44 and the third compound semiconductor layer 43 is formed on the basis of the MOCVD method. Here, the fourth compound semiconductor layer 44 is composed of p-$Al_{0.47}Ga_{0.53}As$:Zn, and the third compound semiconductor layer 43 is composed of n-$Al_{0.47}Ga_{0.53}As$:Si. Namely, the substitution site of the impurity (Si) in the third compound semiconductor layer 43, for imparting the first conductivity type (n-type) to the third compound semiconductor layer 43 is a site occupied by a group III atom. Also, the substitution site of the impurity (Zn) in the fourth compound semiconductor layer 44, for imparting the second conductivity type (p-type) to the fourth compound semiconductor layer 44, is a site occupied by a group III atom. In other words, the impurity for imparting the first conductivity type to the third compound semiconductor layer 43 includes an impurity contained in the third compound semiconductor layer 43 at a substitution site which is competitive with the substitution site of the impurity in the fourth compound semiconductor layer 44, for imparting the second conductivity type to the fourth compound semiconductor layer 44.

Therefore, when the fourth compound semiconductor layer 44 and the buried layer 31 are deposited after the third compound semiconductor layer 43 is deposited, impurity inter-diffusion little occurs between the third compound semiconductor layer 43 and the fourth compound semiconductor layer 44 which constitute the current-blocking layer 40. Also, impurity inter-diffusion little occurs between the current-blocking layer 40 and the two layers in contact with the upper surface and the lower surface of the current-blocking layer 40. As a result, it is possible to avoid the problem in which the current-blocking layer 40 disappears or decreases in thickness, and thus the effect of the current-blocking layer 40 is not stabilized, thereby increasing a leakage current.

In addition, the impurity for imparting the first conductivity type (n-type) to the first compound semiconductor layer 21 includes an impurity contained in the first compound semiconductor layer 21 at a substitution site (a site occupied by a group V atom) which is uncompetitive with the substitution site (a site occupied by a group III atom) of the impurity in the second compound semiconductor layers 22A and 22B, for imparting the second conductivity type (p-type) to the second compound semiconductor layers 22A and 22B. Therefore, pn-junction control to be designed by intentional impurity inter-diffusion between the first compound semiconductor layer 21 and the second compound semiconductor layers 22A and 22B can be easily finely designed by controlling the impurity concentration and the doping position in each layer, thereby permitting an attempt to improve emission characteristics.

Here, in the semiconductor light-emitting device of Example 1, the active layer 23 formed on the light-emitting portion forming region 11 (projection surface) is surrounded in the lateral direction (side) by the current-blocking layer 40 having a lower refractive index than that of the active layer 23 and surrounded in the vertical direction by the first compound semiconductor layer 21 and the second compound semiconductor layers 22A and 22B which have a lower refractive index than that of the active layer 23. Therefore, the active layer 23 has a structure in which light is completely confined in the vertical direction and the lateral direction. In addition, a p-n-p-n structure (the p-type buried layer 31-the n-type third compound semiconductor layer 43-the p-type fourth compound semiconductor layer 44, the p-type current-blocking layer positioning layer 30 (the p-type second compound semiconductor layer 22B) and the p-type second compound semiconductor layer 22A-the n-type first compound semiconductor layer 21), i.e., a thyristor structure, is formed on the recess surface near a side of the active layer 23. Therefore, a current flow through the recess surface is inhibited, and thus a current is concentrated in the active layer 23, thereby permitting an attempt to decrease the threshold current. In this case, the p-type current-blocking layer positioning layer 30 can be regarded as the p-type fourth compound semiconductor layer 44 or the p-type second compound semiconductor layer 22B. This applies to Example 2, Example 5, and Example 6 which will be described below.

Figure 23:
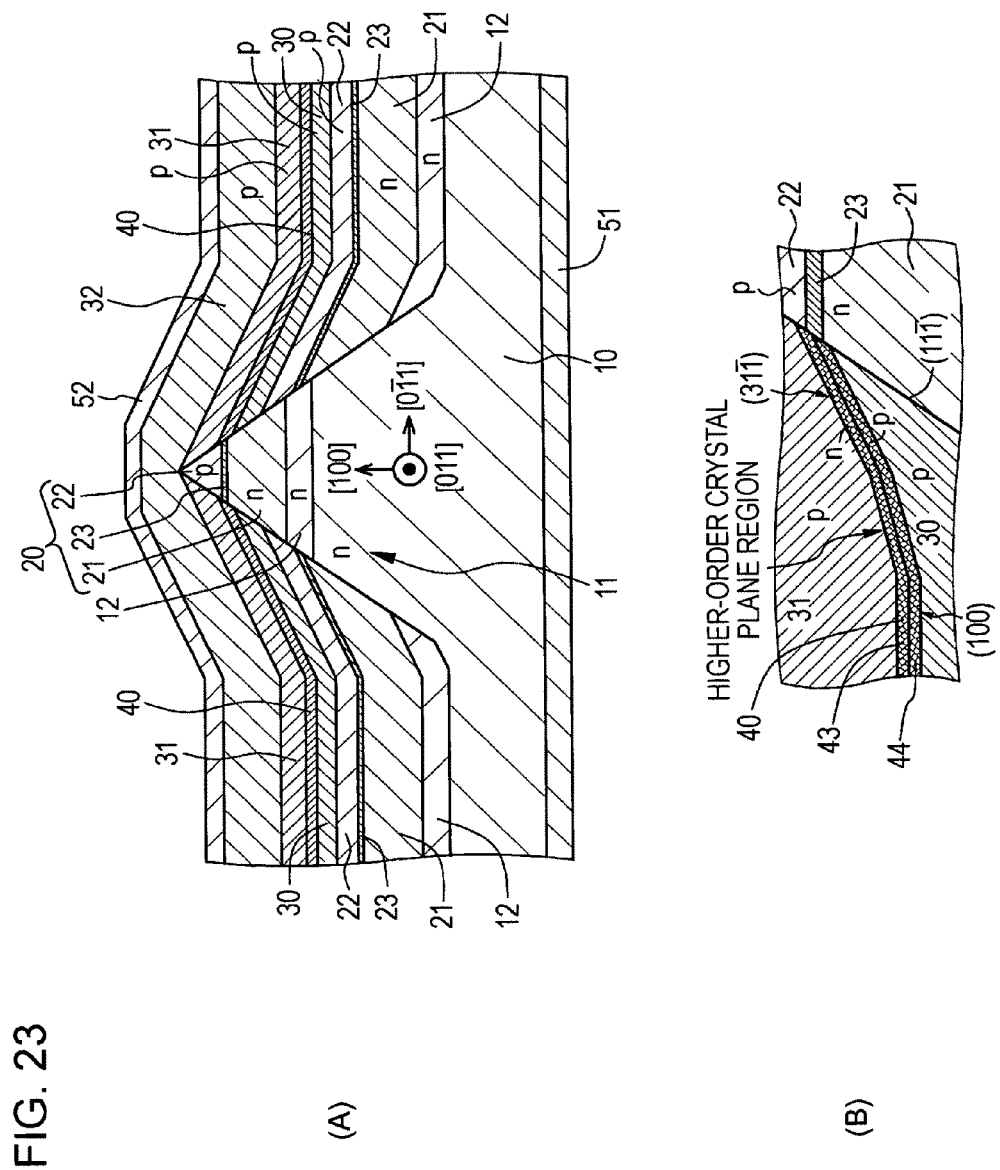
FIGS. 23(A) and (B) are a schematic partial sectional view and an enlarged schematic partial sectional view, respectively, of the semiconductor light-emitting device of Example 1.

Although FIG. 23 shows a structure in which the ends of the current-blocking layer 40 are in contact with a side of the active layer 23, there may be formed in a structure in which the ends of the current-blocking layer 40 are in contact with the sides of the second compound semiconductor layers 22A and 22B or a structure in which the ends of the current-blocking layer 40 are in contact with the side of the first compound semiconductor layer 21. In this structure, a leakage current can be practically suppressed. However, with respect to the position of the end at which the current-blocking layer 40 is in contact with the light-emitting portion 20, at least a portion of the current-blocking layer 40 is preferably in contact with a side of the active layer 23. This applies to Example 2 to Example 9 described below.

Figure 26:
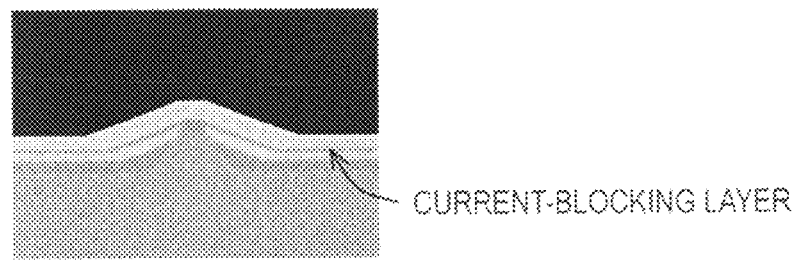
FIGS. 26(A) and (B) are drawings alternative to sectional photographs of the semiconductor light-emitting devices of Example 1 and Comparative Example 1, respectively.
Figure 26:
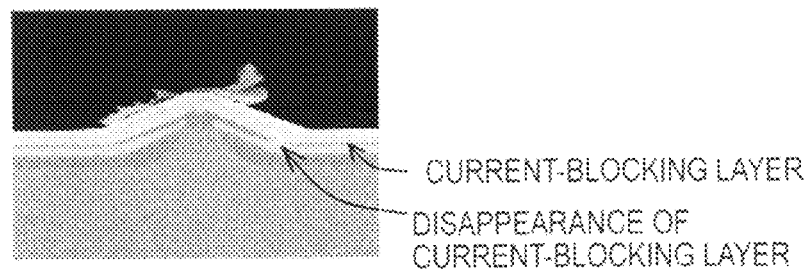

FIG. 26(A) shows a section photograph of the semiconductor light-emitting device of Example 1 shown in Table 1A. Also, FIG. 26(B) shows a section photograph of a semiconductor light-emitting device of Comparative Example 1. Further, FIGS. 27(A) and (B) show photographs of emission states (Near Field Pattern, NFT) of the semiconductor light-emitting devices of Example 1 and Comparative Example 1, respectively.

Figure 27:
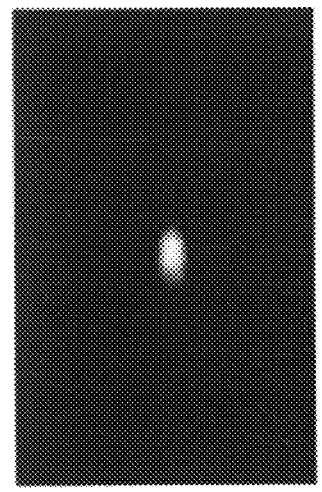
FIGS. 27(A) and (B) are drawings alternative to photographs of the emission conditions of the semiconductor light-emitting devices of Example 1 and Comparative Example 1, respectively.
Figure 27:
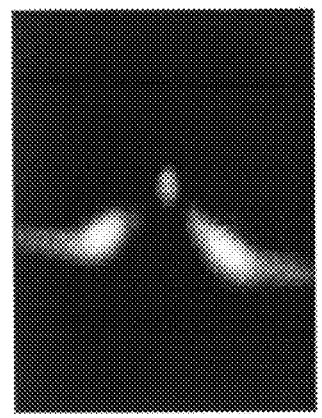

Here, in Comparative Example 1, the impurity for imparting the first conductivity type to the third compound semiconductor layer was selenium (Se). In other words, in Comparative Example 1, the impurity for imparting the first conductivity type (n-type) to the third compound semiconductor layer includes an impurity (Se) contained in the third compound semiconductor layer at a substitution site (a site occupied by a group V atom) which is uncompetitive with the substitution site (a site occupied by a group III atom) of the impurity (Zn) in the fourth compound semiconductor layer, for imparting the second conductivity type (p-type) to the fourth compound semiconductor layer. Although, in Comparative Example 1, in the same step as [step-120], the current-blocking layer composed of the third compound semiconductor layer and the fourth compound semiconductor layer is formed in order on the basis of the MOCVD method, the third compound semiconductor layer is composed of n-$Al_{0.47}Ga_{0.53}As$:Se, and the fourth compound semiconductor layer is composed of p-$Al_{0.47}Ga_{0.53}As$:Zn. As a result, when the fourth compound semiconductor layer 44 is laminated after the third compound semiconductor layer 43 is laminated, impurity inter-diffusion occurs between the third compound semiconductor layer and the fourth compound semiconductor layer constituting the current-blocking layer, and thus a portion (a portion of the higher-order crystal plane region) of the current-blocking layer disappears (refer to FIG. 26(B)). In Example 1 shown in Table 1A, even a portion of the current-blocking layer 40 does not disappear. As shown in FIG. 27(B), in Comparative Example 1, significant leakage current caused by the disappearance of a portion of the current-blocking layer is observed by light and shade in NFP evaluation.

In the photograph of the emission state (state of spontaneous emission) of the semiconductor light-emitting device of Example 1 shown in FIG. 27(A), a bright emission region is photographed at only one position, and the bright emission region corresponds to the light-emitting portion. On the other hand, in the photograph of the emission state of the semiconductor light-emitting device of Comparative Example 1 shown in FIG. 27(B), three bright emission regions are photographed, the bright emission region at a center position corresponding to spontaneous emission, and light and shade at two, right and left, positions in the peripheral region being due to the partial disappearance of the third compound semiconductor layer 43. Since, as described above, the third compound semiconductor layer 43 is in contact with the fourth compound semiconductor layer 44, the higher-order crystal plane region easily disappears due to the effect of impurity inter-diffusion in Comparative Example 1. Here, a region disappearing and a region not disappearing can be easily discriminated by light and shade in NFP, and a leakage region can be specified by a change in light and shade in NFP because a current is concentrated in a region in which an injected current easily leaks.

Figure 28:
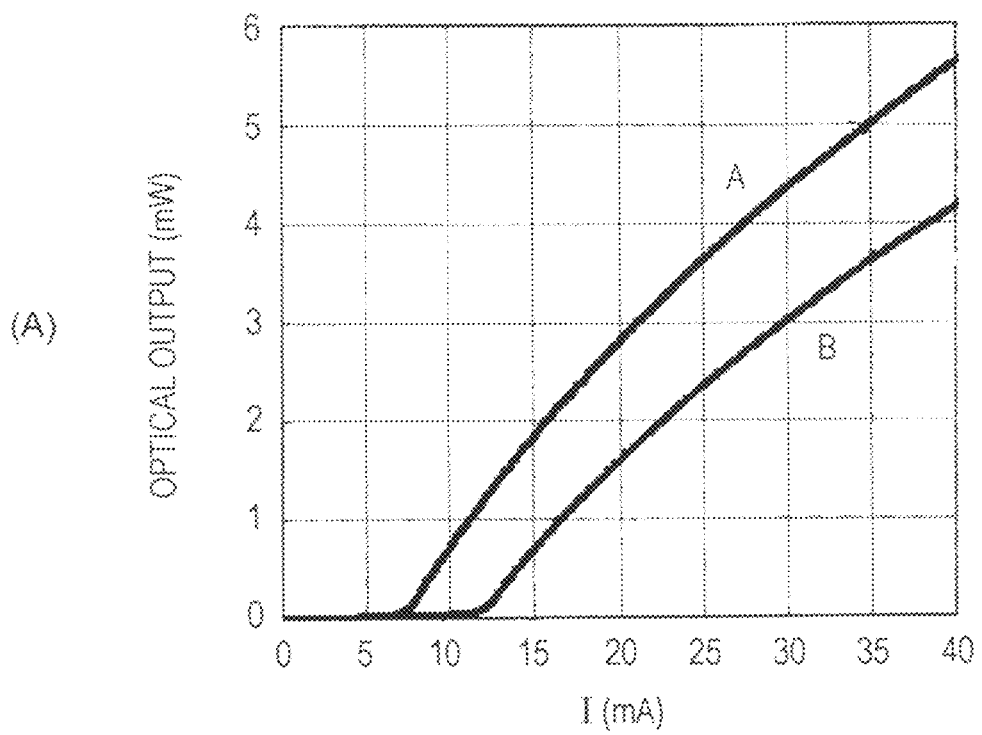
FIG. 28(A) is a graph showing the measurement results of the threshold current and the measurement results of the slope efficiency in the semiconductor light-emitting devices of Example 1 and Comparative Example 1.
FIG. 28(B) is a graph showing the measurement results of the threshold current and the measurement results of the slope efficiency in a semiconductor light-emitting device including a current-blocking layer having a multi-layer structure.
Figure 28:
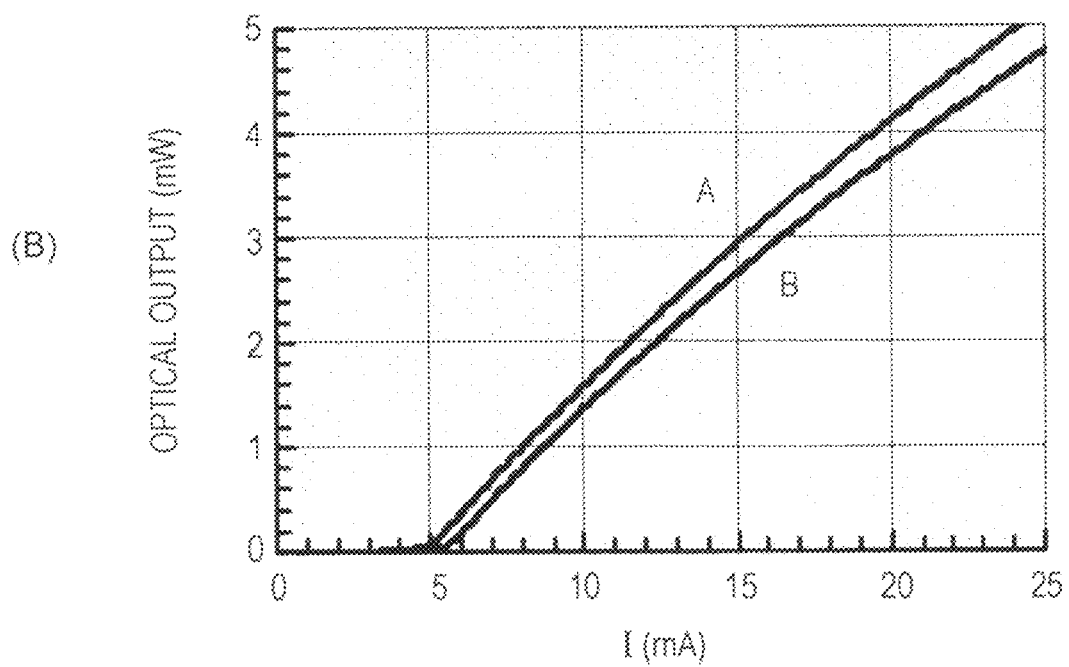
Figure 30:
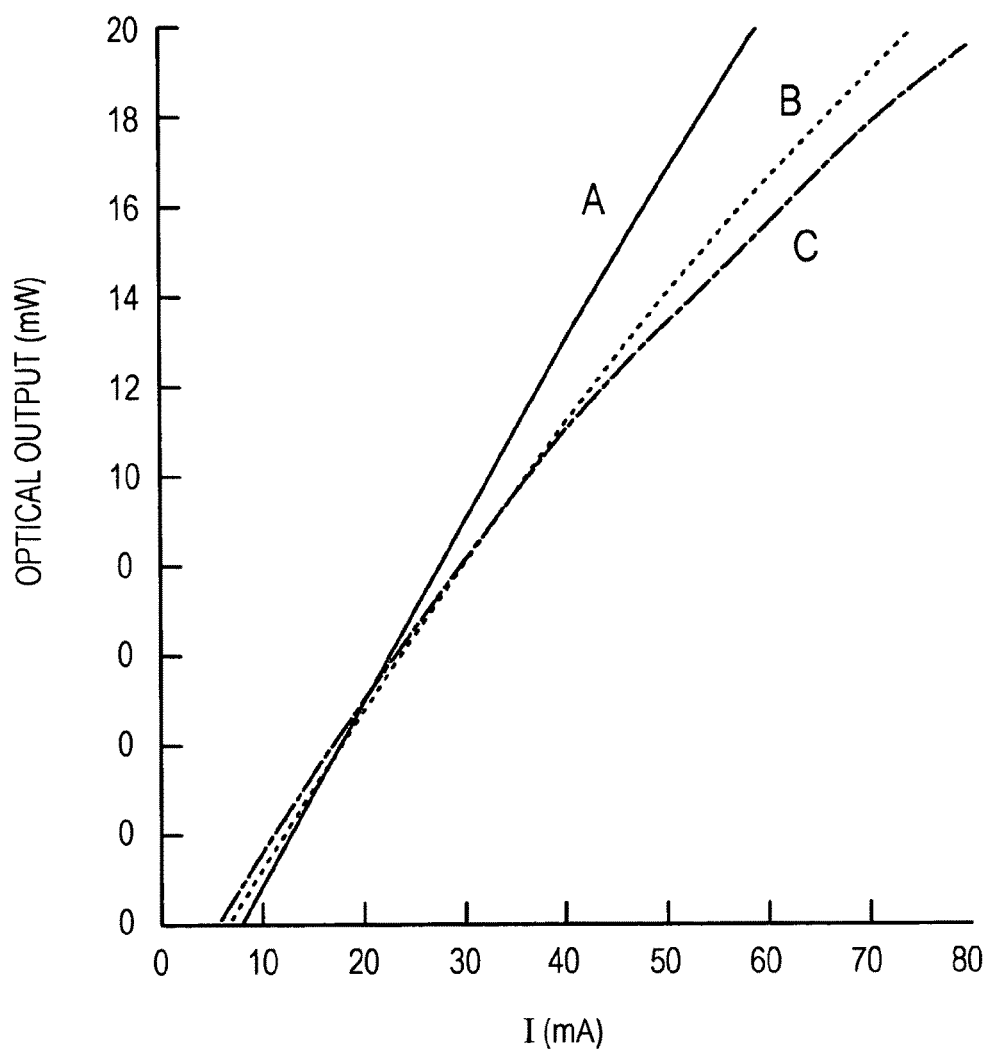
FIG. 30 is a graph showing the measurement results of light output in the semiconductor light-emitting device of Example 10 and in the semiconductor light-emitting devices of Example 1 and Comparative Example 1 shown in Table 1A.

Furthermore, FIG. 28(A) shows the measurement results of the threshold current and the measurement results of the slope efficiency in the semiconductor light-emitting devices of Example 1 and Comparative Example 1. In FIG. 28(A), the results of Example 1 are shown by "A", and the results of Comparative Example 1 are shown by "B". In FIG. 28(A) or FIG. 28(B) or FIG. 30 described below, the current value passed through the semiconductor light-emitting device is shown as abscissa, and the optical output is shown as ordinate.

It is found that Comparative Example 1 has a low slope efficiency and a high value of threshold current because of a large leakage current as compared with Example 1.

In addition, with respect to the efficiency of impurity incorporation into a crystal during crystal growth by the MOCVD method, when silicon (Si) is used as the impurity for imparting the first conductivity type (n-type) to the third compound semiconductor layer 43, the plane orientation dependence (crystal plane orientation dependence) is significantly smaller than that when selenium (Se) is used as the impurity for imparting the first conductivity type (n-type) to the first compound semiconductor layer 21 (refer to, for example, Makoto Kondo, et. al., "Crystallographic orientation dependence of impurity incorporation into III-V compound semiconductors grown by metalorganic vapor phase epitaxy", J. Appl. Phys., 76(2). 15 Jul. 1994). Further, when the third compound semiconductor layer 43 is deposited, $Si_2H_6$ (disilane) gas is preferably used as a raw material gas for adding silicon (Si). The prime reason for this is that the crystal plane orientation dependence of Si impurity to be incorporated into A plane crystal can be further improved to be decreased by using $Si_2H_6$ (disilane) gas. Therefore, when $Si_2H_6$ (disilane) gas is used for a general semiconductor light-emitting device which is a semiconductor laser using an A plane crystal, a SDH laser of the present invention (a semiconductor light-emitting device using a B plane crystal), or the like, there is no need to consider the crystal plane orientation dependence in impurity doping of a semiconductor light-emitting device using an A plane crystal or a B plane crystal, thereby significantly facilitating the control of Si doping. This applies to the examples described below.

Here, when the crystal growth temperature and the impurity raw gas supply rate are constant, in a graph in which the off angle of B plane (inclination angle with the {100} plane) or the off angle of A plane (inclination angle with the {100} plane) is shown as abscissa, and the impurity concentration in a single-layer crystal film is shown as ordinate, it can be said that the flatter the characteristic plot curve, the smaller the crystal plane orientation dependence. In particular, in evaluation by a comparison, it can be said that the more the plot curve is closed to be flat, the smaller the crystal plane orientation dependence. This applies to Example 3, Example 5, and Example 7.

Therefore, in forming (depositing) the third compound semiconductor layer 43, the {311}B crystal plane region extending from the side of the light-emitting portion 20, the {100} crystal plane region extending along the main surface of the substrate 10, and the higher-order crystal plane region positioned between the {311}B crystal plane region and the {100} crystal plane region are formed in the third compound semiconductor layer 43, but there occurs small variation in the doping concentration of Si as the impurity in these regions. Consequently, the third compound semiconductor layer 43 having a stable (uniform) impurity concentration can be formed (laminated), and a concentration balance between the third compound semiconductor layer 43 and a layer in contact therewith and having the other conductivity type can be easily controlled. Therefore, the current-blocking layer 40 having a high current-blocking ability can be obtained. In addition, since the third compound semiconductor layer 43 having a stable impurity concentration can be formed (laminated), when the third compound semiconductor layer 43 is formed on the fourth compound semiconductor layer 44 or the fourth compound semiconductor layer 44 is formed on the third compound semiconductor layer 43, it is possible to more securely avoid the problem in which the third compound semiconductor layer 43 or the fourth compound semiconductor layer 44 disappears or the current-blocking layer 40 decreases in thickness, and thus the effect of the current-blocking layer 40 is not stabilized, thereby increasing a leakage current.

EXAMPLE 2

Example 2 is a modification of Example 1 and relates to an embodiment 1-B-1 of the present invention and an embodiment 2-B of the present invention.

Specifically, as shown in a conceptual view of FIG. 4(A), when a semiconductor light-emitting device of Example 2 is described with reference to the embodiment 1-B-1 of the present invention, a first compound semiconductor layer, a second compound semiconductor layer, a third compound semiconductor layer, and a fourth compound semiconductor layer are composed of group III-V compound semiconductors, the first compound semiconductor layer includes a first A compound semiconductor layer and a first B compound semiconductor layer provided on the first A compound semiconductor layer so as to be in contact with an active layer, the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group III atom, the substitution site of the impurity in the first B compound semiconductor layer is a site occupied by a Group V atom, the substitution site of the impurity in the second B compound semiconductor layer is a site occupied by a Group III atom, the substitution site of the impurity in the second A compound semiconductor layer is a site occupied by a Group V atom, and the substitution site of the impurity in the third compound semiconductor layer and the substitution site of the impurity in the fourth compound semiconductor layer are sites occupied by Group III atoms.

Alternatively, when the semiconductor light-emitting device of Example 2 is described with reference to the embodiment 2-B of the present invention, a first compound semiconductor layer, a second compound semiconductor layer, a third compound semiconductor layer, and a fourth compound semiconductor layer are composed of Group III-V compound semiconductors, the first compound semiconductor layer includes a first a compound semiconductor layer and a first B compound semiconductor layer provided on the first A compound semiconductor layer so as to be in contact with an active layer, the second compound semiconductor layer includes a second B compound semiconductor layer in contact with the active layer and a second A compound semiconductor layer provided on the second B compound semiconductor layer, the impurity for imparting n-type which is the first conductivity type to the first A compound semiconductor layer is a group IV impurity, the impurity for imparting n-type which is the first conductivity type to the first B compound semiconductor layer is a group VI impurity, the impurity for imparting p-type which is the second conductivity type to the second B compound semiconductor layer is a group II impurity, the impurity for imparting p-type which is the second conductivity type to the second A compound semiconductor layer is carbon (C), the impurity for imparting n-type which is the first conductivity type to the third compound semiconductor layer is a group IV impurity, and the impurity for imparting p-type which is the second conductivity type to the fourth compound semiconductor layer is a group II impurity.

More specifically, in the semiconductor light-emitting device of Example 2, each of the layers has the configuration shown in Table 2A or Table 2B below. In an example shown in Table 2A, the third compound semiconductor layer is laminated on the fourth compound semiconductor layer, while in an example in Table 2B, the fourth compound semiconductor layer is laminated on the third compound semiconductor layer.

TABLE 2A (Configuration of light-emitting portion)

| | |
|---|---|
| Second A compound semiconductor layer | p-$Al_{0.4}Ga_{0.6}As$:C |
| Second B compound semiconductor layer | p-$Al_{0.4}Ga_{0.6}As$:Zn |
| Active layer | [active layer-A] |
| First B compound semiconductor layer | n-$Al_{0.4}Ga_{0.6}As$:Se |
| First A compound semiconductor layer | n-$Al_{0.4}Ga_{0.6}As$:Si |
| (Current-blocking layer) | |
| Buried layer | p-$Al_{0.47}Ga_{0.53}As$:Zn |
| Third compound semiconductor layer | n-$Al_{0.47}Ga_{0.53}As$:Si |
| Fourth compound semiconductor layer | p-$Al_{0.47}Ga_{0.53}As$:Zn |
| Current-blocking layer positioning layer | p-$Al_{0.47}Ga_{0.53}As$:Zn |
| (Whole) | |
| Contact layer | p-GaAs:Zn (or C) |

(Note 1)
The current-blocking layer positioning layer is formed following the formation of the second A compound semiconductor layer.
(Note 2)
The fourth compound semiconductor layer is formed continuously following the formation of the current-blocking layer positioning layer so that substantially no interface is present between the fourth compound semiconductor layer and the current-blocking layer positioning layer.
(Note 3)
A fifth compound semiconductor layer composed of p-$Al_{0.47}Ga_{0.53}As$:Zn can be considered to be formed between the third compound semiconductor layer and the buried layer.

TABLE 2B (Configuration of light-emitting portion)

| | |
|---|---|
| Second A compound semiconductor layer | p-$Al_{0.4}Ga_{0.6}As$:C |
| Second B compound semiconductor layer | p-$Al_{0.4}Ga_{0.6}As$:Zn |
| Active layer | [active layer-A] |
| First B compound semiconductor layer | n-$Al_{0.4}Ga_{0.6}As$:Se |
| First A compound semiconductor layer | n-$Al_{0.4}Ga_{0.6}As$:Si |
| (Current-blocking layer) | |
| Buried layer | p-$Al_{0.47}Ga_{0.53}As$:Zn |
| Fourth compound semiconductor layer | p-$Al_{0.47}Ga_{0.53}As$:Zn |
| Third compound semiconductor layer | n-$Al_{0.47}Ga_{0.53}As$:Si |
| Current-blocking layer positioning layer | p-$Al_{0.47}Ga_{0.53}As$:Zn |
| (Whole) | |
| Contact layer | p-GaAs:Zn (or C) |

(Note 1)
The current-blocking layer positioning layer is formed following the formation of the second A compound semiconductor layer.
(Note 2)
The buried layer is formed continuously following the formation of the fourth compound semiconductor layer so that substantially no interface is present between the buried layer and the fourth compound semiconductor layer.
(Note 3)
A fifth compound semiconductor layer composed of p-$Al_{0.47}Ga_{0.53}As$:Zn (corresponding to the portion of the current-blocking layer positioning layer which forms the interface with the third compound semiconductor layer) can be considered to be formed between the third compound semiconductor layer and the current-blocking layer positioning layer.

In Example 2, the substitution site of the impurity in the first A compound semiconductor layer is a site occupied by a Group III atom, the substitution site of the impurity in the fourth compound semiconductor layer is also a site occupied by a Group III atom, and the substitution site of the impurity in the third compound semiconductor layer in contact with the fourth compound semiconductor layer is also a site occupied by a Group III atom. Namely, the impurity for imparting the first conductivity type (n-type) to the first A compound semiconductor layer includes an impurity incorporated in the first A compound semiconductor layer at the substitution site (a site occupied by a group III atom) which is competitive with the substitution site (a site occupied by a group III atom) of the impurity in the fourth compound semiconductor layer, for imparting the second conductivity type (p-type) to the fourth compound semiconductor layer and further an impurity at a substitution site competitive with the substitution site (a site occupied by a group III atom) of the impurity for imparting the first conductivity type (n-type) to the third compound semiconductor layer in contact with the fourth compound semiconductor layer. Therefore, when the fourth compound semiconductor layer is deposited, impurity inter-diffusion little occurs between the fourth compound semiconductor layer constituting the current-blocking layer and the first A compound semiconductor layer or between the fourth compound semiconductor layer and the third compound semiconductor layer, and thus the current-blocking layer having high reliability can be formed. In addition, the suppression of impurity inter-diffusion in the current-blocking layer composed of the fourth compound semiconductor layer and the third compound semiconductor layer corresponds to a suppression effect on the {311}B plane and the higher-order plane and is different from the suppression of impurity inter-diffusion at the interface between the fourth compound semiconductor layer and the first A compound semiconductor layer in that it corresponds to a suppression effect on the {311}B plane interface.

EXAMPLE 3

Example 3 is also a modification of Example 1 and relates to an embodiment 1-C-1 of the present invention and an embodiment 2-C of the present invention and further relates to a six embodiment of the present invention. In Example 3 or Example 4 described below, the conductivity types are opposite to those in Example 1. Namely, in Example 3 or Example 4 described below, the first conductivity type is p-type, and the second conductivity type is n-type.

Figure 29:
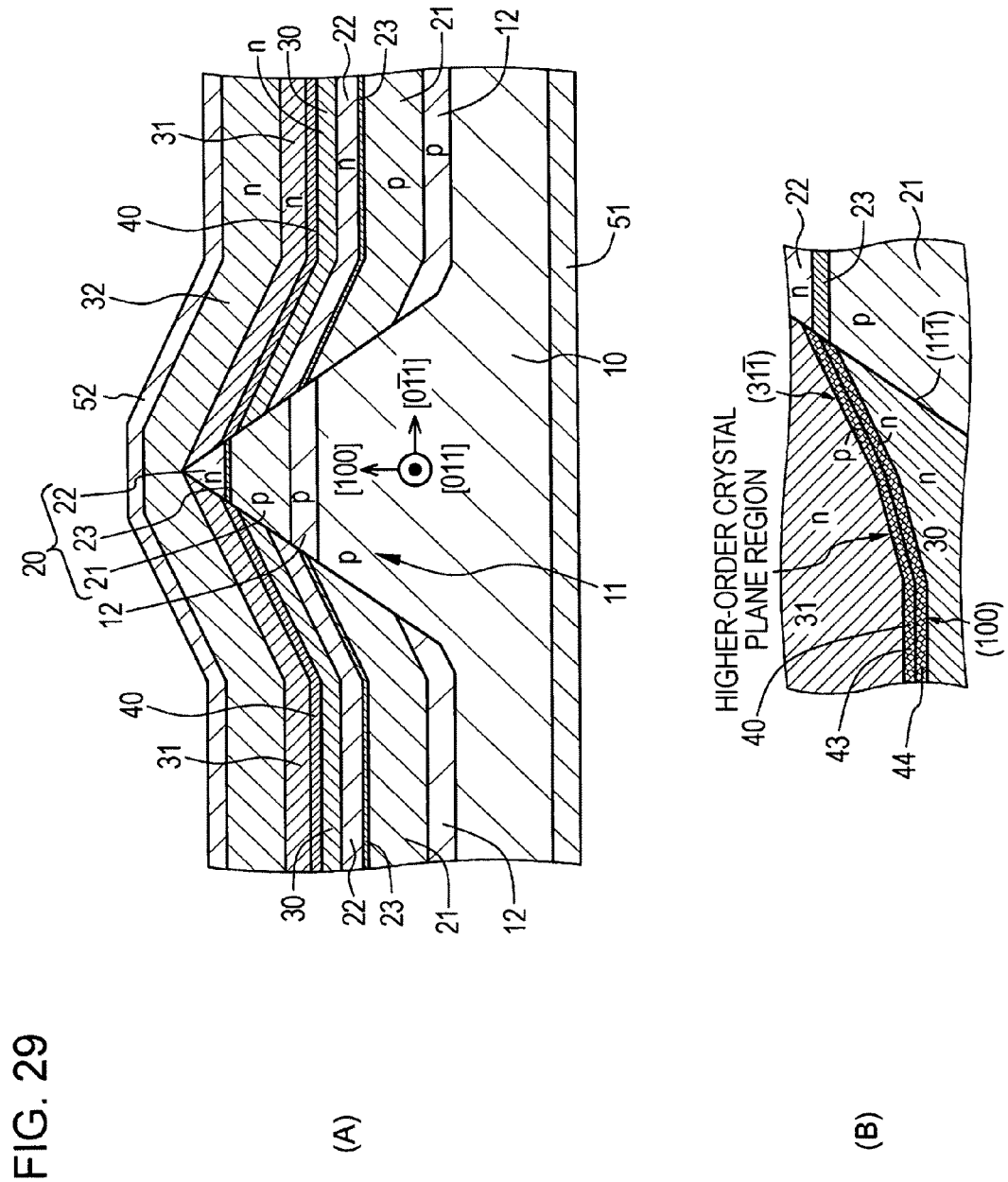
FIGS. 29(A) and (B) are a schematic partial sectional view and an enlarged schematic partial sectional view, respectively, of the semiconductor light-emitting device of Example 3.

Specifically, as shown in a conceptual view of FIG. 7(A), a schematic partial sectional view of FIG. 29(A), and an enlarged schematic partial sectional view of FIG. 29(B), when a semiconductor light-emitting device of Example 3 is described with reference to the embodiment 1-C-1 of the present invention, a first compound semiconductor layer 21, second compound semiconductor layers 22A and 22B, and a current-blocking layer 40 (a third compound semiconductor layer 43 and a fourth compound semiconductor layer 44) are composed of group III-V compound semiconductors, the substitution site of the impurity in the first compound semiconductor layer 21 is a site occupied by a Group III atom, the substitution site of the impurity in the second compound semiconductor layers 22A and 22B is a site occupied by a Group V atom, and the substitution site of the impurity in the third compound semiconductor layer 43 and the substitution site of the impurity in the fourth compound semiconductor layer 44 are sites occupied by Group V atoms.

Alternatively, when the semiconductor light-emitting device of Example 3 is described with reference to the embodiment 2-C of the present invention, a first compound semiconductor layer 21, second compound semiconductor layers 22A a d 22B, a current-blocking layer 40 (a third compound semiconductor layer 43 and a fourth compound semiconductor layer 44) are composed of Group III-V compound semiconductors, the impurity for imparting p-type which is the first conductivity type to the first compound semiconductor layer 21 is a group II impurity, and the impurity for imparting p-type which is the first conductivity type to the third compound semiconductor layer 43 is carbon (C).

Further, when described with reference to the sixth embodiment of the present invention, the semiconductor light-emitting device of Example 3 includes, (A) a light-emitting portion 20 composed of a laminated structure in which a first compound semiconductor layer 21 having a first conductivity type, an active layer 23, and second compound semiconductor layers 22A and 22B having a second conductivity type are laminated in order, and (B) a current-blocking layer 40 provided in contact with the side of the light-emitting portion 20.

In addition, the current-blocking layer 40 is composed of a third compound semiconductor layer 43 having the first conductivity type (p-type) and a fourth compound semiconductor layer 44 having the second conductivity type (n-type) and being in contact with the third compound semiconductor layer 43, the first compound semiconductor layer 21, the second compound semiconductor layers 22A and 22B, the third compound semiconductor layer 43, and the fourth compound semiconductor layer 44 are composed of Group III-V compound semiconductors, the impurity for imparting p-type which is the first conductivity type to the first compound semiconductor layer 21 is a group II impurity, and the impurity for imparting p-type which is the first conductivity type to the third compound semiconductor layer 43 is carbon (C).

More specifically, in the semiconductor light-emitting device of Example 3, each of the layers has the configuration shown in Table 3A or Table 3B below. In an example shown in Table 3A, the third compound semiconductor layer 43 is laminated on the fourth compound semiconductor layer 44, while in an example in Table 3B, the fourth compound semiconductor layer 44 is laminated on the third compound semiconductor layer 43.

TABLE 3A

| (Configuration of light-emitting portion) | |
|---|---|
| Second compound semiconductor layer 22B | n-$Al_{0.47}Ga_{0.53}As$:Se |
| Second compound semiconductor layer 22A | n-$Al_{0.4}Ga_{0.6}As$:Se |
| Active layer 23 | [active layer-B] |
| First compound semiconductor layer 21 | p-$Al_{0.4}Ga_{0.6}As$:Zn |
| (Current-blocking layer) | |
| Buried layer 31 | n-$Al_{0.47}Ga_{0.53}As$:Se |
| Third compound semiconductor layer 43 | p-$Al_{0.47}Ga_{0.53}As$:C |
| Fourth compound semiconductor layer 44 | n-$Al_{0.47}Ga_{0.53}As$:Se |
| Current-blocking layer positioning layer 30 | n-$Al_{0.47}Ga_{0.53}As$:Se |
| (Whole) | |
| Contact layer 32 | n-GaAs:Se (or Si) |

(Note 1)
The current-blocking layer positioning layer 30 is formed following the formation of the second compound semiconductor layer 22B.
(Note 2)
The fourth compound semiconductor layer 44 is formed continuously following the formation of the current-blocking layer positioning layer 30 so that substantially no interface is present between the fourth compound semiconductor layer 44 and the current-blocking layer positioning layer 30.
(Note 3)
A fifth compound semiconductor layer composed of n-$Al_{0.47}Ga_{0.53}As$:Zn (corresponding to the portion of the buried layer 31 which forms the interface with the third compound semiconductor layer 43) can be considered to be formed between the third compound semiconductor layer 43 and the buried layer 31.

TABLE 3B

| (Configuration of light-emitting portion) | |
|---|---|
| Second compound semiconductor layer 22B | n-$Al_{0.47}Ga_{0.53}As$:Se |
| Second compound semiconductor layer 22A | n-$Al_{0.4}Ga_{0.6}As$:Se |
| Active layer 23 | [active layer-B] |
| First compound semiconductor layer 21 | p-$Al_{0.4}Ga_{0.6}As$:Zn |
| (Current-blocking layer) | |
| Buried layer 31 | n-$Al_{0.47}Ga_{0.53}As$:Se |
| Fourth compound semiconductor layer 44 | n-$Al_{0.47}Ga_{0.53}As$:Se |
| Third compound semiconductor layer 43 | p-$Al_{0.47}Ga_{0.53}As$:C |
| Current-blocking layer positioning layer 30 | n-$Al_{0.47}Ga_{0.53}As$:Se |
| (Whole) | |
| Contact layer 32 | n-GaAs:Se (or Si) |

(Note 1)
The current-blocking layer positioning layer 30 is formed following the formation of the second compound semiconductor layer 22B.
(Note 2)
The buried layer 31 is formed continuously following the formation of the fourth compound semiconductor layer 44 so that substantially no interface is present between the buried layer 31 and the fourth compound semiconductor layer 44.
(Note 3)
A fifth compound semiconductor layer composed of n-$Al_{0.47}Ga_{0.53}As$:Zn (corresponding to the portion of the current-blocking layer positioning layer 30 which forms the interface with the third compound semiconductor layer 43) can be considered to be formed between the third compound semiconductor layer 43 and the current-blocking layer positioning layer 30.

Also in Example 3, in the same step as [Step-120] of Example 1, the current-blocking layer 40 composed of the current-blocking layer positioning layer 30, the fourth compound semiconductor layer 44, and the third compound semiconductor layer 43 is formed in order on the basis of the MOCVD method. Here, the third compound semiconductor layer 43 is composed of p-$Al_{0.47}Ga_{0.53}As$:C, and the fourth compound semiconductor layer 44 is composed of n-$Al_{0.47}Ga_{0.53}As$:Se. Namely, the substitution site of the impurity (C) in the third compound semiconductor layer 43, for imparting the first conductivity type (p-type) to the third compound semiconductor layer 43, is a site occupied by a group V atom. Also, the substitution site of the impurity (Se) in the fourth compound semiconductor layer 44, for imparting the second conductivity type (n-type) to the fourth compound semiconductor layer 44, is a site occupied by a group V atom. In other words, the impurity for imparting the first conductivity type to the third compound semiconductor layer 43 includes an impurity contained in the third compound semiconductor layer 43 at a substitution site which is competitive with the substitution site of the impurity in the fourth compound semiconductor layer 44, for imparting the second conductivity type to the fourth compound semiconductor layer 44.

Therefore, when the fourth compound semiconductor layer 44 is deposited after the third compound semiconductor layer 43 is deposited or when the third compound semiconductor layer 43 is deposited after the fourth compound semiconductor layer 44 is deposited, impurity inter-diffusion little occurs between the third compound semiconductor layer 43 and the fourth compound semiconductor layer 44 which constitute the current-blocking layer 40. As a result, it is possible to avoid the problem in which the current-blocking layer 40 disappears or the current-blocking layer 40 decreases in thickness, and thus the effect of the current-blocking layer 40 is not stabilized, thereby increasing a leakage current.

In addition, the impurity for imparting the first conductivity type (p-type) to the first compound semiconductor layer 21 includes an impurity contained in the first compound semiconductor layer 21 at a substitution site (a site occupied by a group III atom) which is uncompetitive with the substitution site (a site occupied by a group V atom) of the impurity in the second compound semiconductor layers 22A and 22B, for imparting the second conductivity type (n-type) to the second compound semiconductor layers 22A and 22B. Therefore, pn-junction control to be designed by intentional impurity inter-diffusion between the first compound semiconductor layer 21 and the second compound semiconductor layers 22A and 22B can be easily finely designed by controlling the impurity concentration and the doping position in each layer, thereby permitting an attempt to improve emission characteristics.

Here, also in the semiconductor light-emitting device of Example 3, the active layer 23 formed on the light-emitting portion forming region 11 (projection surface) is surrounded in the lateral direction (side) by the current-blocking layer 40 having a lower refractive index than that of the active layer 23 and surrounded in the vertical direction by the first compound semiconductor layer 21 and the second compound semiconductor layers 22A and 22B which have a lower refractive index than that of the active layer 23. Therefore, the active layer 23 has a structure in which light is completely confined in the vertical direction and the lateral direction. In addition, a n-p-n-p structure (the n-type buried layer 31-the p-type third compound semiconductor layer 43-the n-type fourth compound semiconductor layer 44-the n-type current-blocking layer positioning layer 30 (the n-type second compound semiconductor layer 22B) and the n-type second compound semiconductor layer 22A-the p-type first compound semiconductor layer 21), i.e., a thyristor structure, is formed on the recess surface near a side of the active layer 23. Therefore, a current flow through the recess surface is inhibited, and thus a current is concentrated in the active layer 23, thereby permitting an attempt to decrease the threshold current. In this case, the n-type current-blocking layer positioning layer 30 can be regarded as the n-type fourth compound semiconductor layer 44 or the n-type second compound semiconductor layer 22B. This applies to Example 4, Example 7, and Example 8 which will be described below.

In the MOCVD method, when the third compound semiconductor layer 43 is deposited, a methyl group or ethyl group obtained by decomposition of a raw material gas for group III atoms may be intentionally used as a raw material gas for adding carbon (C). Alternatively, in the MOCVD method, when the third compound semiconductor layer 43 is deposited, $CBr_4$ gas or $CCl_4$ gas may be added.

EXAMPLE 4

Example 4 is a modification of Example 1 and Example 3 and relates to an embodiment 1-D-1 of the present invention and an embodiment 2-D of the present invention.

Specifically, as shown in a conceptual view of FIG. 10(A), when a semiconductor light-emitting device of Example is described with reference to the embodiment 1-D-1 of the present invention, a first compound semiconductor layer, a second compound semiconductor layer, a third compound semiconductor layer, and a fourth compound semiconductor layer are composed of group III-V compound semiconductors, the first compound semiconductor layer includes a first A compound semiconductor layer and a first B compound semiconductor layer provided on the first A compound semiconductor layer so as to be in contact with an active layer, the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group V atom, the substitution site of the impurity in the first B compound semiconductor layer is a site occupied by a Group III atom, the substitution site of the impurity in the second B compound semiconductor layer is a site occupied by a Group V atom, the substitution site of the impurity in the second A compound semiconductor layer is a site occupied by a Group III atom, and the substitution site of the impurity in the third compound semiconductor layer and the substitution site of the impurity in the fourth compound semiconductor layer are sites occupied by Group V atoms.

Alternatively, when the semiconductor light-emitting device of Example 4 is described with reference to the embodiment 2-D of the present invention, a first compound semiconductor layer, a second compound semiconductor layer, a third compound semiconductor layer, and a fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with an active layer, the second compound semiconductor layer includes a second B compound semiconductor layer in contact with the active layer and a second A compound semiconductor layer provided on the second B compound semiconductor layer, the impurity for imparting p-type which is the first conductivity type to the first A compound semiconductor layer is carbon (C), the impurity for imparting p-type which is the first conductivity type to the first B compound semiconductor layer is a group II impurity, the impurity for imparting n-type which is the second conductivity type to the second B compound semiconductor layer is a group VI impurity, the impurity for imparting n-type which is the second conductivity type to the second A compound semiconductor layer is a group IV impurity, the impurity for imparting p-type which is the first conductivity type the third compound semiconductor layer is carbon (C), and the impurity for imparting n-type which is the second conductivity type to the fourth compound semiconductor layer is a group VI impurity.

More specifically, in the semiconductor light-emitting device of Example 4, each of the layers has the configuration shown in Table 4A or Table 4B below. In an example shown in Table 4A, the third compound semiconductor layer is laminated on the fourth compound semiconductor layer, while in an example in Table 4B, the fourth compound semiconductor layer is laminated on the third compound semiconductor layer.

TABLE 4A (Configuration of light-emitting portion)

| | |
|---|---|
| Second A compound semiconductor layer | n-$Al_{0.4}Ga_{0.6}As$:Si |
| Second B compound semiconductor layer | n-$Al_{0.4}Ga_{0.6}As$:Se |
| Active layer | [active layer-B] |

TABLE 4A-continued

| | |
|---|---|
| First B compound semiconductor layer | p-$Al_{0.4}Ga_{0.6}As$:Zn |
| First A compound semiconductor layer | p-$Al_{0.4}Ga_{0.6}As$:C |
| (Current-blocking layer) | |
| Buried layer | n-$Al_{0.47}Ga_{0.53}As$:Se |
| Third compound semiconductor layer | p-$Al_{0.47}Ga_{0.53}As$:C |
| Fourth compound semiconductor layer | n-$Al_{0.47}Ga_{0.53}As$:Se |
| Current-blocking layer positioning layer | n-$Al_{0.47}Ga_{0.53}As$:Se |
| (Whole) | |
| Contact layer | n-GaAs:Se (or Si) |

(Note 1)
The current-blocking layer positioning layer is formed following the formation of the second A compound semiconductor layer.
(Note 2)
The fourth compound semiconductor layer is formed continuously following the formation of the current-blocking layer positioning layer so that substantially no interface is present between the fourth compound semiconductor layer and the current-blocking layer positioning layer.
(Note 3)
A fifth compound semiconductor layer composed of n-$Al_{0.47}Ga_{0.53}As$:Zn (corresponding to the portion of the buried layer which forms the interface with the third compound semiconductor layer) can be considered to be formed between the third compound semiconductor layer and the buried layer.

TABLE 4B (Configuration of light-emitting portion)

| | |
|---|---|
| Second A compound semiconductor layer | n-$Al_{0.4}Ga_{0.6}As$:Si |
| Second B compound semiconductor layer | n-$Al_{0.4}Ga_{0.6}As$:Se |
| Active layer | [active layer-B] |
| First B compound semiconductor layer | p-$Al_{0.4}Ga_{0.6}As$:Zn |
| First A compound semiconductor layer | p-$Al_{0.4}Ga_{0.6}As$:C |
| (current-blocking layer) | |
| Buried layer | n-$Al_{0.47}Ga_{0.53}As$:Se |
| Fourth compound semiconductor layer | n-$Al_{0.47}Ga_{0.53}As$:Se |
| Third compound semiconductor layer | p-$Al_{0.47}Ga_{0.53}As$:C |
| Current-blocking layer positioning layer | n-$Al_{0.47}Ga_{0.53}As$:Se |
| (Whole) | |
| Contact layer | n-GaAs:Se (or Si) |

(Note 1)
The current-blocking layer positioning layer is formed following the formation of the second A compound semiconductor layer.
(Note 2)
The buried layer is formed continuously following the formation of the fourth compound semiconductor layer the so that substantially no interface is present between the buried layer and the fourth compound semiconductor layer.
(Note 3)
A fifth compound semiconductor layer composed of n-$Al_{0.47}Ga_{0.53}As$:Zn (corresponding to the portion of the current-blocking layer positioning layer which forms the interface with the third compound semiconductor layer) can be considered to be formed between the third compound semiconductor layer and the current-blocking layer positioning layer.

Figure 10:
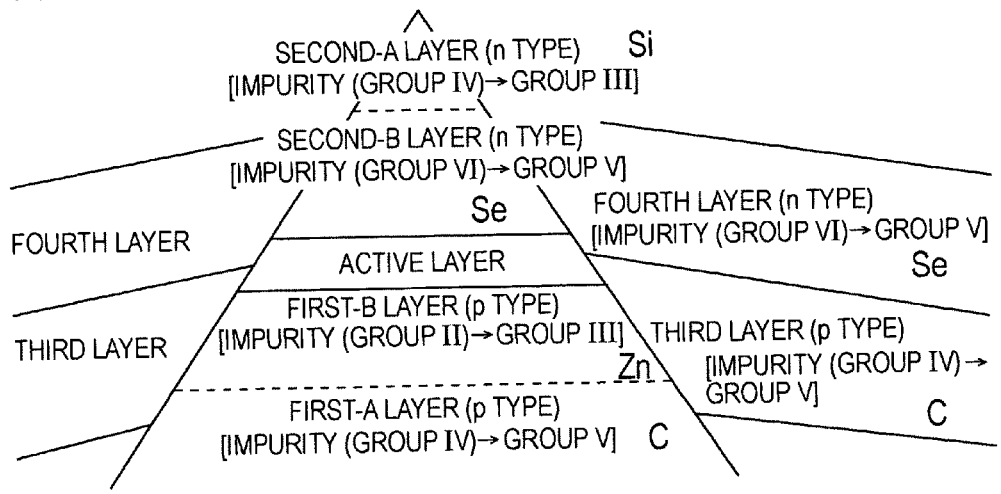
FIGS. 10(A) and (B) are conceptual views of semiconductor light-emitting devices of Example 4 and Example 8, respectively.
Figure 10:
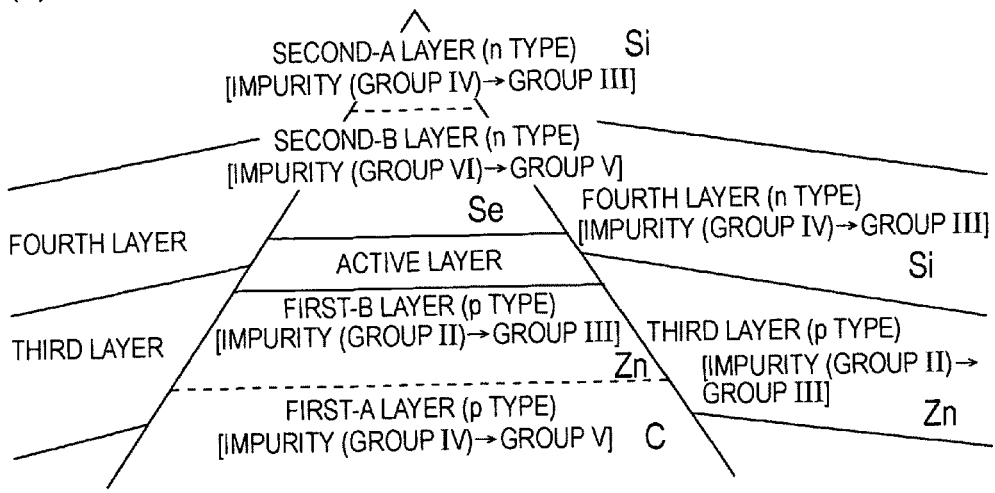

In Example 4, unlike in the example shown in FIG. 10(A), when a laminated structure including the fourth compound semiconductor layer and the third compound semiconductor layer formed thereon is formed, the substitution site of the impurity in the first A compound semiconductor layer is a site occupied by a group V atom, the substitution site of the impurity in the fourth compound semiconductor layer is also a site occupied by a Group V atom, and the substitution site of the impurity in the third compound semiconductor layer in contact with the fourth compound semiconductor layer is also a site occupied by a Group V atom. Namely, the impurity for imparting the first conductivity type (p-type) to the first A compound semiconductor layer includes an impurity incorporated in the first A compound semiconductor layer at the substitution site (a site occupied by a group V atom) which is competitive with the substitution site (a site occupied by a group V atom) of the impurity in the fourth compound semiconductor layer, for imparting the second conductivity type (n-type) to the fourth compound semiconductor layer and further an impurity at a substitution site competitive with the substitution site (a site occupied by a group V atom) of the impurity for imparting the first conductivity type (p-type) to the third compound semiconductor layer in contact with the fourth compound semiconductor layer. Therefore, when the fourth compound semiconductor layer is deposited, impurity inter-diffusion little occurs between the fourth compound semiconductor layer constituting the current-blocking layer and the first A compound semiconductor layer or between the fourth compound semiconductor layer and the third fourth compound semiconductor layer, and thus the current-blocking layer having high reliability can be formed. As a result, it is possible to more effectively avoid the problem in which the current-blocking layer 40 disappears or the current-blocking layer 40 decreases in thickness, and thus the effect of the current-blocking layer 40 is not stabilized, thereby increasing a leakage current.

EXAMPLE 5

Example 5 relates to semiconductor light-emitting devices according to the first embodiment (more specifically, an embodiment 1-a-1) of the present invention, a third embodiment (more specifically, an embodiment 3-a) of the present invention, and a fifth embodiment of the present invention.

Specifically, as shown in a conceptual view of FIG. 1(B), when a semiconductor light-emitting device of Example 5 is described with reference to the embodiment 1-a-1 of the present invention, a first compound semiconductor layer 21, second compound semiconductor layers 22A and 22B, and a current-blocking layer 40 (a fourth compound semiconductor layer 44 and a third compound semiconductor layer 43) are composed of group III-V compound semiconductors, the substitution site of the impurity in the first compound semiconductor layer 21 is a site occupied by a Group V atom, the substitution site of the impurity in the second compound semiconductor layers 22A ad 22B is a site occupied by a Group III atom, and the substitution site of the impurity in the third compound semiconductor layer 43 and the substitution site of the impurity in the fourth compound semiconductor layer 44 are sites occupied by Group V atoms. A schematic partial sectional view of the semiconductor light-emitting device of Example 5 is the same as shown in FIGS. 23(A) and (B).

Alternatively, when described with reference to the third embodiment of the present invention, the semiconductor light-emitting device of Example 5 includes, (A) a light-emitting portion 20 composed of a laminated structure in which a first compound semiconductor layer 21 having a first conductivity type (in Example 5, n-type), an active layer 23, and second compound semiconductor layers 22A and 22B having a second conductivity type (in Example 5, p-type) are laminated in order, and (B) a current-blocking layer 40 in contact with a side of the light-emitting portion 20.

In addition, the current-blocking layer 40 is composed of a third compound semiconductor layer 43 having the first conductivity type (n-type) and a fourth compound semiconductor layer 44 having the second conductivity type (p-type) and being in contact with the third compound semiconductor layer 43, and the impurity for imparting the second conductivity type (p-type) to the second compound semiconductor layers 22A and 22B is different from the impurity for imparting the second conductivity type (p-type) to the fourth compound semiconductor layer 44.

Specifically, when the semiconductor light-emitting device of Example 5 is described with reference to the embodiment 3-a of the present invention, a first compound semiconductor layer 21, second compound semiconductor layers 22A and 22B, and a current-blocking layer 40 (a fourth compound semiconductor layer 44 and a third compound semiconductor layer 43) are composed of Group III-V compound semiconductors, the impurity for imparting p-type which is the second conductivity type to the second compound semiconductor layers 22A and 22B is a group II impurity, and the impurity for imparting p-type which is the second conductivity type to the fourth compound semiconductor layer 44 is carbon (C).

Alternatively, when described with reference to the fifth embodiment of the present invention, the semiconductor light-emitting device of Example 5 includes, (A) a light-emitting portion 20 composed of a laminated structure in which a first compound semiconductor layer 21 having a first conductivity type, an active layer 23, and second compound semiconductor layers 22A and 22B having a second conductivity type are laminated in order, and (B) a current-blocking layer 40 in contact with a side of the light-emitting portion 20.

In addition, the current-blocking layer 40 is composed of a third compound semiconductor layer 43 having the first conductivity type and a fourth compound semiconductor layer 44 having the second conductivity type and being in contact with the third compound semiconductor layer 43, the first compound semiconductor layer 21, the second compound semiconductor layers 22A and 22B, and the current-blocking layer 40 (the fourth compound semiconductor layer 44 and the third compound semiconductor layer 43) are composed of Group III-V compound semiconductors, the impurity for imparting p-type which is the second conductivity type to the second compound semiconductor layers 22A and 22B is a group II impurity, and the impurity for imparting p-type which is the second conductivity type to the fourth compound semiconductor layer 44 is carbon (C).

More specifically, in the semiconductor light-emitting device of Example 5, each of the layers has the configuration shown in Table 5A or Table 5B below. In an example shown in Table 5A, the third compound semiconductor layer 43 is laminated on the fourth compound semiconductor layer 44, while in an example in Table 5B, the fourth compound semiconductor layer 44 is laminated on the third compound semiconductor layer 43.

TABLE 5A (Configuration of light-emitting portion)

| | |
|---|---|
| Second compound semiconductor layer 22B | p-$Al_{0.47}Ga_{0.53}As:Zn$ |
| Second compound semiconductor layer 22A | p-$Al_{0.4}Ga_{0.6}As:Zn$ |
| Active layer 23 | [active layer-A] |
| First compound semiconductor layer 21 | n-$Al_{0.4}Ga_{0.6}As:Se$ |
| (Current-blocking layer) | |
| Buried layer 31 | p-$Al_{0.47}Ga_{0.53}As:Zn$ |
| Third compound semiconductor layer 43 | n-$Al_{0.47}Ga_{0.53}As:Se$ |

TABLE 5A-continued

| | |
|---|---|
| Fourth compound semiconductor layer 44 | p-$Al_{0.47}Ga_{0.53}As:C$ |
| Current-blocking layer positioning layer 30 | p-$Al_{0.47}Ga_{0.53}As:Zn$ |
| (Whole) | |
| Contact layer 32 | p-GaAs:Zn (or C) |

(Note 1)
The current-blocking layer positioning layer 30 is formed following the formation of the second compound semiconductor layer 22B.
(Note 2)
The fourth compound semiconductor layer 44 is formed continuously following the formation of the current-blocking layer positioning layer 30 so that substantially no interface is present between the fourth compound semiconductor layer 44 and the current-blocking layer positioning layer 30.
(Note 3)
A fifth compound semiconductor layer composed of p-$Al_{0.47}Ga_{0.53}As:Zn$ (corresponding to the portion of the buried layer 31 which forms the interface with the third compound semiconductor layer 43) can be considered to be formed between the third compound semiconductor layer 43 and the buried layer 31.

TABLE 5B (Configuration of light-emitting portion)

| | |
|---|---|
| Second compound semiconductor layer 22B | p-$Al_{0.47}Ga_{0.53}As:Zn$ |
| Second compound semiconductor layer 22A | p-$Al_{0.4}Ga_{0.6}As:Zn$ |
| Active layer 23 | [active layer-A] |
| First compound semiconductor layer 21 | n-$Al_{0.4}Ga_{0.6}As:Se$ |
| (Current-blocking layer) | |
| Buried layer 31 | p-$Al_{0.47}Ga_{0.53}As:Zn$ |
| Fourth compound semiconductor layer 44 | p-$Al_{0.47}Ga_{0.53}As:C$ |
| Third compound semiconductor layer 43 | n-$Al_{0.47}Ga_{0.53}As:Se$ |
| Current-blocking layer positioning layer 30 | p-$Al_{0.47}Ga_{0.53}As:Zn$ |
| (Whole) | |
| Contact layer 32 | p-GaAs:Zn (or C) |

(Note 1)
The current-blocking layer positioning layer 30 is formed following the formation of the second compound semiconductor layer 22B.
(Note 2)
The buried layer 31 is formed continuously following the formation of the fourth compound semiconductor layer 44 so that substantially no interface is present between the buried layer 31 and the fourth compound semiconductor layer 44.
(Note 3)
A fifth compound semiconductor layer composed f p-$Al_{0.47}Ga_{0.53}As:Zn$ (corresponding to the portion of the current-blocking layer positioning layer 30 which forms the interface with the third compound semiconductor layer 43) can be considered to be formed between the third compound semiconductor layer 43 and the current-blocking layer positioning layer 30.

In Example 5, in the same step as in [Step-120] of Example 1, for example, the current-blocking layer 40 composed of the current-blocking layer positioning layer 30, the fourth compound semiconductor layer 44, and the third compound semiconductor layer 43 is formed in order on the basis of the MOCVD method. Here, the fourth compound semiconductor layer 44 is composed of p-$Al_{0.47}Ga_{0.53}As:C$, and the third compound semiconductor layer 43 is composed of n-$Al_{0.47}Ga_{0.53}As:Se$. Namely, the substitution site of the impurity (Se) in the third compound semiconductor layer 43, for imparting the first conductivity type (n-type) to the third compound semiconductor layer 43, is a site occupied by a group V atom. Also, the substitution site of the impurity (C) in the fourth compound semiconductor layer 44, for imparting the second conductivity type (p-type) to the fourth compound semiconductor layer 44, is a site occupied by a group V atom. In other words, the impurity for imparting the first conductivity type to the third compound semiconductor layer 43 includes an impurity contained in the third compound semiconductor layer 43 at a substitution site which is competitive with a substitution site of the impurity in the fourth compound semiconductor layer 44, for imparting the second conductivity type to the fourth compound semiconductor layer 44. In addition, the impurity for imparting the second conductivity type to the fourth compound semiconductor layer 44 has the smaller plane orientation dependence of the amount of impurity incorporated in the crystal than that of the impurity for imparting the second conductivity type to the second compound semiconductor layer 22.

Therefore, when the third compound semiconductor layer 43 is deposited after the fourth compound semiconductor layer 44 is deposited or when the fourth compound semiconductor layer 44 is deposited after the third compound semiconductor layer 43 is deposited, impurity inter-diffusion little occurs between the third compound semiconductor layer 43 and the fourth compound semiconductor layer 44 which constitute the current-blocking layer 40. As a result, it is possible to avoid the problem in which the current-blocking layer 40 disappears or the current-blocking layer 40 decreases in thickness, and thus the effect of the current-blocking layer 40 is not stabilized, thereby increasing a leakage current.

In addition, the impurity for imparting the first conductivity type (n-type) to the first compound semiconductor layer 21 includes an impurity contained in the first compound semiconductor layer 21 at a substitution site (a site occupied by a group V atom) which is uncompetitive with a substitution site (a site occupied by a group III atom) of the impurity in the second compound semiconductor layers 22A and 22B, for imparting the second conductivity type (p-type) to the second compound semiconductor layers 22A and 22B. Therefore, pn-junction control to be designed by intentional impurity inter-diffusion between the first compound semiconductor layer 21 and the second compound semiconductor layers 22A and 22B can be easily finely designed by controlling the impurity concentration and the doping position in each layer, thereby permitting an attempt to improve emission characteristics.

Here, also in the semiconductor light-emitting device of Example 5, the active layer 23 formed on the light-emitting portion forming region 11 (projection surface) is surrounded in the lateral direction (side) by the current-blocking layer 40 having a lower refractive index than that of the active layer 23 and surrounded in the vertical direction by the first compound semiconductor layer 21 and the second compound semiconductor layers 22A and 22B which have a lower refractive index than that of the active layer 23. Therefore, the active layer 23 has a structure in which light is completely confined in the vertical direction and the lateral direction. In addition, a p-n-p-n structure (the p-type buried layer 31-the n-type third compound semiconductor layer 43-the p-type fourth compound semiconductor layer 44, the p-type current-blocking layer positioning layer 30 (the n-type second compound semiconductor layer 22B) and the p-type second compound semiconductor layer 22A-the n-type first compound semiconductor layer 21), i.e., a thyristor structure, is formed on the recession surface near the side of the active layer 23. Therefore, a current flow through the recess surface is inhibited, and thus a current is concentrated in the active layer 23, thereby permitting an attempt to decrease the threshold current.

EXAMPLE 6

Example 6 is a modification of Example 5 and relates to semiconductor light-emitting devices according to an embodiment 1-b-1 of the present invention and an embodiment 3-b of the present invention.

Specifically, as shown in a conceptual view of FIG. 4(B), when a semiconductor light-emitting device of Example 6 is described with reference to the embodiment 1-b-1 of the present invention, a first compound semiconductor layer, a second compound semiconductor layer, a third compound semiconductor layer, and a fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with an active layer, the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group III atom, the substitution site of the impurity in the first B compound semiconductor layer is a site occupied by a Group V atom, the substitution site of the impurity in the second B compound semiconductor layer is a site occupied by a Group III atom, the substitution site of the impurity in the second A compound semiconductor layer is a site occupied by a Group V atom, and the substitution site of the impurity in the third compound semiconductor layer and the substitution site of the impurity in the fourth compound semiconductor layer are sites occupied by Group V atoms.

Alternatively, when a semiconductor light-emitting device of Example 6 is described with reference to the embodiment 3-b of the present invention, a first compound semiconductor layer, a second compound semiconductor layer, a third compound semiconductor layer, and a fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with an active layer, the second compound semiconductor layer includes a second B compound semiconductor layer in contact with the active layer and a second A compound semiconductor layer provided on the second B compound semiconductor layer, the impurity for imparting n-type which is the first conductivity type to the first A compound semiconductor layer is a group IV impurity, the impurity for imparting n-type which is the first conductivity type to the first B compound semiconductor layer is a group VI impurity, the impurity for imparting p-type which is the second conductivity type to the second B compound semiconductor layer is a group II impurity, the impurity for imparting p-type which is the second conductivity type to the second A compound semiconductor layer is carbon (C), the impurity for imparting n-type which is the first conductivity type to the third compound semiconductor layer is a group VI impurity, and the impurity for imparting p-type which is the second conductivity type to the fourth compound semiconductor layer is carbon (C).

More specifically, in the semiconductor light-emitting device of Example 6, each of the layers has the configuration shown in Table 6A or Table 6B below. In an example shown in Table 6A, the third compound semiconductor layer is laminated on the fourth compound semiconductor layer, while in an example in Table 6B, the fourth compound semiconductor layer is laminated on the third compound semiconductor layer.

TABLE 6A (Configuration of light-emitting portion)

| | |
|---|---|
| Second A compound semiconductor layer | p-$Al_{0.4}Ga_{0.6}As$:C |
| Second B compound semiconductor layer | p-$Al_{0.4}Ga_{0.6}As$:Zn |
| Active layer | [active layer-A] |
| First B compound semiconductor layer | n-$Al_{0.4}Ga_{0.6}As$:Se |
| First A compound semiconductor layer | n-$Al_{0.4}Ga_{0.6}As$:Si |
| (Current-blocking layer) | |
| Buried layer | p-$Al_{0.47}Ga_{0.53}As$:C |
| Third compound semiconductor layer | n-$Al_{0.47}Ga_{0.53}As$:Se |
| Fourth compound semiconductor layer | p-$Al_{0.47}Ga_{0.53}As$:C |
| Current-blocking layer positioning layer | p-$Al_{0.47}Ga_{0.53}As$:C |
| (Whole) | |
| Contact layer | p-GaAs:C (or Zn) |

(Note 1)
The current-blocking layer positioning layer is formed following the formation of the second A compound semiconductor layer.
(Note 2)
The fourth compound semiconductor layer is formed continuously following the formation of the current-blocking layer positioning layer so that substantially no interface is present between the fourth compound semiconductor layer and the current-blocking layer positioning layer.
(Note 3)
A fifth compound semiconductor layer composed of p-$Al_{0.47}Ga_{0.53}As$:Zn can be considered to be formed between the third compound semiconductor layer and the buried layer.

TABLE 6B (Configuration of light-emitting portion)

| | |
|---|---|
| Second A compound semiconductor layer | p-$Al_{0.4}Ga_{0.6}As$:C |
| Second B compound semiconductor layer | p-$Al_{0.4}Ga_{0.6}As$:Zn |
| Active layer | [active layer-A] |
| First B compound semiconductor layer | n-$Al_{0.4}Ga_{0.6}As$:Se |
| First A compound semiconductor layer | n-$Al_{0.4}Ga_{0.6}As$:Si |
| (Current-blocking layer) | |
| Buried layer | p-$Al_{0.47}Ga_{0.53}As$:C |
| Fourth compound semiconductor layer | p-$Al_{0.47}Ga_{0.53}As$:C |
| Third compound semiconductor layer | n-$Al_{0.47}Ga_{0.53}As$:Se |
| Current-blocking layer positioning layer | p-$Al_{0.47}Ga_{0.53}As$:C |
| (Whole) | |
| Contact layer | p-GaAs:C (or Zn) |

(Note 1)
The current-blocking layer positioning layer is formed following the formation of the second A compound semiconductor layer.
(Note 2)
The buried layer is formed continuously following the formation of the fourth compound semiconductor layer so that substantially no interface is present between the buried layer and the fourth compound semiconductor layer.
(Note 3)
A fifth compound semiconductor layer composed of p-$Al_{0.47}Ga_{0.53}As$:Zn (corresponding to the portion of the current-blocking layer positioning layer which forms the interface with the third compound semiconductor layer) can be considered to be formed between the third compound semiconductor layer and the current-blocking layer positioning layer.

EXAMPLE 7

Example 7 is also a modification of Example 5 and relates to an embodiment 1-c-1 of the present invention and an embodiment 3-C of the present invention and further relates to a seventh embodiment of the present invention.

In Example 7 or Example 8 described below, the conductivity types are opposite to those in Example 5. Namely, in Example 7 or Example 8 described below, the first conductivity type is p-type, and the second conductivity type is n-type.

Specifically, as shown in a conceptual view of FIG. 7(B), when a semiconductor light-emitting device of Example 7 is described with reference to the embodiment 1-c-1 of the present invention, a first compound semiconductor layer 21, second compound semiconductor layers 22A and 22B, and a current-blocking layer 40 (a third compound semiconductor layer 43 and a fourth compound semiconductor layer 44) are composed of group III-V compound semiconductors, the substitution site of the impurity in the first compound semiconductor layer 21 is a site occupied by a Group III atom, the substitution site of the impurity in the second compound semiconductor layers 22A and 22B is a site occupied by a Group V atom, and the substitution site of the impurity in the third compound semiconductor layer 43 and the substitution site of the impurity in the fourth compound semiconductor layer 44 are sites occupied by Group III atoms. In addition, a schematic partial sectional view of the semiconductor light-emitting device of Example 7 is the same as shown in FIGS. 29(A) and (B).

Alternatively, when the semiconductor light-emitting device of Example 7 is described with reference to the embodiment 3-c of the present invention, a first compound semiconductor layer 21, second compound semiconductor layers 22A and 22B, and a current-blocking layer 40 (a third compound semiconductor layer 43 and a fourth compound semiconductor layer 44) are composed of Group III-V compound semiconductors, the impurity for imparting n-type which is the second conductivity type to the second compound semiconductor layers 22A and 22B is a group VI impurity, and the impurity for imparting n-type which is the second conductivity type to the fourth compound semiconductor layer 44 is a group IV impurity.

Further, when the semiconductor light-emitting device of Example 7 is described with reference to the seventh of the present invention, the semiconductor light-emitting device includes, (A) a light-emitting portion 20 composed of a laminated structure in which a first compound semiconductor layer 21 having a first conductivity type, an active layer 23, and second compound semiconductor layers 22A and 22B having a second conductivity type are laminated in order, and (B) a current-blocking layer 40 in contact with a side of the light-emitting portion 20.

In addition, the current-blocking layer 40 is composed of a third compound semiconductor layer 43 having the first conductivity type and a fourth compound semiconductor layer 44 having the second conductivity type and being in contact with the third compound semiconductor layer 43, the first compound semiconductor layer 21, the second compound semiconductor layers 22A and 22B, and the current-blocking layer 40 (the third compound semiconductor layer 43, and the fourth compound semiconductor layer 44) are composed of Group III-V compound semiconductors, the impurity for imparting n-type which is the second conductivity type to the second compound semiconductor layers 22A and 22B is a group VI impurity, and the impurity for imparting n-type which is the second conductivity type to the fourth compound semiconductor layer 44 is a group IV impurity.

More specifically, in the semiconductor light-emitting device of Example 7, each of the layers has the configuration shown in Table 7A or Table 7B below. In an example shown in Table 7A, the third compound semiconductor layer 43 is laminated on the fourth compound semiconductor layer 44, while in an example in Table 7B, the fourth compound semiconductor layer 44 is laminated on the third compound semiconductor layer 43.

TABLE 7A (Configuration of light-emitting portion)

| | |
|---|---|
| Second compound semiconductor layer 22B | n-$Al_{0.47}Ga_{0.53}As$:Se |
| Second compound semiconductor layer 22A | n-$Al_{0.4}Ga_{0.6}As$:Se |
| Active layer 23 | [active layer-B] |
| First compound semiconductor layer 21 | p-$Al_{0.4}Ga_{0.6}As$:Zn |
| (Current-blocking layer) | |
| Buried layer 31 | n-$Al_{0.47}Ga_{0.53}As$:Si |
| Third compound semiconductor layer 43 | p-$Al_{0.47}Ga_{0.53}As$:Zn |
| Fourth compound semiconductor layer 44 | n-$Al_{0.47}Ga_{0.53}As$:Si |
| Current-blocking layer positioning layer 30 | n-$Al_{0.47}Ga_{0.53}As$:Si |
| (Whole) | |
| Contact layer 32 | n-GaAs:Si (or Se) |

(Note 1)
The current-blocking layer positioning layer 30 is formed following the formation of the second compound semiconductor layer 22B.
(Note 2)
The fourth compound semiconductor layer 44 is formed continuously following the formation of the current-blocking layer positioning layer 30 so that substantially no interface is present between the fourth compound semiconductor layer 44 and the current-blocking layer positioning layer 30.
(Note 3)
A fifth compound semiconductor layer composed of n-$Al_{0.47}Ga_{0.53}As$:Zn (corresponding to the portion of the buried layer 31 which forms the interface with the third compound semiconductor layer 43) can be considered to be formed between the third compound semiconductor layer 43 and the buried layer 31.

TABLE 7B (Configuration of light-emitting portion)

| | |
|---|---|
| Second compound semiconductor layer 22B | n-$Al_{0.47}Ga_{0.53}As$:Se |
| Second compound semiconductor layer 22A | n-$Al_{0.4}Ga_{0.6}As$:Se |
| Active layer 23 | [active layer-B] |
| First compound semiconductor layer 21 | p-$Al_{0.4}Ga_{0.6}As$:Zn |
| (Current-blocking layer) | |
| Buried layer 31 | n-$Al_{0.47}Ga_{0.53}As$:Si |
| Fourth compound semiconductor layer 44 | n-$Al_{0.47}Ga_{0.53}As$:Si |
| Third compound semiconductor layer 43 | p-$Al_{0.47}Ga_{0.53}As$:Zn |
| Current-blocking layer positioning layer 30 | n-$Al_{0.47}Ga_{0.53}As$:Si |
| (Whole) | |
| Contact layer 32 | n-GaAs:Si (or Se) |

(Note 1)
The current-blocking layer positioning layer 30 is formed following the formation of the second compound semiconductor layer 22B.
(Note 2)
The buried layer 31 is formed continuously following the formation of the fourth compound semiconductor layer 44 so that substantially no interface is present between the buried layer 31 and the fourth compound semiconductor layer 44.
(Note 3)
A fifth compound semiconductor layer composed of n-$Al_{0.47}Ga_{0.53}As$:Zn (corresponding to the portion of the current-blocking layer positioning layer 30 which forms the interface with the third compound semiconductor layer 43) can be considered to be formed between the third compound semiconductor layer 43 and the current-blocking layer positioning layer 30.

Also in Example 7, in the same step as in [Step-120] of Example 1, for example, the current-blocking layer 40 composed of the current-blocking layer positioning layer 30, the fourth compound semiconductor layer 44, and the third compound semiconductor layer 43 is formed in order on the basis of the MOCVD method. Here, the third compound semiconductor layer 43 is composed of p-$Al_{0.47}Ga_{0.53}As$:Zn, and the fourth compound semiconductor layer 43 is composed of n-$Al_{0.47}Ga_{0.53}As$:Si. Namely, the substitution site of the impurity (Zn) in the third compound semiconductor layer 43, for imparting the first conductivity type (p-type) to the third compound semiconductor layer 43, is a site occupied by a group III atom. Also, the substitution site of the impurity (Si) in the fourth compound semiconductor layer 44, for imparting the second conductivity type (n-type) to the fourth compound semiconductor layer 44, is a site occupied by a group III atom. In other words, the impurity for imparting the first conductivity type to the third compound semiconductor layer 43 includes an impurity contained in the third compound semiconductor layer 43 at a substitution site which is competitive with a substitution site of the impurity in the fourth compound semiconductor layer 44, for imparting the second conductivity type to the fourth compound semiconductor layer 44.

Therefore, when the fourth compound semiconductor layer 44 is deposited after the third compound semiconductor layer 43 is deposited or when the third compound semiconductor layer 43 is deposited after the fourth compound semiconductor layer 44 is deposited, impurity inter-diffusion little occurs between the third compound semiconductor layer 43 and the fourth compound semiconductor layer 44 which constitute the current-blocking layer 40. As a result, it is possible to avoid the problem in which the current-blocking layer 40 disappears or the current-blocking layer 40 decreases in thickness, and thus the effect of the current-blocking layer 40 is not stabilized, thereby increasing a leakage current.

In addition, the impurity for imparting the first conductivity type (p-type) to the first compound semiconductor layer 21 includes an impurity contained in the first compound semiconductor layer 21 at a substitution site (a site occupied by a group III atom) which is uncompetitive with a substitution site (a site occupied by a group V atom) of the impurity in the second compound semiconductor layers 22A and 22B, for imparting the second conductivity type (n-type) to the second compound semiconductor layers 22A and 22B. Therefore, pn-junction control to be designed by intentional impurity inter-diffusion between the first compound semiconductor layer 21 and the second compound semiconductor layers 22A and 22B can be easily finely designed by controlling the impurity concentration and the doping position in each layer, thereby permitting an attempt to improve emission characteristics.

Here, also in the semiconductor light-emitting device of Example 7, the active layer 23 formed on the light-emitting portion forming region 11 (projection surface) is surrounded in the lateral direction (side) by the current-blocking layer 40 having a lower refractive index than that of the active layer 23 and surrounded in the vertical direction by the first compound semiconductor layer 21 and the second compound semiconductor layers 22A and 22B which have a lower refractive index than that of the active layer 23. Therefore, the active layer 23 has a structure in which light is completely confined in the vertical direction and the lateral direction. In addition, a n-p-n-p structure (the n-type buried layer 31-the p-type third compound semiconductor layer 43-the n-type fourth compound semiconductor layer 44-the n-type current-blocking layer positioning layer 30 (the n-type second compound semiconductor layer 22B) and the n-type second compound semiconductor layer 22A-the p-type first compound semiconductor layer 21), i.e., a thyristor structure, is formed on the recession surface near the side of the active layer 23. Therefore, a current flow through the recess surface is inhibited, and thus a current is concentrated in the active layer 23, thereby permitting an attempt to decrease the threshold current.

In addition, silicon (Si) which is the impurity for imparting the second conductivity type (n-type) to the fourth compound semiconductor layer 44 has the smaller plane orientation dependence than that of selenium (Se) which is the impurity for imparting the second conductivity type (n-type) to the second compound semiconductor layer 21. Therefore, in forming (depositing) the third compound semiconductor layer 43, a {311}B crystal plane region extending from the side of the light-emitting portion 20, a {100} crystal plane region extending along the main surface of the substrate 10, and a higher-order crystal plane region positioned between the {311}B crystal plane region and the {100} crystal plane region are formed in the third compound semiconductor layer 43, but there occurs small variation in the doping concentration of Si as the impurity in these regions. Consequently, the third compound semiconductor layer 43 having a stable (uniform) impurity concentration can be formed (laminated), and a concentration balance between the third compound semiconductor layer 43 and a layer in contact therewith and having the other conductivity type can be easily controlled. Therefore, the current-blocking layer 40 having a high current-blocking ability can be obtained. In addition, since the third compound semiconductor layer 43 having a stable impurity concentration can be formed (laminated), when the fourth compound semiconductor layer 44 is formed on the third compound semiconductor layer 43 or when the third compound semiconductor layer 43 is formed on the fourth compound semiconductor layer 44, it is more securely possible to avoid the problem in which the third compound semiconductor layer 43 or the fourth compound semiconductor layer 44 disappears or the current-blocking layer 40 decreases in thickness, and thus the effect of the current-blocking layer 40 is not stabilized, thereby increasing a leakage current.

EXAMPLE 8

Example 8 is a modification of Example 5 and Example 7 and relates to an embodiment 1-d-1 of the present invention and an embodiment 3-d of the present invention.

Specifically, as shown in a conceptual view of FIG. 10(B), when a semiconductor light-emitting device of Example 8 is described with reference to the embodiment 1-d-1 of the present invention, a first compound semiconductor layer, a second compound semiconductor layer, a third compound semiconductor layer, and a fourth compound semiconductor layer are composed of group III-V compound semiconductors, the first compound semiconductor layer includes a first A compound semiconductor layer and a first B compound semiconductor layer provided on the first A compound semiconductor layer so as to be in contact with an active layer, the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group V atom, the substitution site of the impurity in the first B compound semiconductor layer is a site occupied by a Group III atom, the substitution site of the impurity in the second B compound semiconductor layer is a site occupied by a Group V atom, the substitution site of the impurity in the second A compound semiconductor layer is a site occupied by a Group III atom, and the substitution site of the impurity in the third compound semiconductor layer and the substitution site of the impurity in the fourth compound semiconductor layer are sites occupied by Group III atoms.

Alternatively, when a semiconductor light-emitting device of Example 8 is described with reference to the embodiment 3-d of the present invention, a first compound semiconductor layer, a second compound semiconductor layer, a third compound semiconductor layer, and a fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with an active layer, the second compound semiconductor layer includes a second B compound semiconductor layer in contact with the active layer and a second A compound semiconductor layer provided on the second B compound semiconductor layer, the impurity for imparting p-type which is the first conductivity type to the first A compound semiconductor layer is carbon (C), the impurity for imparting p-type which is the first conductivity type to the first B compound semiconductor layer is a group II impurity, the impurity for imparting n-type which is the second conductivity type to the second B compound semiconductor layer is a group VI impurity, the impurity for imparting n-type which is the second conductivity type to the second A compound semiconductor layer is a group IV impurity, the impurity for imparting p-type which is the first conductivity type to the third compound semiconductor layer is a group II impurity, and the impurity for imparting n-type which is the second conductivity type to the fourth compound semiconductor layer is a group IV impurity.

More specifically, in the semiconductor light-emitting device of Example 8, each of the layers has the configuration shown in Table 8A or Table 8B below. In an example shown in Table 8A, the third compound semiconductor layer is laminated on the fourth compound semiconductor layer, while in an example in Table 8B, the fourth compound semiconductor layer is laminated on the third compound semiconductor layer.

TABLE 8A

| (Configuration of light-emitting portion) | |
|---|---|
| Second A compound semiconductor layer | n-$Al_{0.4}Ga_{0.6}As$:Si |
| Second B compound semiconductor layer | n-$Al_{0.4}Ga_{0.6}As$:Se |
| Active layer | [active layer-B] |
| First B compound semiconductor layer | p-$Al_{0.4}Ga_{0.6}As$:Zn |
| First A compound semiconductor layer | p-$Al_{0.4}Ga_{0.6}As$:C |
| (Current-blocking layer) | |
| Buried layer | n-$Al_{0.47}Ga_{0.53}As$:Si |
| Third compound semiconductor layer | p-$Al_{0.47}Ga_{0.53}As$:Zn |
| Fourth compound semiconductor layer | n-$Al_{0.47}Ga_{0.53}As$:Si |
| Current-blocking layer positioning layer | n-$Al_{0.47}Ga_{0.53}As$:Si |
| (Whole) | |
| Contact layer | n-GaAs:Si (or Se) |

(Note 1)
The current-blocking layer positioning layer is formed following the formation of the second A compound semiconductor layer.

(Note 2)
The fourth compound semiconductor layer is formed continuously following the formation of the current-blocking layer positioning layer so that substantially no interface is present between the fourth compound semiconductor layer and the current-blocking layer positioning layer.

(Note 3)
A fifth compound semiconductor layer composed of n-$Al_{0.47}Ga_{0.53}As$:Zn (corresponding to the portion of the buried layer which forms the interface with the third compound semiconductor layer) can be considered to be formed between the third compound semiconductor layer and the buried layer.

TABLE 8B (Configuration of light-emitting portion)

| | |
|---|---|
| Second A compound semiconductor layer | n-Al$_{0.4}$Ga$_{0.6}$As:Si |
| Second B compound semiconductor layer | n-Al$_{0.4}$Ga$_{0.6}$As:Se |
| Active layer | [active layer-B] |
| First B compound semiconductor layer | p-Al$_{0.4}$Ga$_{0.6}$As:Zn |
| First A compound semiconductor layer | p-Al$_{0.4}$Ga$_{0.6}$As:C |
| (Current-blocking layer) | |
| Buried layer | n-Al$_{0.47}$Ga$_{0.53}$As:Si |
| Fourth compound semiconductor layer | n-Al$_{0.47}$Ga$_{0.53}$As:Si |
| Third compound semiconductor layer | p-Al$_{0.47}$Ga$_{0.53}$As:Zn |
| Current-blocking layer positioning layer | n-Al$_{0.47}$Ga$_{0.53}$As:Si |
| (Whole) | |
| Contact layer | n-GaAs:Si (or Se) |

(Note 1)
The current-blocking layer positioning layer is formed following the formation of the second A compound semiconductor layer.
(Note 2)
The buried layer is formed continuously following the formation of the fourth compound semiconductor layer so that substantially no interface is present between the buried layer and the fourth compound semiconductor layer.
(Note 3)
A fifth compound semiconductor layer composed of n-Al$_{0.47}$Ga$_{0.53}$As:Zn (corresponding to the portion of the current-blocking layer positioning layer which forms the interface with the third compound semiconductor layer) can be considered to be formed between the third compound semiconductor layer and the current-blocking layer positioning layer.

EXAMPLE 9

Example 9 relates to a semiconductor light-emitting device according to an eighth embodiment (more specifically, an embodiment 8-A-1) of the present invention. As shown in a conceptual view of FIG. 13(A), a schematic partial sectional view of FIG. 23(A), and an enlarged schematic partial sectional view of FIG. 23(B), a semiconductor light-emitting device of Example 9 includes, (A) a light-emitting portion 20 composed of a laminated structure in which a first compound semiconductor layer 21 having a first conductivity type (in Example 9, n-type), an active layer 23, and a second compound semiconductor layer 22 having a second conductivity type (in Example 9, p-type) are laminated in order, and (B) a current-blocking layer 40 in contact with a side of the light-emitting portion 20.

The current-blocking layer 40 is composed of a laminated structure in which at least a fourth compound semiconductor layer 44 having the second conductivity type and a third compound semiconductor layer 43 having the first conductivity type are laminated in order. In addition, the impurity for imparting the second conductivity type to the fourth compound semiconductor layer 44 includes an impurity in the fourth compound semiconductor layer 44 at a substitution site which is competitive with a substitution site of the impurity in the third compound semiconductor layer 43, for imparting the first conductivity type to the first compound semiconductor layer 43, and the impurity at a substitution site competitive with a substitution site of the impurity in the first compound semiconductor layer 21, for imparting the first conductivity type to the first compound semiconductor layer 21. Also, the impurity for imparting the second conductivity type to the second compound semiconductor layer 22 includes an impurity in the second compound semiconductor layer 22 at a substitution site which is competitive with a substitution site of the impurity in the third compound semiconductor layer 43, for imparting the first conductivity type to the third compound semiconductor layer 43. Further, when an alternative route passing through the first compound semiconductor layer 21, the current-blocking layer 40, and the second compound semiconductor layer 22 is assumed, at least three pn junction interfaces composed of the interfaces between the respective compound semiconductor layers are present in the alternative route.

The fourth compound semiconductor layer 44 is in contact with the side of the first compound semiconductor layer 21, and the third compound semiconductor layer 43 is in contact with the side of the second compound semiconductor layer 22. In addition, specifically, the alternative route is composed of the first compound semiconductor layer 21, the fourth compound semiconductor layer 44, the third compound semiconductor layer 43, and the second compound semiconductor layer 22, and the pn junction interfaces include the three interfaces of the side of the first compound semiconductor layer 21/the fourth compound semiconductor layer 44, the fourth compound semiconductor layer 44/the third compound semiconductor layer 43, and the third compound semiconductor layer 43/the side of the second compound semiconductor layer 22.

Also, in the semiconductor light-emitting device of Example 9, the first compound semiconductor layer 21, the second compound semiconductor layer 22, the fourth compound semiconductor layer 44, and the third compound semiconductor layer 43 are composed of Group III-V compound semiconductors. Alternatively, as described below, the first A compound semiconductor layer 21A, the first B compound semiconductor layer 21B, the second compound semiconductor layer 22, the fourth compound semiconductor layer 44, and the third compound semiconductor layer 43 are composed of Group III-V compound semiconductors. Alternatively, the first compound semiconductor layer 21, the second A compound semiconductor layer 22A, the second B compound semiconductor layer 22B, the fourth compound semiconductor layer 44, and the third compound semiconductor layer 43 are composed of Group III-V compound semiconductors.

Here, in Example 9, the substitution site of the impurity in the first compound semiconductor layer 21, the substitution site of the impurity in the second compound semiconductor layer 22, the substitution site of the impurity in the fourth compound semiconductor layer 44, and the substitution site of the impurity in the third compound semiconductor layer 43 are sites occupied by group III atoms. In addition, the impurity for imparting n-type which is the first conductivity type to the first compound semiconductor layer 21 and the third compound semiconductor layer 43 is a group IV impurity (specifically, silicon, Si), and the impurity for imparting p-type which is the second conductivity type to the second compound semiconductor layer 22 and the fourth compound semiconductor layer 44 is a group II impurity (specifically, zinc, Zn).

More specifically, in the semiconductor light-emitting device of Example 9, each of the layers has the configuration shown in Table 9A below.

TABLE 9A (Configuration of light-emitting portion)

| | |
|---|---|
| Second compound semiconductor layer 22B | p-Al$_{0.47}$Ga$_{0.53}$As:Zn |
| Second compound semiconductor layer 22A | p-Al$_{0.4}$Ga$_{0.6}$As:Zn |
| Active layer 23 | [active layer-A] |
| First compound semiconductor layer 21 | n-Al$_{0.4}$Ga$_{0.6}$As:Si |

TABLE 9A-continued (Current-blocking layer)

| | |
|---|---|
| Buried layer 31 | p-$Al_{0.47}Ga_{0.53}As$:Zn |
| Third compound semiconductor layer 43 | n-$Al_{0.47}Ga_{0.53}As$:Si |
| Fourth compound semiconductor layer 44 | p-$Al_{0.47}Ga_{0.53}As$:Zn |
| Current-blocking layer positioning layer 30 | p-$Al_{0.47}Ga_{0.53}As$:Zn |
| (Whole) | |
| Contact layer 32 | p-GaAs:Zn (or C) |

(Note 1)
The current-blocking layer positioning layer 30 is formed following the formation of the second compound semiconductor layer 22B.

(Note 2)
The fourth compound semiconductor layer 44 is formed continuously following the formation of the current-blocking layer positioning layer 30 so that substantially no interface is present between the fourth compound semiconductor layer 44 and the current-blocking layer positioning layer 30.

Here, in the example shown in FIG. 23(B), the third compound semiconductor layer 43 is formed on the fourth compound semiconductor layer 44. In addition, a pn junction interface between the third compound semiconductor layer 43 (n-type) and the fourth compound semiconductor layer 44 (p-type) formed thereunder extends along the {311}B crystal plane, and the ends of the pn junction interface are in contact with the light-emitting portion 20 (particularly, the side of the active layer 23) to form two new junction interfaces. Namely, a current path having a pnpn junction structure including a second compound semiconductor layers 23A, 23B/third compound semiconductor layer 43 pn junction interface, a third compound semiconductor layer 43/fourth compound semiconductor layer 44 pn junction interface, and a fourth compound semiconductor layer 44/first compound semiconductor layer 21 pn junction interface is formed, thereby providing a preferred design as a current-blocking structure.

Further, in Example 9, the substitution site of the impurity in the first compound semiconductor layer 21, the substitution site of the impurity in the fourth compound semiconductor layer 44, the substitution site of the impurity in the third compound semiconductor layer 43, and the substitution site of the impurity in the second compound semiconductor layer 22 are sites occupied by group III atoms. Namely, the impurity for imparting the first conductivity type (n-type) to the first compound semiconductor layer 21 includes an impurity in the first compound semiconductor layer 21 at a substitution site (site occupied by a group III atom) which is competitive with a substitution site (site occupied by a group III atom) of the impurity in the fourth compound semiconductor layer 44, for imparting the second conductivity type (p-type) to the fourth compound semiconductor layer 44. In addition, the impurity for imparting the first conductivity type (n-type) to the third compound semiconductor layer 43 includes an impurity in the third compound semiconductor layer 43 at a substitution site (site occupied by a group III atom) which is competitive with a substitution site (site occupied by a group III atom) of the impurity in the fourth compound semiconductor layer 44, for imparting the second conductivity type (p-type) to the fourth compound semiconductor layer 44. Further, the impurity for imparting the second conductivity type (p-type) to the second compound semiconductor layer 22 includes an impurity in the second compound semiconductor layer 22 at a substitution site (site occupied by a group III atom) which is competitive with a substitution site (site occupied by a group III atom) of the impurity in the third compound semiconductor layer 43, for imparting the first conductivity type (n-type) to the third compound semiconductor layer 43. Therefore, when the fourth compound semiconductor layer 44 is deposited, impurity inter-diffusion little occurs between the fourth compound semiconductor layer 44 constituting the current-blocking layer 40 and the first compound semiconductor layer 21, and when the third compound semiconductor layer 43 is deposited, impurity inter-diffusion little occurs between the third compound semiconductor layer 43 and the fourth compound semiconductor layer 44 which constitute the current-blocking layer 40 or between the third compound semiconductor layer 43 and the second compound semiconductor layer 22. Thus, the current-blocking layer 40 with high reliability can be formed. In other words, it is possible to securely avoid the problem in which the current-blocking layer 40 disappears or the current-blocking layer 40 decreases in thickness, and thus the effect of the current-blocking layer 40 is not stabilized, thereby increasing a leakage current.

In addition, except the above points, the semiconductor light-emitting device of Example 9 has basically the same configuration and structure as the semiconductor light-emitting device of Example 1, and thus detailed description is omitted.

Hereinafter, modified examples of the semiconductor light-emitting device of Example 9 will be described.

Figure 13:
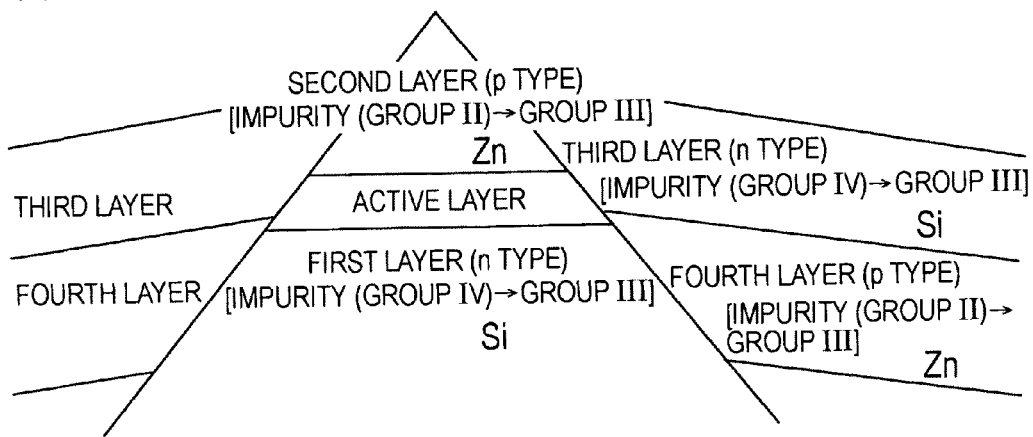
FIGS. 13(A) and (B) are conceptual views of a semiconductor light-emitting device of Example 9.
Figure 13:
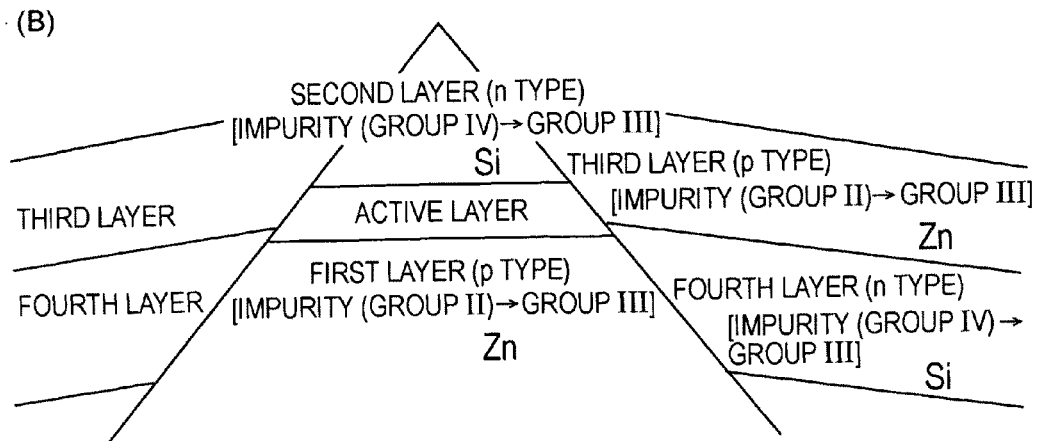

A modified example of the semiconductor light-emitting device of Example 9 shown in a conceptual view of FIG. 13(B) is a semiconductor light-emitting device according to an embodiment 8-A-2 of the present invention, wherein the impurity for imparting p-type which is the first conductivity type to the first compound semiconductor layer and the third compound semiconductor layer is a group II impurity (specifically, Zn), and the impurity for imparting n-type which is the second conductivity type to the second compound semiconductor layer and the fourth compound semiconductor layer is a group IV impurity (specifically, Si).

More specifically, in the modified example of the semiconductor light-emitting device of Example 9, each of the layers has the configuration shown in Table 9B below. In addition, the same notes as (Note 1) and (Note 2) of Table 9A are appended (this applies to Tables 9C to 9J below).

TABLE 9B (Configuration of light-emitting portion)

| | |
|---|---|
| Second compound semiconductor layer | n-$Al_{0.47}Ga_{0.53}As$:Si |
| Second compound semiconductor layer | n-$Al_{0.4}Ga_{0.6}As$:Si |
| Active layer | [active layer-B] |
| First compound semiconductor layer | p-$Al_{0.4}Ga_{0.6}As$:Zn |
| (Current-blocking layer) | |
| Buried layer | n-$Al_{0.47}Ga_{0.53}As$:Se |
| Third compound semiconductor layer | p-$Al_{0.47}Ga_{0.53}As$:Zn |
| Fourth compound semiconductor layer | n-$Al_{0.47}Ga_{0.53}As$:Si |
| Current-blocking layer positioning layer | n-$Al_{0.47}Ga_{0.53}As$:Se |
| (Whole) | |
| Contact layer | p-GaAs:Zn (or C) |

Figure 14:
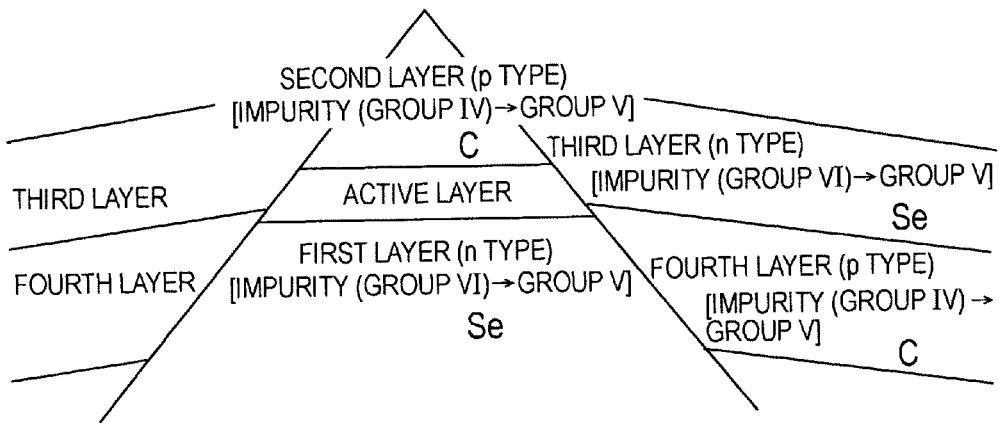
FIGS. 14(A) and (B) are conceptual views of modified examples of the semiconductor light-emitting device of Example 9.
Figure 14:
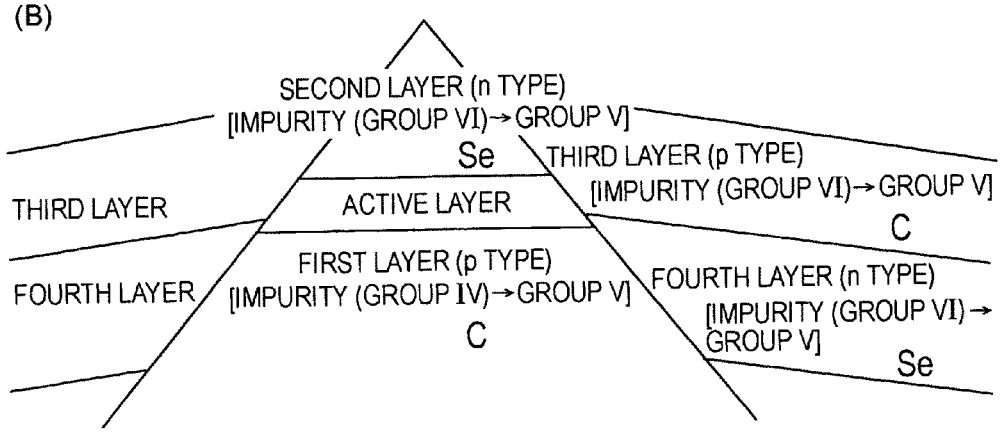

Modified examples of the semiconductor light-emitting device of Example 9 shown in conceptual views of FIGS. 14(A) and 14(B) are semiconductor light-emitting devices according to an embodiment 8-a of the present invention, wherein the substitution site of the impurity in the first compound semiconductor layer, the substitution site of the impurity in the second compound semiconductor layer, the substitution site of the impurity in the fourth compound semiconductor layer, and the substitution site of the impurity in the third compound semiconductor layer are sites occupied by group V atoms.

In addition, the modified example of the semiconductor light-emitting device of Example 9 shown in a conceptual view of FIG. 14(A) is a semiconductor light-emitting device according to an embodiment 8-a-1 of the present invention, wherein the impurity for imparting n-type which is the first conductivity type to the first compound semiconductor layer and the third compound semiconductor layer is a group VI impurity (specifically, Se), and the impurity for imparting p-type which is the second conductivity type to the second compound semiconductor layer and the fourth compound semiconductor layer is carbon (C).

More specifically, in the modified example of the semiconductor light-emitting device of Example 9, each of the layers has the configuration shown in Table 9C below.

TABLE 9C (Configuration of light-emitting portion)

| | |
|---|---|
| Second compound semiconductor layer | p-$Al_{0.47}Ga_{0.53}As$:C |
| Second compound semiconductor layer | p-$Al_{0.4}Ga_{0.6}As$:C |
| Active layer | [active layer-A] |
| First compound semiconductor layer | n-$Al_{0.4}Ga_{0.6}As$:Se |
| (Current-blocking layer) | |
| Buried layer | p-$Al_{0.47}Ga_{0.53}As$:Zn |
| Third compound semiconductor layer | n-$Al_{0.47}Ga_{0.53}As$:Se |
| Fourth compound semiconductor layer | p-$Al_{0.47}Ga_{0.53}As$:C |
| Current-blocking layer positioning layer | p-$Al_{0.47}Ga_{0.53}As$:Zn |
| (Whole) | |
| Contact layer 32 | p-GaAs:Zn (or C) |

Alternatively, the modified example of the semiconductor light-emitting device of Example 9 shown in a conceptual view of FIG. 14(B) is a semiconductor light-emitting device according to an embodiment 8-a-2 of the present invention, wherein the impurity for imparting p-type which is the first conductivity type to the first compound semiconductor layer and the third compound semiconductor layer is carbon (C), and the impurity for imparting n-type which is the second conductivity type to the second compound semiconductor layer and the fourth compound semiconductor layer is a group VI impurity (specifically, Se).

More specifically, in the modified example of the semiconductor light-emitting device of Example 9, each of the layers has the configuration shown in Table 9D below.

TABLE 9D (Configuration of light-emitting portion)

| | |
|---|---|
| Second compound semiconductor layer | n-$Al_{0.47}Ga_{0.53}As$:Se |
| Second compound semiconductor layer | n-$Al_{0.4}Ga_{0.6}As$:Se |
| Active layer | [active layer-B] |
| First compound semiconductor layer | p-$Al_{0.4}Ga_{0.6}As$:C |
| (Current-blocking layer) | |
| Buried layer | n-$Al_{0.47}Ga_{0.53}As$:Se |
| Third compound semiconductor layer | p-$Al_{0.47}Ga_{0.53}As$:C |
| Fourth compound semiconductor layer | n-$Al_{0.47}Ga_{0.53}As$:Se |
| Current-blocking layer positioning layer | n-$Al_{0.47}Ga_{0.53}As$:Se |
| (Whole) | |
| Contact layer | p-GaAs:Zn (or C) |

Figure 15:
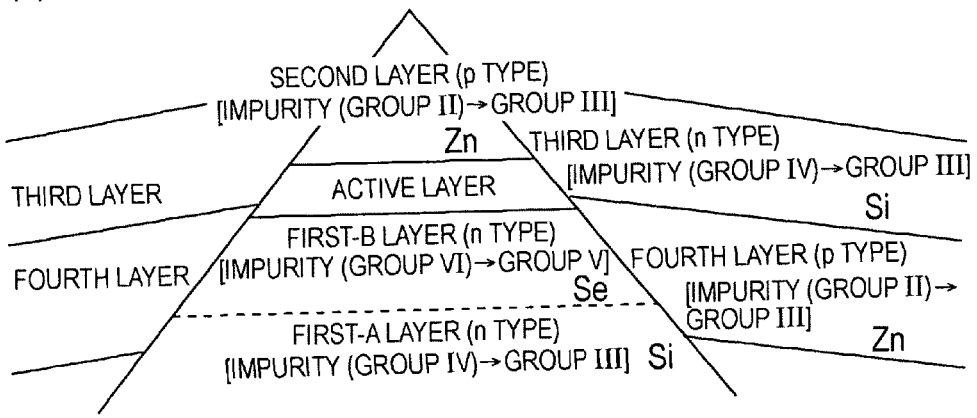
FIGS. 15(A) and (B) are conceptual views of other modified examples of the semiconductor light-emitting device of Example 9.
Figure 15:
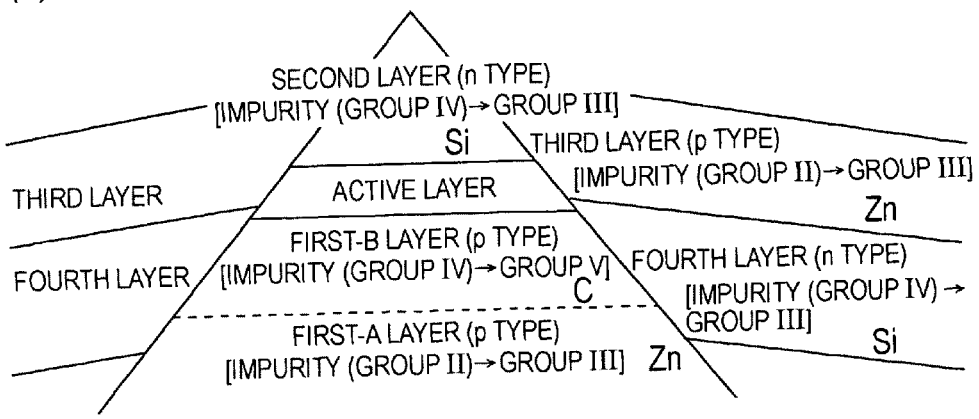

Modified examples of the semiconductor light-emitting device of Example 9 shown in conceptual views of FIGS. 15(A) and 15(B) are semiconductor light-emitting devices according to an embodiment 8-B of the present invention, wherein a first compound semiconductor layer includes a first A compound semiconductor layer and a first B compound semiconductor layer provided on the first A compound semiconductor layer so as to be in contact with an active layer, the impurity for imparting the first conductivity type to the first B compound semiconductor layer includes an impurity contained in the first B compound semiconductor layer at a substitution site which is uncompetitive with a substitution site of the impurity in the first A compound semiconductor layer, for imparting the first conductivity type to the first A compound semiconductor layer and the impurity uncompetitive with a substitution site of the impurity in the second compound semiconductor layer, for imparting the second conductivity type to the second compound semiconductor layer. In addition, the impurity for imparting the first conductivity type to the first A compound semiconductor layer includes an impurity contained in the first A compound semiconductor layer at a substitution site which is competitive with a substitution site of the impurity in the fourth compound semiconductor layer, for imparting the second conductivity type to the fourth compound semiconductor layer. Specifically, the substitution site of the impurity in the first A compound semiconductor layer, the substitution site of the impurity in the second compound semiconductor layer, the substitution site of the impurity in the fourth compound semiconductor layer, and the substitution site of the impurity in the third compound semiconductor layer are sites occupied by group III atoms, and the substitution site of the impurity in the first B compound semiconductor layer is a site occupied by a group V atom.

In addition, the modified example of the semiconductor light-emitting device of Example 9 shown in a conceptual view of FIG. 15(A) is a semiconductor light-emitting device according to an embodiment 8-B-1 of the present invention, wherein the impurity for imparting n-type which is the first conductivity type to the first A compound semiconductor layer and the third compound semiconductor layer is a group IV impurity (specifically, Si), the impurity for imparting n-type which is the first conductivity type to the first B compound semiconductor layer is a group VI impurity (specifically, Se), and the impurity for imparting p-type which is the second conductivity type to the second compound semiconductor layer and the fourth compound semiconductor layer is a group II impurity (specifically, Zn).

More specifically, in the modified example of the semiconductor light-emitting device of Example 9, each of the layers has the configuration shown in Table 9E below.

TABLE 9E (Configuration of light-emitting portion)

| | |
|---|---|
| Second compound semiconductor layer | p-$Al_{0.47}Ga_{0.53}As$:Zn |
| Second compound semiconductor layer | p-$Al_{0.4}Ga_{0.6}As$:Zn |
| Active layer | [active layer-A] |
| First B compound semiconductor layer | n-$Al_{0.4}Ga_{0.6}As$:Se |
| First A compound semiconductor layer | n-$Al_{0.4}Ga_{0.6}As$:Si |
| (Current-blocking layer) | |
| Buried layer | p-$Al_{0.47}Ga_{0.53}As$:Zn |
| Third compound semiconductor layer | n-$Al_{0.47}Ga_{0.53}As$:Si |
| Fourth compound semiconductor layer | p-$Al_{0.47}Ga_{0.53}As$:Zn |
| Current-blocking layer positioning layer | p-$Al_{0.47}Ga_{0.53}As$:Zn |
| (Whole) | |
| Contact layer | p-GaAs:Zn (or C) |

Alternatively, the modified example of the semiconductor light-emitting device of Example 9 shown in a conceptual view of FIG. 15(B) is a semiconductor light-emitting device according to an embodiment 8-B-2 of the present invention, wherein the impurity for imparting p-type which is the first conductivity type to the first A compound semiconductor layer and the third compound semiconductor layer is a group II impurity (specifically, Zn), the impurity for imparting p-type which is the first conductivity type to the first B compound semiconductor layer is carbon (C), and the impurity for imparting n-type which is the second conductivity type to the second compound semiconductor layer and the fourth compound semiconductor layer is a group IV impurity (specifically, Si).

More specifically, in the modified example of the semiconductor light-emitting device of Example 9, each of the layers has the configuration shown in Table 9F below.

TABLE 9F

| (Configuration of light-emitting portion) | |
| --- | --- |
| Second compound semiconductor layer | n-$Al_{0.47}Ga_{0.53}As$:Si |
| Second compound semiconductor layer | n-$Al_{0.4}Ga_{0.6}As$:Si |
| Active layer | [active layer-B] |
| First B compound semiconductor layer | p-$Al_{0.4}Ga_{0.6}As$:C |
| First A compound semiconductor layer | p-$Al_{0.4}Ga_{0.6}As$:Zn |
| (Current-blocking layer) | |
| Buried layer | n-$Al_{0.47}Ga_{0.53}As$:Se |
| Third compound semiconductor layer | p-$Al_{0.47}Ga_{0.53}As$:Zn |
| Fourth compound semiconductor layer | n-$Al_{0.47}Ga_{0.53}As$:Si |
| Current-blocking layer positioning layer | n-$Al_{0.47}Ga_{0.53}As$:Se |
| (Whole) | |
| Contact layer | p-GaAs:Zn (or C) |

Figure 16:
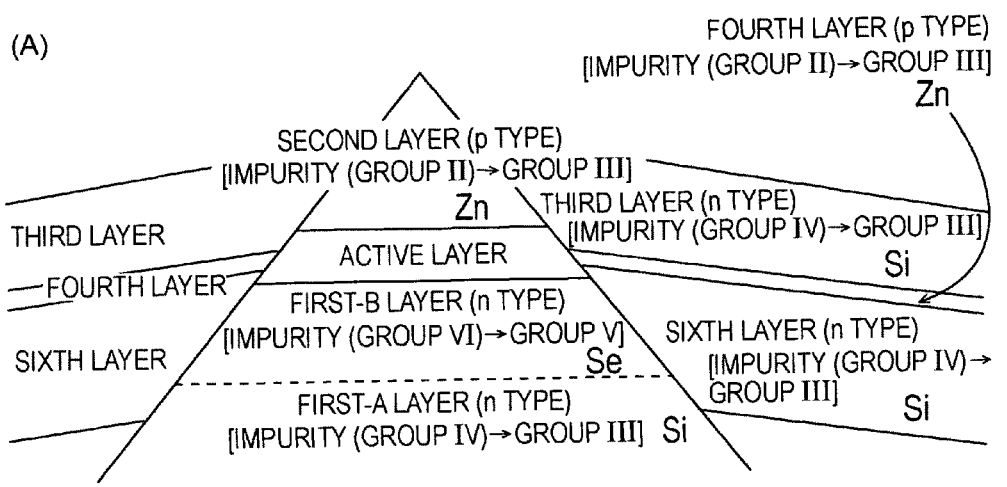
FIGS. 16(A) and (B) are conceptual views of further modified examples of the semiconductor light-emitting device of Example 9.
Figure 16:
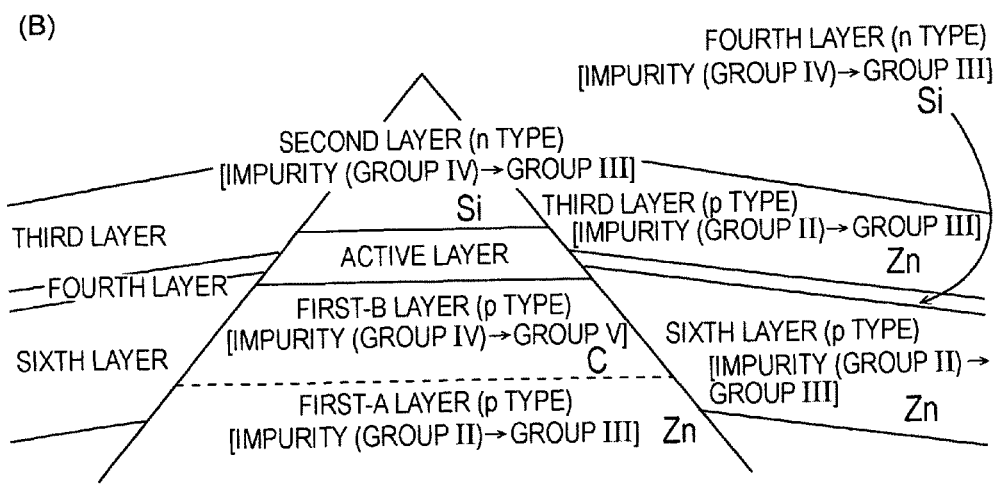

Further modified examples of the semiconductor light-emitting devices of Example 9 shown in conceptual views of FIGS. 15(A) and (B) are shown in FIGS. 16(A) and (B). In these further modified examples, a sixth compound semiconductor layer having the first conductivity type is provided blow the fourth compound semiconductor layer, the impurity for imparting the first conductivity type to the sixth compound semiconductor layer includes an impurity (specifically, in FIG. 16(A), a group IV impurity Si, and in FIG. 16(B), a group II impurity Zn) in the sixth compound semiconductor layer at a substitution site which is competitive with a substitution site of the impurity in the first A compound semiconductor layer, for imparting the first conductivity type to the first A compound semiconductor layer, and the sixth compound semiconductor layer is in contact with the side of the first compound semiconductor layer (at least a portion of the side of the first A compound semiconductor layer and the whole side of the first B compound semiconductor layer), and the third compound semiconductor layer is in contact with the side of the second compound semiconductor layer. In addition, an alternative route includes the first compound semiconductor layer (the first A compound semiconductor layer and the first B compound semiconductor layer), the sixth compound semiconductor layer, the fourth compound semiconductor layer, the third compound semiconductor layer, and the second compound semiconductor layer, and the pn junction interfaces include the three interfaces of the sixth compound semiconductor layer/the fourth compound semiconductor layer, the fourth compound semiconductor layer/the third compound semiconductor layer, and the third compound semiconductor layer/the side of the second compound semiconductor layer.

Figure 17:
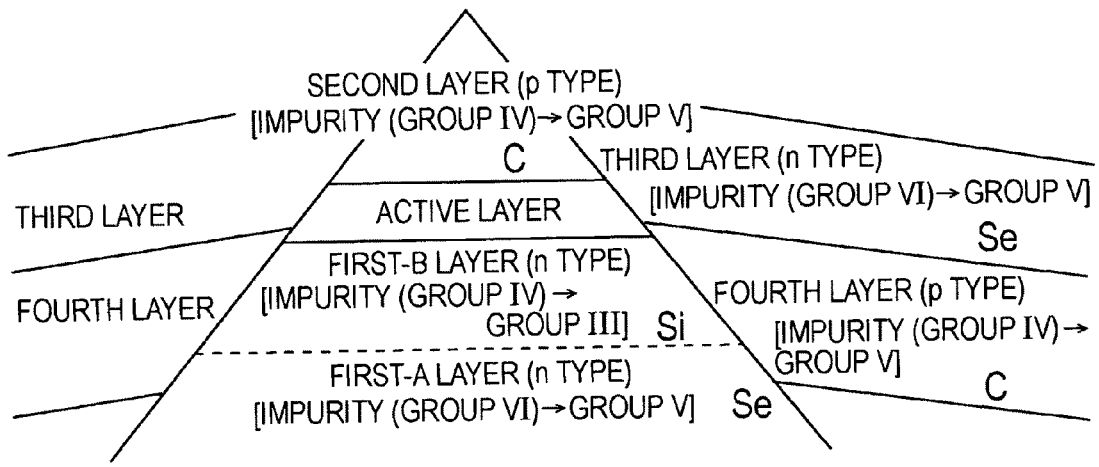
FIGS. 17(A) and (B) are conceptual views of further modified examples of the semiconductor light-emitting device of Example 9.
Figure 17:
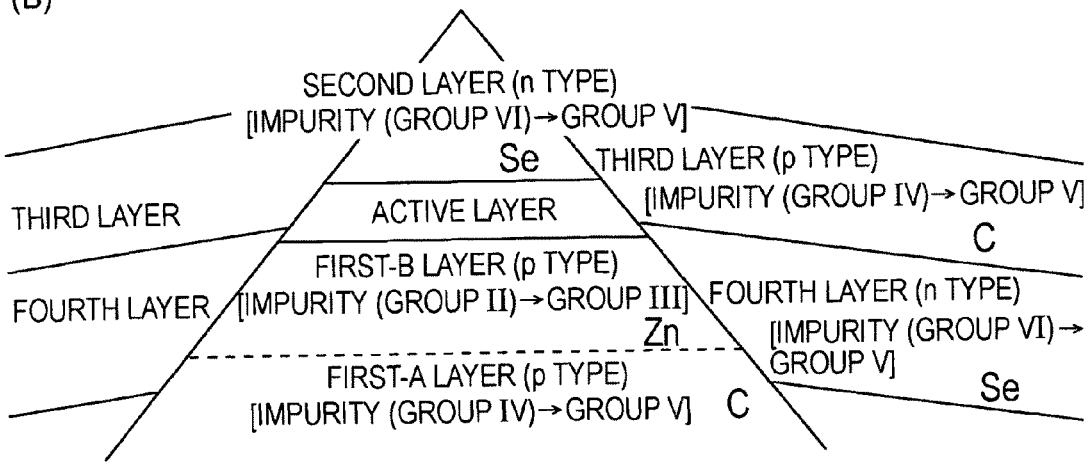

Modified examples of the semiconductor light-emitting devices of Example 9 shown in conceptual views of FIGS. 17(A) and (B) correspond to a semiconductor light-emitting device according to an embodiment 8-b of the present invention, wherein the substitution site of the impurity in the first A compound semiconductor layer, the substitution site of the impurity in the second compound semiconductor layer, the substitution site of the impurity in the fourth compound semiconductor layer, and the substitution site of the impurity in the third compound semiconductor layer are sites occupied by group V atoms, and the substitution site of the impurity in the first B compound semiconductor layer is a site occupied by a group III atom.

In addition, the modified example of the semiconductor light-emitting device of Example 9 shown in a conceptual views of FIG. 17(A) corresponds to a semiconductor light-emitting device according to an embodiment 8-b-1 of the present invention, wherein the impurity for imparting n-type which is the first conductivity type to the first A compound semiconductor layer and the third compound semiconductor layer is a group VI impurity (specifically, Se), the impurity for imparting n-type which is the first conductivity type to the first B compound semiconductor layer is a group IV impurity (specifically, Si), and the impurity for imparting p-type which is the second conductivity type to the second compound semiconductor layer and the fourth compound semiconductor layer is a carbon (C).

More specifically, in the modified example of the semiconductor light-emitting device of Example 9, each of the layers has the configuration shown in Table 9G below.

TABLE 9G

| (Configuration of light-emitting portion) | |
| --- | --- |
| Second compound semiconductor layer | p-$Al_{0.47}Ga_{0.53}As$:C |
| Second compound semiconductor layer | p-$Al_{0.4}Ga_{0.6}As$:C |
| Active layer | [active layer-A] |
| First B compound semiconductor layer | n-$Al_{0.4}Ga_{0.6}As$:Si |
| First A compound semiconductor layer | n-$Al_{0.4}Ga_{0.6}As$:Se |
| (Current-blocking layer) | |
| Buried layer | p-$Al_{0.47}Ga_{0.53}As$:Zn |
| Third compound semiconductor layer | n-$Al_{0.47}Ga_{0.53}As$:Se |
| Fourth compound semiconductor layer | p-$Al_{0.47}Ga_{0.53}As$:C |
| Current-blocking layer positioning layer | p-$Al_{0.47}Ga_{0.53}As$:Zn |
| (Whole) | |
| Contact layer | p-GaAs:Zn (or C) |

Alternatively, the modified example of the semiconductor light-emitting device of Example 9 shown in a conceptual view of FIG. 17(B) is a semiconductor light-emitting device according to an embodiment 8-b-2 of the present invention, wherein the impurity for imparting p-type which is the first conductivity type to the first A compound semiconductor layer and the third compound semiconductor layer is carbon (C), the impurity for imparting p-type which is the first conductivity type to the first B compound semiconductor layer is a group II impurity (specifically, Zn), and the impurity for imparting n-type which is the second conductivity type to the second compound semiconductor layer and the fourth compound semiconductor layer is a group VI impurity (specifically, Se).

More specifically, in the modified example of the semiconductor light-emitting device of Example 9, each of the layers has the configuration shown in Table 9H below.

TABLE 9H (Configuration of light-emitting portion)

| | |
|---|---|
| Second compound semiconductor layer | n-$Al_{0.47}Ga_{0.53}As$:Se |
| Second compound semiconductor layer | n-$Al_{0.4}Ga_{0.6}As$:Se |
| Active layer | [active layer-B] |
| First B compound semiconductor layer | p-$Al_{0.4}Ga_{0.6}As$:Zn |
| First A compound semiconductor layer | p-$Al_{0.4}Ga_{0.6}As$:C |
| (Current-blocking layer) | |
| Buried layer | n-$Al_{0.47}Ga_{0.53}As$:Se |
| Third compound semiconductor layer | p-$Al_{0.47}Ga_{0.53}As$:C |
| Fourth compound semiconductor layer | n-$Al_{0.47}Ga_{0.53}As$:Se |
| Current-blocking layer positioning layer | n-$Al_{0.47}Ga_{0.53}As$:Se |
| (Whole) | |
| Contact layer | p-GaAs:Zn (or C) |

Figure 18:
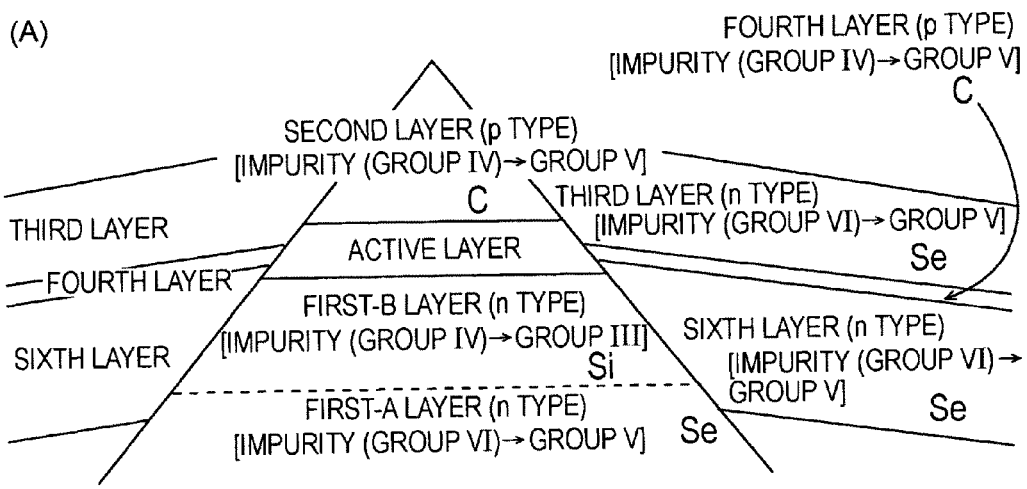
FIGS. 18(A) and (B) are conceptual views of further modified examples of the semiconductor light-emitting device of Example 9.
Figure 18:
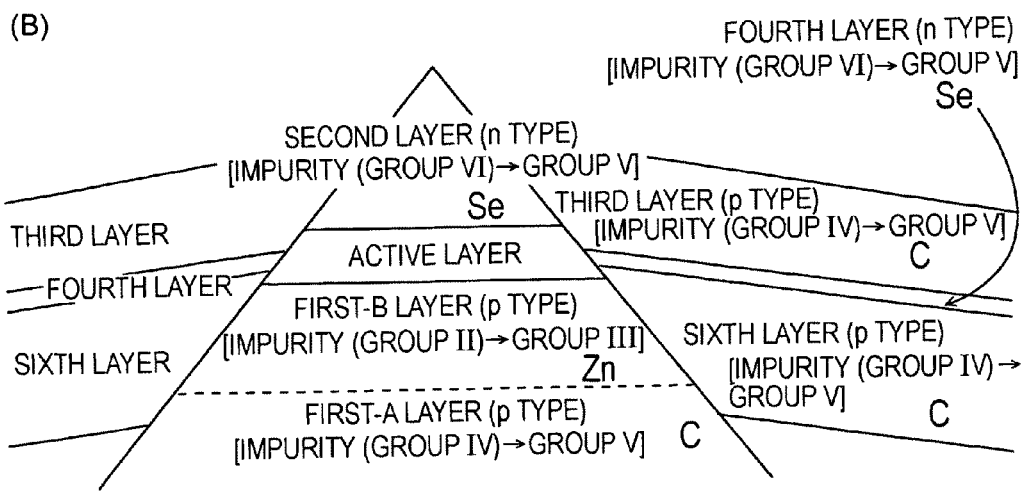

Conceptual vies of further modified examples of the modified examples of the semiconductor light-emitting device of Example 9 shown in conceptual views of FIGS. 17(A) and (B) are shown in FIGS. 18(A) and (B). In these further modified examples, a sixth compound semiconductor layer having the first conductivity type is provided blow the fourth compound semiconductor layer, the impurity for imparting the first conductivity type to the sixth compound semiconductor layer includes an impurity (specifically, in FIG. 18(A), a group VI impurity Se, and in FIG. 18(B), carbon (C)) in the sixth compound semiconductor layer at a substitution site which is competitive with a substitution site of the impurity in the first A compound semiconductor layer, for imparting the first conductivity type to the first A compound semiconductor layer, and the sixth compound semiconductor layer is in contact with the side of the first compound semiconductor layer (at least a portion of the side of the first A compound semiconductor layer and the whole side of the first B compound semiconductor layer), and the third compound semiconductor layer is in contact with the side of the second compound semiconductor layer. In addition, an alternative route includes the first compound semiconductor layer (the first A compound semiconductor layer and the first B compound semiconductor layer), the sixth compound semiconductor layer, the fourth compound semiconductor layer, the third compound semiconductor layer, and the second compound semiconductor layer, and the pn junction interfaces include the three interfaces of the sixth compound semiconductor layer/the fourth compound semiconductor layer, the fourth compound semiconductor layer/the third compound semiconductor layer, and the third compound semiconductor layer/the side of the second compound semiconductor layer.

Figure 19:
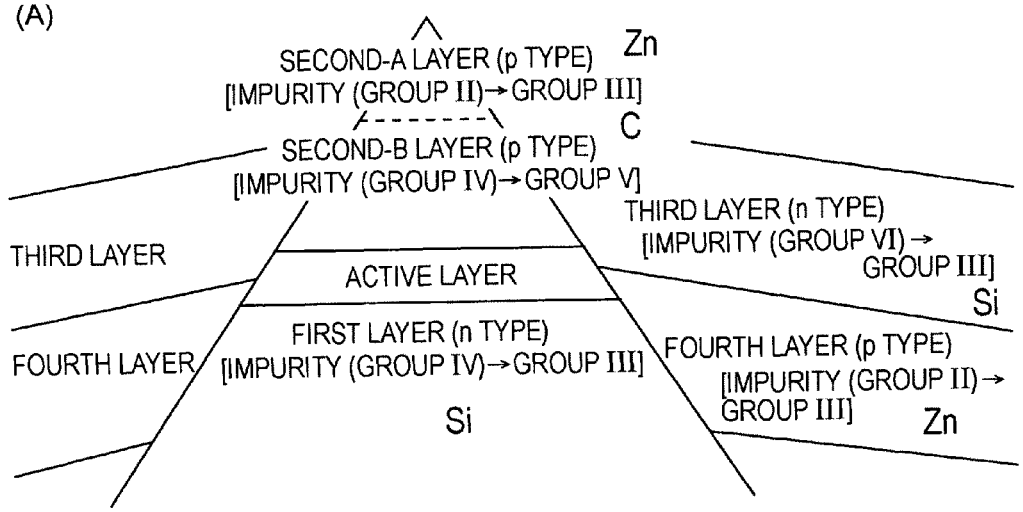
FIGS. 19(A) and (B) are conceptual views of further modified examples of the semiconductor light-emitting device of Example 9.
Figure 19:
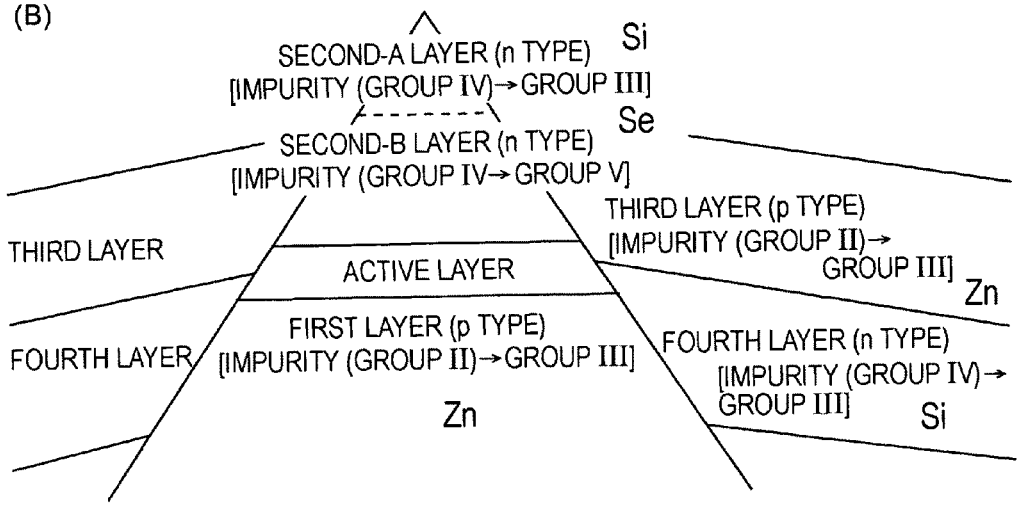

Modified examples of the semiconductor light-emitting device of Example 9 shown in conceptual views of FIGS. 19(A) and (B) correspond to a semiconductor light-emitting device according to an embodiment 8-C of the present invention, wherein a second compound semiconductor layer includes a second B compound semiconductor layer in contact with an active layer and a second A compound semiconductor layer provided on the second B compound semiconductor layer, the impurity for imparting the second conductivity type to the second B compound semiconductor layer includes an impurity contained in the second B compound semiconductor layer at a substitution site which is uncompetitive with a substitution site of the impurity in the second A compound semiconductor layer, for imparting the second conductivity type to the second A compound semiconductor layer and the impurity uncompetitive with a substitution site of the impurity in the first compound semiconductor layer, for imparting the first conductivity type to the first compound semiconductor layer. In addition, the impurity for imparting the second conductivity type to the second A compound semiconductor layer includes an impurity contained in the second A compound semiconductor layer at a substitution site which is competitive with a substitution site of the impurity in the third compound semiconductor layer, for imparting the first conductivity type to the third compound semiconductor layer. Specifically, the substitution site of the impurity in the first compound semiconductor layer, the substitution site of the impurity in the second A compound semiconductor layer, the substitution site of the impurity in the fourth compound semiconductor layer, and the substitution site of the impurity in the third compound semiconductor layer are sites occupied by group III atoms, and the substitution site of the impurity in the second B compound semiconductor layer is a site occupied by a group V atom.

In addition, the modified example of the semiconductor light-emitting device of Example 9 shown in a conceptual view of FIG. 19(A) corresponds to a semiconductor light-emitting device according to an embodiment 8-C-1 of the present invention, wherein the impurity for imparting n-type which is the first conductivity type to the first compound semiconductor layer and the third compound semiconductor layer is a group IV impurity (specifically, Si), and the impurity for imparting p-type which is the second conductivity type to the second A compound semiconductor layer and the fourth compound semiconductor layer is a group II impurity (specifically, Zn), and the impurity for imparting p-type which is the second conductivity type to the second B compound semiconductor layer is a carbon (C).

More specifically, in the modified example of the semiconductor light-emitting device of Example 9, each of the layers has the configuration shown in Table 9I below.

TABLE 9I (Configuration of light-emitting portion)

| | |
|---|---|
| Second B compound semiconductor layer | p-$Al_{0.4}Ga_{0.6}As$:Zn |
| Second A compound semiconductor layer | p-$Al_{0.4}Ga_{0.6}As$:C |
| Active layer | [active layer-A] |
| First compound semiconductor layer | n-$Al_{0.4}Ga_{0.6}As$:Si |
| (Current-blocking layer) | |
| Buried layer | p-$Al_{0.47}Ga_{0.53}As$:Zn |
| Third compound semiconductor layer | n-$Al_{0.47}Ga_{0.53}As$:Si |
| Fourth compound semiconductor layer | p-$Al_{0.47}Ga_{0.53}As$:Zn |
| Current-blocking layer positioning layer | p-$Al_{0.47}Ga_{0.53}As$:Zn |
| (Whole) | |
| Contact layer | p-GaAs:Zn (or C) |

Alternatively, the modified example of the semiconductor light-emitting device of Example 9 shown in a conceptual view of FIG. 19(B) is a semiconductor light-emitting device according to an embodiment 8-C-2 of the present invention, wherein the impurity for imparting p-type which is the first conductivity type to the first compound semiconductor layer and the third compound semiconductor layer is a group II impurity (specifically, Zn), the impurity for imparting n-type which is the second conductivity type to the second A compound semiconductor layer and the fourth compound semiconductor layer is a group IV impurity (specifically, Si), and the impurity for imparting n-type which is the second conductivity type to the second B compound semiconductor layer is a group VI impurity (specifically, Se).

More specifically, in the modified example of the semiconductor light-emitting device of Example 9, each of the layers has the configuration shown in Table 9J below.

TABLE 9J (Configuration of light-emitting portion)

| Second B compound semiconductor layer | n-$Al_{0.4}Ga_{0.6}As$:Si |
| Second A compound semiconductor layer | n-$Al_{0.4}Ga_{0.6}As$:Se |
| Active layer | [active layer-B] |
| First compound semiconductor layer (Current-blocking layer) | p-$Al_{0.4}Ga_{0.6}As$:Zn |
| Buried layer | n-$Al_{0.47}Ga_{0.53}As$:Se |
| Third compound semiconductor layer | p-$Al_{0.47}Ga_{0.53}As$:Zn |
| Fourth compound semiconductor layer | n-$Al_{0.47}Ga_{0.53}As$:Si |
| Current-blocking layer positioning layer (Whole) | n-$Al_{0.47}Ga_{0.53}As$:Se |
| Contact layer | p-GaAs:Zn (or C) |

Figure 20:
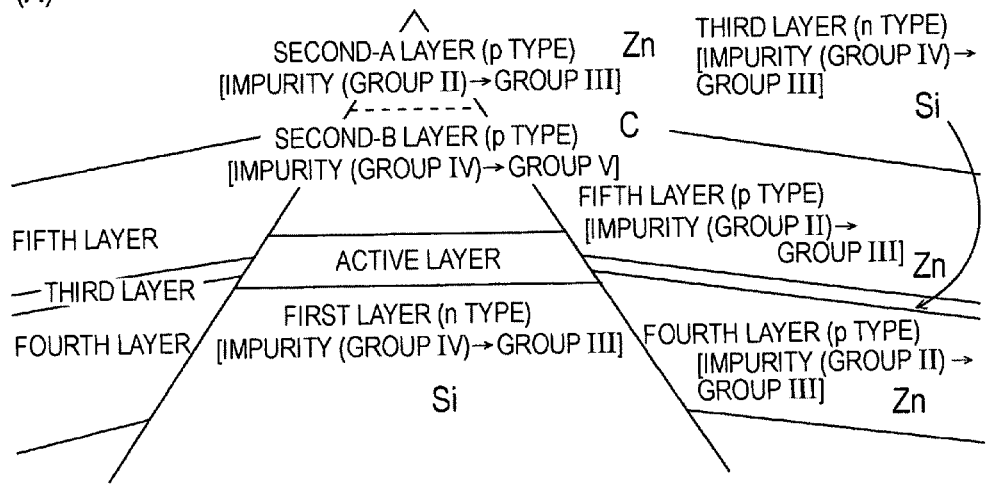
FIGS. 20(A) and (B) are conceptual views of further modified examples of the semiconductor light-emitting device of Example 9.
Figure 20:
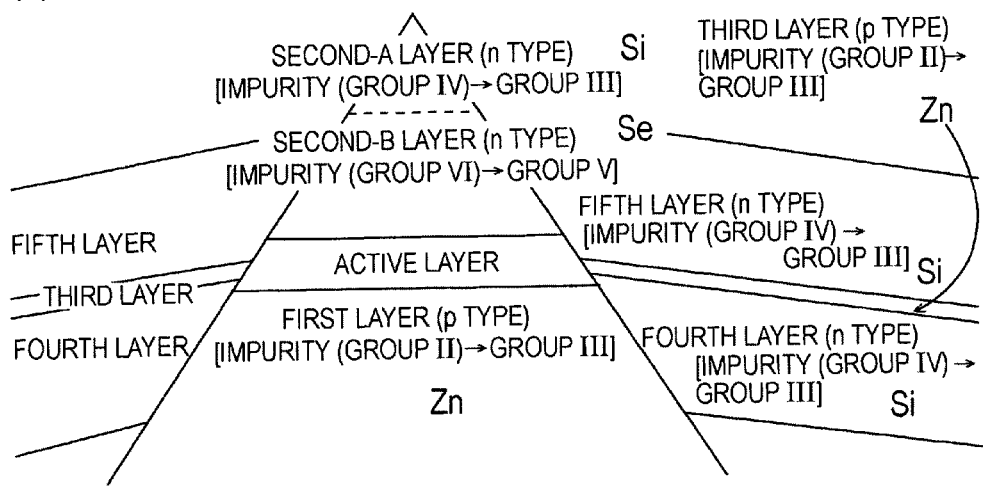

Further modified examples of the modified examples of the semiconductor light-emitting device of Example 9 shown in conceptual views of FIGS. 19(A) and (B) are shown in FIGS. 20(A) and (B). In these further modified examples, a fifth compound semiconductor layer having the second conductivity type is provided on the third compound semiconductor layer, the impurity for imparting the second conductivity type to the fifth compound semiconductor layer includes an impurity (specifically, in FIG. 20(A), a group II impurity Zn, and in FIG. 20(B), a group IV impurity Si) in the fifth compound semiconductor layer at a substitution site which is competitive with a substitution site of the impurity in the second A compound semiconductor layer, for imparting the second conductivity type to the second A compound semiconductor layer, and the fourth compound semiconductor layer is in contact with the side of the first compound semiconductor layer and the fifth compound semiconductor layer is in contact with the side of the second compound semiconductor layer (at least a portion of the side of the second A compound semiconductor layer and the whole side of the second B compound semiconductor layer). In addition, an alternative route includes the first compound semiconductor layer, the fourth compound semiconductor layer, the third compound semiconductor layer, the fifth compound semiconductor layer, and the second compound semiconductor layer (the second A compound semiconductor layer and the second B compound semiconductor layer), and the pn junction interfaces include the three interfaces of the side of the first compound semiconductor layer/the fourth compound semiconductor layer, the fourth compound semiconductor layer/the third compound semiconductor layer, and the third compound semiconductor layer/the fifth compound semiconductor layer.

Figure 21:
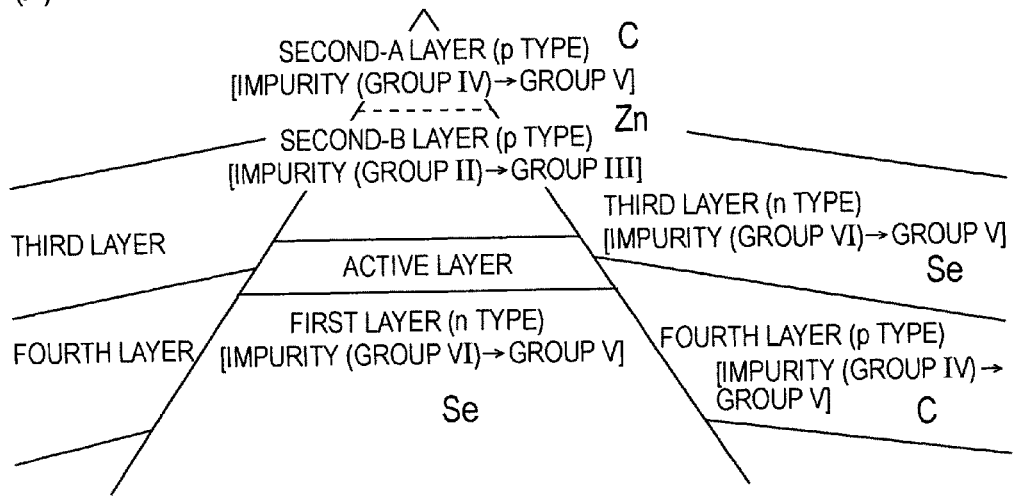
FIGS. 21(A) and (B) are conceptual views of further modified examples of the semiconductor light-emitting device of Example 9.
Figure 21:
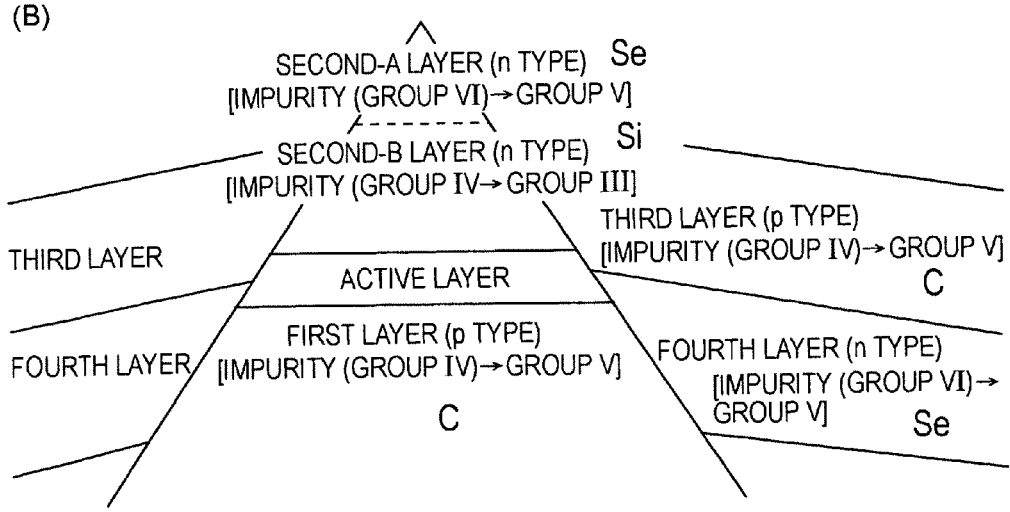

Modified examples of the semiconductor light-emitting device of Example 9 shown in conceptual views of FIGS. 21(A) and (B) correspond to a semiconductor light-emitting device according to an embodiment 8-c of the present invention, wherein the substitution site of the impurity in the first compound semiconductor layer, the substitution site of the impurity in the second A compound semiconductor layer, the substitution site of the impurity in the fourth compound semiconductor layer, and the substitution site of the impurity in the third compound semiconductor layer are sites occupied by group V atoms, and the substitution site of the impurity in the second B compound semiconductor layer is a site occupied by a group III atom.

In addition, the modified example of the semiconductor light-emitting device of Example 9 shown in a conceptual view of FIG. 21(A) corresponds to a semiconductor light-emitting device according to an embodiment 8-c-1 of the present invention, wherein the impurity for imparting n-type which is the first conductivity type to the first compound semiconductor layer and the third compound semiconductor layer is a group VI impurity (specifically, Se), the impurity for imparting p-type which is the second conductivity type to the second A compound semiconductor layer and the fourth compound semiconductor layer is carbon (C), and the impurity for imparting p-type which is the second conductivity type to the second B compound semiconductor layer is a Group II impurity (specifically, Zn).

More specifically, in the modified example of the semiconductor light-emitting device of Example 9, each of the layers has the configuration shown in Table 9K below.

TABLE 9K (Configuration of light-emitting portion)

| Second A compound semiconductor layer | p-$Al_{0.4}Ga_{0.6}As$:C |
| Second B compound semiconductor layer | p-$Al_{0.4}Ga_{0.6}As$:Zn |
| Active layer | [active layer-A] |
| First compound semiconductor layer (Current-blocking layer) | n-$Al_{0.4}Ga_{0.6}As$:Se |
| Buried layer | p-$Al_{0.47}Ga_{0.53}As$:Zn |
| Third compound semiconductor layer | n-$Al_{0.47}Ga_{0.53}As$:Se |
| Fourth compound semiconductor layer | p-$Al_{0.47}Ga_{0.53}As$:C |
| Current-blocking layer positioning layer (Whole) | p-$Al_{0.47}Ga_{0.53}As$:Zn |
| Contact layer | p-GaAs:Zn (or C) |

Alternatively, the modified example of the semiconductor light-emitting device of Example 9 shown in a conceptual view of FIG. 21(B) is a semiconductor light-emitting device according to an embodiment 8-c-2 of the present invention, wherein the impurity for imparting p-type which is the first conductivity type to the first compound semiconductor layer and the third compound semiconductor layer is carbon (C), the impurity for imparting n-type which is the second conductivity type to the second A compound semiconductor layer and the fourth compound semiconductor layer is a group VI impurity (specifically, Se), and the impurity for imparting n-type which is the second conductivity type to the second B compound semiconductor layer is a group IV impurity (specifically, Si).

More specifically, in the modified example of the semiconductor light-emitting device of Example 9, each of the layers has the configuration shown in Table 9L below.

TABLE 9L (Configuration of light-emitting portion)

| | |
|---|---|
| Second A compound semiconductor layer | n-$Al_{0.4}Ga_{0.6}As$:Se |
| Second B compound semiconductor layer | n-$Al_{0.4}Ga_{0.6}As$:Si |
| Active layer | [active layer-B] |
| First compound semiconductor layer (Current-blocking layer) | p-$Al_{0.4}Ga_{0.6}As$:C |
| Buried layer | n-$Al_{0.47}Ga_{0.53}As$:Se |
| Third compound semiconductor layer | p-$Al_{0.47}Ga_{0.53}As$:C |
| Fourth compound semiconductor layer | n-$Al_{0.47}Ga_{0.53}As$:Se |
| Current-blocking layer positioning layer (Whole) | n-$Al_{0.47}Ga_{0.53}As$:Se |
| Contact layer | p-GaAs:Zn (or C) |

Figure 22:
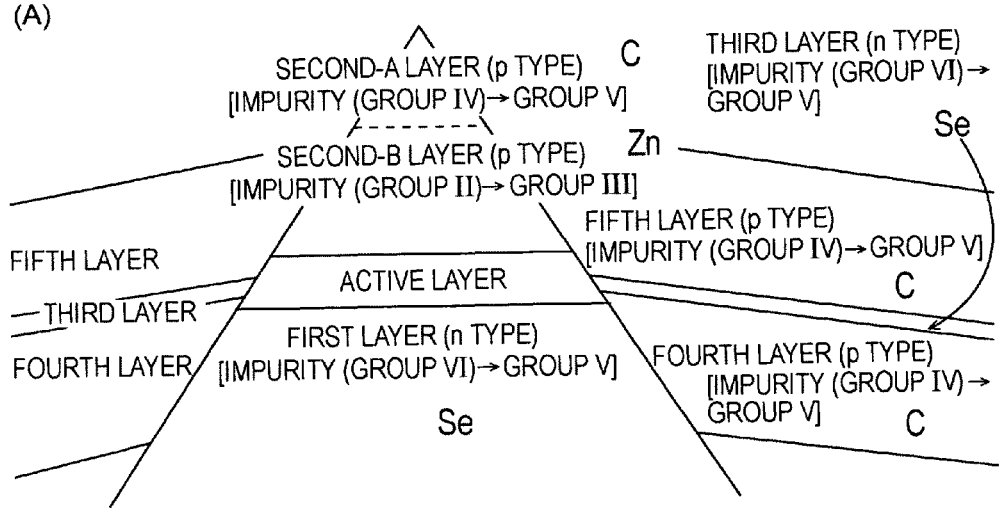
FIGS. 22(A) and (B) are conceptual views of further modified examples of the semiconductor light-emitting device of Example 9.
Figure 22:
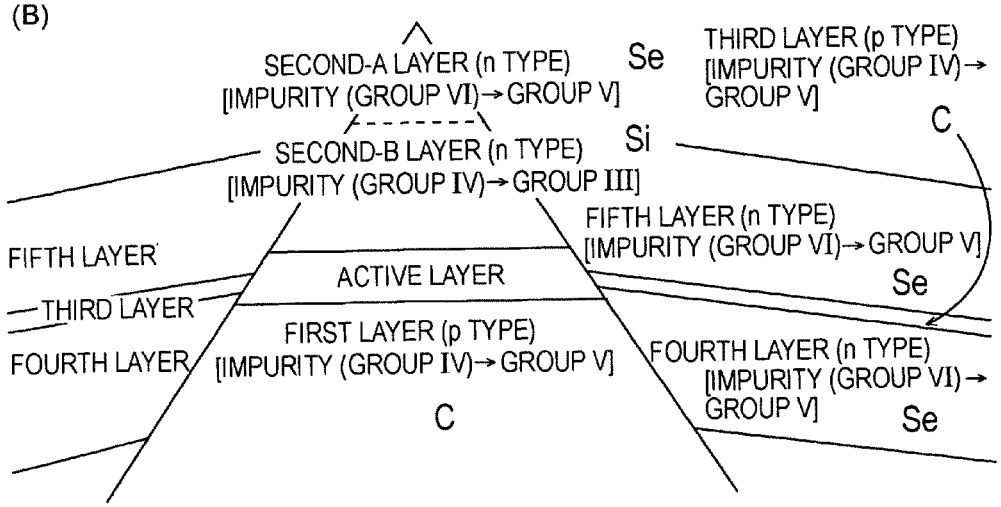

Further modified examples of the modified examples of the semiconductor light-emitting device of Example 9 shown in conceptual views of FIGS. 21(A) and (B) are shown in FIGS. 22(A) and (B). In these further modified examples, a fifth compound semiconductor layer having the second conductivity type is provided on the third compound semiconductor layer, the impurity for imparting the second conductivity type to the fifth compound semiconductor layer includes an impurity (specifically, in FIG. 22(A), carbon (C), and in FIG. 22(B), a group VI impurity Se) in the fifth compound semiconductor layer at a substitution site which is competitive with a substitution site of the impurity in the second A compound semiconductor layer, for imparting the second conductivity type to the second A compound semiconductor layer, and the fourth compound semiconductor layer is in contact with the side of the first compound semiconductor layer and the fifth compound semiconductor layer is in contact with the side of the second compound semiconductor layer (at least a portion of the side of the second A compound semiconductor layer and the whole side of the second B compound semiconductor layer). In addition, an alternative route includes the first compound semiconductor layer, the fourth compound semiconductor layer, the third compound semiconductor layer, the fifth compound semiconductor layer, and the second compound semiconductor layer (the second A compound semiconductor layer and the second B compound semiconductor layer), and the pn junction interfaces include the three interfaces of the side of the first compound semiconductor layer/the fourth compound semiconductor layer, the fourth compound semiconductor layer/the third compound semiconductor layer, and the third compound semiconductor layer/the fifth compound semiconductor layer.

An impurity diffusion barrier layer may be provided in the current-blocking layer. Specifically, at least one impurity diffusion barrier layer (for example, a seventh compound semiconductor layer) having the second conductivity type may be inserted into the fourth compound semiconductor layer constituting the current-blocking layer having the second conductivity type, and impurities may be selected so that the impurity substitution site in the fourth compound semiconductor layer is different from that in the impurity diffusion barrier layer (e.g., the seventh compound semiconductor layer when the impurity diffusion barrier layer is provided). More specifically, for example, in the structures shown in FIGS. 15(A) and 16(A), a configuration can be utilized, in which the impurity in the fourth compound semiconductor layer is zinc (Zn), and the impurity in the impurity diffusion barrier layer (seventh compound semiconductor layer) of the second conductivity type which is inserted into the fourth compound semiconductor layer is carbon (C). Namely, the following configuration can be used.

n-type third compound semiconductor layer (impurity: Si)
p-type fourth compound semiconductor layer (impurity: Zn)
p-type seventh compound semiconductor layer (impurity: C)
p-type fourth compound semiconductor layer (impurity: Zn)

Alternatively, in the structures shown in FIGS. 15(B) and 16(B), a configuration can be utilized, in which the impurity in the fourth compound semiconductor layer is silicon (Si), and the impurity in the impurity diffusion barrier layer (seventh compound semiconductor layer) of the second conductivity type which is inserted into the fourth compound semiconductor layer is selenium (Se). Namely, the following configuration can be used.

p-type third 3 compound semiconductor layer (impurity: Zn)
n-type fourth compound semiconductor layer (impurity: Si)
n-type seventh compound semiconductor layer (impurity: Se)
n-type fourth compound semiconductor layer (impurity: Si)

By using this configuration, for example, when a group VI impurity (Se) or carbon (C) as the impurity diffuses from the first B compound semiconductor layer into the current-blocking layer (Zn-coped layer or Si-doped layer), the impurity cannot diffuse into the seventh compound semiconductor layer containing an impurity (carbon or selenium) at a substitution site competitive with the Group VI impurity or carbon, and thus the current-blocking layer with high reliability can be formed.

Similarly, at least one impurity diffusion barrier layer (for example, an eighth compound semiconductor layer) having the first conductivity type may be inserted into the third compound semiconductor layer constituting the current-blocking layer having the first conductivity type, and impurities may be selected so that the impurity substitution site in the third compound semiconductor layer is different from that in the impurity diffusion barrier layer (e.g., the eighth compound semiconductor layer when the impurity diffusion barrier layer is provided). For example, in the structures shown in FIGS. 19(A) and 20(A), a configuration can be utilized, in which the impurity in the third compound semiconductor layer is silicon (Si), and the impurity in the impurity diffusion barrier layer (eighth compound semiconductor layer) of the first conductivity type which is inserted into the third compound semiconductor layer is selenium (Se). Namely, the following configuration can be used.

n-type third compound semiconductor layer (impurity: Si)
n-type eighth compound semiconductor layer (impurity: Se)
n-type third compound semiconductor layer (impurity: Si)
p-type fourth compound semiconductor layer (impurity: Zn)

Alternatively, in the structures shown in FIGS. 19(B) and 20(B), a configuration can be utilized, in which the impurity in the third compound semiconductor layer is zinc (Zn), and the impurity in the impurity diffusion barrier layer (eighth compound semiconductor layer) of the first conductivity type which is inserted into the third compound semiconductor layer is carbon (C). Namely, the following configuration can be used.

p-type third compound semiconductor layer (impurity: Zn)

p-type eighth compound semiconductor layer (impurity: C)

p-type third compound semiconductor layer (impurity: Zn)

n-type fourth compound semiconductor layer (impurity: Si)

By using this configuration, for example, when carbon (C) or selenium (Se) as the impurity diffuses from the second B compound semiconductor layer into the current-blocking layer (Si-coped layer or Zn-doped layer), the impurity cannot diffuse into the eighth compound semiconductor layer containing an impurity (a group VI impurity Se or carbon) at a substitution site competitive with the impurity in the second B compound semiconductor layer, and thus the current-blocking layer with high reliability can be formed.

Such a configuration can also be applied to another semiconductor light-emitting device composed of a first compound semiconductor layer including a first A compound semiconductor layer and a first B compound semiconductor layer or another semiconductor light-emitting device composed of a second compound semiconductor layer including a second A compound semiconductor layer and a second B compound semiconductor layer.

With respect to a form in which the impurity diffusion barrier layer (the seventh compound semiconductor layer or the eighth compound semiconductor layer) is inserted, particularly, the effect of impurity diffusion barrier can be easily achieved in FIGS. 16(A) and (B), FIGS. 18(A) and (B), FIGS. 20(A) and (B), FIGS. 22(A) and (B), etc., and an example in which the seventh compound semiconductor layer or the eighth compound semiconductor layer is inserted as the impurity diffusion barrier layer into a compound semiconductor layer (the fourth compound semiconductor layer or the third compound semiconductor layer) of the same conductivity type as that of the seventh compound semiconductor layer or the eighth compound semiconductor layer is described above. However, the number of impurity diffusion barrier layers intended for impurity diffusion barrier may be two or more as long as the compound semiconductor layer used as the impurity diffusion barrier layer has the same impurity substitution site as the substitution site of the impurity which diffuses from the first compound semiconductor layer (or the first B compound semiconductor layer) or the second compound semiconductor layer (or the second B compound semiconductor layer) into the current-blocking layer. The position where the impurity diffusion barrier layer is provided is not only a compound semiconductor layer having the same conductivity type as the impurity diffusion barrier layer, and one or more layers may be inserted into a compound semiconductor layer having a different conductivity type.

Alternatively, the current-blocking layer may be configured in a multilayer structure. Specifically, for example, in the structure shown in FIG. 16(A), instead of using a laminated structure of a n-type third compound semiconductor layer/a p-type fourth compound semiconductor layer/a n-type sixth compound semiconductor layer, the current-blocking layer may be configured in the following structure without changing the whole thickness of the current-blocking layer.

A five-layer laminated structure including:
(1) n-type third compound semiconductor layer (impurity: Si)
(2) p-type compound semiconductor layer (impurity: Zn)
(3) n-type compound semiconductor layer (impurity: Si)
(4) p-type fourth compound semiconductor layer (impurity: Zn)
(5) n-type sixth compound semiconductor layer (impurity: Si)

A seven-layer laminated structure including:
(1) n-type third compound semiconductor layer (impurity: Si)
(2) p-type compound semiconductor layer (impurity: Zn)
(3) n-type compound semiconductor layer (impurity: Si)
(4) p-type compound semiconductor layer (impurity: Zn)
(5) n-type compound semiconductor layer (impurity: Si)
(6) p-type fourth compound semiconductor layer (impurity: Zn)
(7) n-type sixth compound semiconductor layer (impurity: Si)

A nine-layer laminated structure including:
(1) n-type third compound semiconductor layer (impurity: Si)
(2) p-type compound semiconductor layer (impurity: Zn)
(3) n-type compound semiconductor layer (impurity: Si)
(4) p-type compound semiconductor layer (impurity: Zn)
(5) n-type compound semiconductor layer (impurity: Si)
(6) p-type compound semiconductor layer (impurity: Zn)
(7) n-type compound semiconductor layer (impurity: Si)
(8) p-type fourth compound semiconductor layer (impurity: Zn)
(9) n-type sixth compound semiconductor layer (impurity: Si)

An eleven-layer laminated structure including:
(1) n-type third compound semiconductor layer (impurity: Si)
(2) p-type compound semiconductor layer (impurity: Zn)
(3) n-type compound semiconductor layer (impurity: Si)
(4) p-type compound semiconductor layer (impurity: Zn)
(5) n-type compound semiconductor layer (impurity: Si)
(6) p-type compound semiconductor layer (impurity: Zn)
(7) n-type compound semiconductor layer (impurity: Si)
(8) p-type compound semiconductor layer (impurity: Zn)
(9) n-type compound semiconductor layer (impurity: Si)
(10) p-type fourth compound semiconductor layer (impurity: Zn)
(11) n-type sixth compound semiconductor layer (impurity: Si)

Similarly, in the structure shown in FIG. 18(A), instead of using a laminated structure of a n-type third compound semiconductor layer/a p-type fourth compound semiconductor layer/a n-type sixth compound semiconductor layer, the current-blocking layer may be configured in the following structure without changing the whole thickness of the current-blocking layer.

A five-layer laminated structure including:
(1) n-type third compound semiconductor layer (impurity: Se)
(2) p-type compound semiconductor layer (impurity: C)
(3) n-type compound semiconductor layer (impurity: Se)
(4) p-type fourth compound semiconductor layer (impurity: C)
(5) n-type sixth compound semiconductor layer (impurity: Se)

A seven-layer laminated structure including:
(1) n-type third compound semiconductor layer (impurity: Se)
(2) p-type compound semiconductor layer (impurity: C)
(3) n-type compound semiconductor layer (impurity: Se)
(4) p-type compound semiconductor layer (impurity: C)
(5) n-type compound semiconductor layer (impurity: Se)
(6) p-type fourth compound semiconductor layer (impurity: C)
(7) n-type sixth compound semiconductor layer (impurity: Se)

A nine-layer laminated structure including:
(1) n-type third compound semiconductor layer (impurity: Se)
(2) p-type compound semiconductor layer (impurity: C)
(3) n-type compound semiconductor layer (impurity: Se)
(4) p-type compound semiconductor layer (impurity: C)
(5) n-type compound semiconductor layer (impurity: Se)
(6) p-type compound semiconductor layer (impurity: C)
(7) n-type compound semiconductor layer (impurity: Se)
(8) p-type fourth compound semiconductor layer (impurity: C)
(9) n-type sixth compound semiconductor layer (impurity: Se)

An eleven-layer laminated structure including:
(1) n-type third compound semiconductor layer (impurity: Se)
(2) p-type compound semiconductor layer (impurity: C)
(3) n-type compound semiconductor layer (impurity: Se)
(4) p-type compound semiconductor layer (impurity: C)
(5) n-type compound semiconductor layer (impurity: Se)
(6) p-type compound semiconductor layer (impurity: C)
(7) n-type compound semiconductor layer (impurity: Se)
(8) p-type compound semiconductor layer (impurity: C)
(9) n-type compound semiconductor layer (impurity: Se)
(10) p-type fourth compound semiconductor layer (impurity: C)
(11) n-type sixth compound semiconductor layer (impurity: Se)

In addition, in the structure shown in FIG. 16(B), instead of using a laminated structure of a p-type third compound semiconductor layer/a n-type fourth compound semiconductor layer/a p-type sixth compound semiconductor layer, the current-blocking layer may be configured in the following structure without changing the whole thickness of the current-blocking layer.

A five-layer laminated structure including:
(1) p-type third compound semiconductor layer (impurity: Zn)
(2) n-type compound semiconductor layer (impurity: Si)
(3) p-type compound semiconductor layer (impurity: Zn)
(4) n-type fourth compound semiconductor layer (impurity: Si) (5) p-type sixth compound semiconductor layer (impurity: Zn)

A seven-layer laminated structure including:
(1) p-type third compound semiconductor layer (impurity: Zn)
(2) n-type compound semiconductor layer (impurity: Si)
(3) p-type compound semiconductor layer (impurity: Zn)
(4) n-type compound semiconductor layer (impurity: Si)
(5) p-type compound semiconductor layer (impurity: Zn)
(6) n-type fourth compound semiconductor layer (impurity: Si)
(7) p-type sixth compound semiconductor layer (impurity: Zn)

A nine-layer laminated structure including:
(1) p-type third compound semiconductor layer (impurity: Zn)
(2) n-type compound semiconductor layer (impurity: Si)
(3) p-type compound semiconductor layer (impurity: Zn)
(4) n-type compound semiconductor layer (impurity: Si)
(5) p-type compound semiconductor layer (impurity: Zn)
(6) n-type compound semiconductor layer (impurity: Si)
(7) p-type compound semiconductor layer (impurity: Zn)
(8) n-type fourth compound semiconductor layer (impurity: Si)
(9) p-type sixth compound semiconductor layer (impurity: Zn)

An eleven-layer laminated structure including:
(1) p-type third compound semiconductor layer (impurity: Zn)
(2) n-type compound semiconductor layer (impurity: Si)
(3) p-type compound semiconductor layer (impurity: Zn)
(4) n-type compound semiconductor layer (impurity: Si)
(5) p-type compound semiconductor layer (impurity: Zn)
(6) n-type compound semiconductor layer (impurity: Si)
(7) p-type compound semiconductor layer (impurity: Zn)
(8) n-type compound semiconductor layer (impurity: Si)
(9) p-type compound semiconductor layer (impurity: Zn)
(10) n-type fourth compound semiconductor layer (impurity: Si)
(11) p-type sixth compound semiconductor layer (impurity: Zn)

Similarly, in the structure shown in FIG. 18(B), instead of using a laminated structure of a p-type third compound semiconductor layer/a n-type fourth compound semiconductor layer/a p-type sixth compound semiconductor layer, the current-blocking layer may be configured in the following structure without changing the whole thickness of the current-blocking layer.

A five-layer laminated structure including:
(1) p-type third compound semiconductor layer (impurity: C)
(2) n-type compound semiconductor layer (impurity: Se)
(3) p-type compound semiconductor layer (impurity: C)
(4) n-type fourth compound semiconductor layer (impurity: Se)
(5) p-type sixth compound semiconductor layer (impurity: C)

A seven-layer laminated structure including:
(1) p-type third compound semiconductor layer (impurity: C)
(2) n-type compound semiconductor layer (impurity: Se)
(3) p-type compound semiconductor layer (impurity: C)
(4) n-type compound semiconductor layer (impurity: Se)
(5) p-type compound semiconductor layer (impurity: C)
(6) n-type fourth compound semiconductor layer (impurity: Se)
(7) p-type sixth compound semiconductor layer (impurity: C)

A nine-layer laminated structure including:
(1) p-type third compound semiconductor layer (impurity: C)
(2) n-type compound semiconductor layer (impurity: Se)
(3) p-type compound semiconductor layer (impurity: C)
(4) n-type compound semiconductor layer (impurity: Se)
(5) p-type compound semiconductor layer (impurity: C)
(6) n-type compound semiconductor layer (impurity: Se)
(7) p-type compound semiconductor layer (impurity: C)
(8) n-type fourth compound semiconductor layer (impurity: Se)
(9) p-type sixth compound semiconductor layer (impurity: C)

An eleven-layer laminated structure including:
(1) p-type third compound semiconductor layer (impurity: C)
(2) n-type compound semiconductor layer (impurity: Se)
(3) p-type compound semiconductor layer (impurity: C)
(4) n-type compound semiconductor layer (impurity: Se)
(5) p-type compound semiconductor layer (impurity: C)
(6) n-type compound semiconductor layer (impurity: Se)
(7) p-type compound semiconductor layer (impurity: C)
(8) n-type compound semiconductor layer (impurity: Se)
(9) p-type compound semiconductor layer (impurity: C)

(10) n-type fourth compound semiconductor layer (impurity: Se)

(11) p-type sixth compound semiconductor layer (impurity: C)

In this way, when the current-blocking layer is formed in a multilayer structure without increasing the total thickness of the current-blocking layer, a design can be selected so as to arbitrarily decrease the thickness of each of the compound semiconductor layers constituting the current-blocking layer (at least one compound semiconductor layer of all compound semiconductor layers ranging from the above-described third compound semiconductor layer to sixth compound semiconductor layer or in the case shown in FIG. 20(A) or (B) or FIG. 22(A) or (B), as described above, at least one compound semiconductor layer of all compound semiconductor layers ranging from the fifth compound semiconductor layer to fourth compound semiconductor layer), and thus the area of contact between one of the layers constituting the current-blocking layer and the side of the light-emitting portion can be decreased. In this contact area, when the thickness of each of the compound semiconductor layers constituting the current-blocking layer is adjusted to further decrease the contact area, it is possible to avoid a state in which the contact area of only one of the layers constituting the current-blocking layer extend over the whole side of the active layer (or the well layer). Hence, it is possible to more securely prevent the phenomenon that a current leak path is formed in an alternative route. In FIG. 28(B), curve "A" shows the measurement results of the threshold current and the measurement results of the slope efficiency in a semiconductor light-emitting device with the structure shown in FIG. 16(A) including a current-blocking layer configured to have the above-described seven-layer laminated structure.

For reference, in FIG. 28(B), curve "B" shows the measurement results of the threshold current and the measurement results of the slope efficiency in a semiconductor light-emitting device including a current-blocking layer configured to have the three layers, i.e., a fifth compound semiconductor layer, a third compound semiconductor layer, and a fourth compound semiconductor layer. In addition, the current-blocking layers in both structures have the same total thickness. As seen from FIG. 28(B), in the current-blocking layer in a multilayer structure, a leakage current can be further decreased, and the slope efficiency can be improved, thereby further decreasing the threshold current.

In Example 9, also, the first compound semiconductor layer can be configured to include a first A compound semiconductor layer and a first B compound semiconductor layer, and the second compound semiconductor layer can be configured to include a second A compound semiconductor layer and a second B compound semiconductor layer.

EXAMPLE 10

Figure 2:
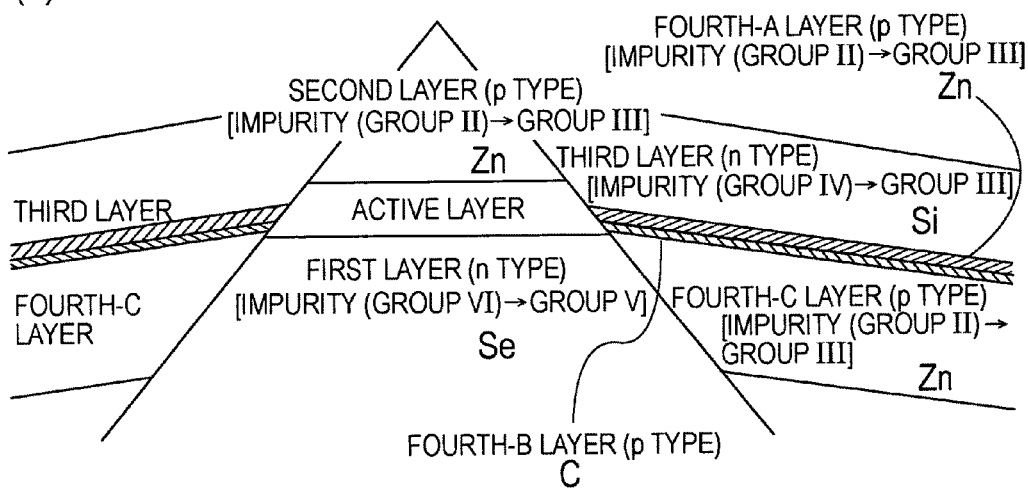
FIGS. 2(A) and (B) are conceptual views of semiconductor light-emitting devices of Example 10 and Example 18, respectively.
Figure 2:
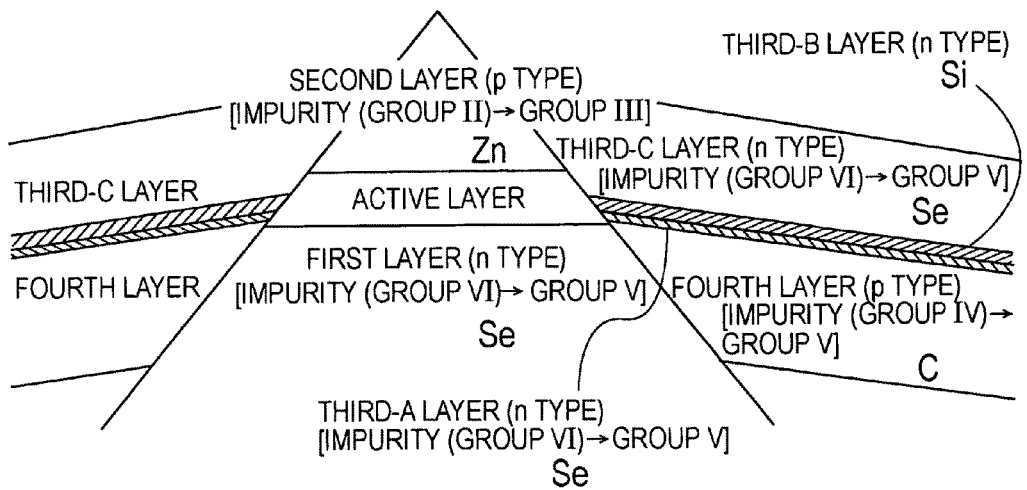

Example 10 is a modification of Example 1 and relates to semiconductor light-emitting devices according to the embodiment 1-A-2 of the present invention and a ninth embodiment of the present invention. In a semiconductor light-emitting device of Example 10, a fourth compound semiconductor layer has a configuration and structure different from that of the fourth compound semiconductor layer in the semiconductor light-emitting device described in Example 1. A conceptual view of the semiconductor light-emitting device of Example 10 is shown in FIG. 2(A).

Here, when described with reference to the ninth embodiment of the present invention, the semiconductor light-emitting device of Example 10 includes, (A) a light-emitting portion composed of a laminated structure in which a first compound semiconductor layer having a first conductivity type, an active layer, and a second compound semiconductor layer having a second conductivity type are laminated in order, and (B) a current-blocking layer in contact with a side of the light-emitting portion, wherein the current-blocking layer is composed of a third compound semiconductor layer having the first conductivity type and a fourth compound semiconductor layer having the second conductivity type and being in contact with the third compound semiconductor layer.

In addition, when a semiconductor light-emitting device of each of Example 11, Example 14, Example 15, Example 18, Example 19, Example 22, and Example 23 described below is described with reference to a tenth embodiment to a sixth embodiment of the present invention, the semiconductor light-emitting device has the same configuration and structure as described above.

Further, when the semiconductor light-emitting device of Example 10 is described with reference to the embodiment 1-A-2 of the present invention or the ninth embodiment of the present invention, the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by group III atoms, and the impurity in the fourth B compound semiconductor layer is carbon (C). In addition, the fourth B compound semiconductor layer is partially or entirely in contact with a side of the active layer, but more specifically, the fourth B compound semiconductor layer is entirely in contact with a side of the active layer.

Specifically, impurities in the fourth A compound semiconductor layer and the fourth C compound semiconductor layer are zinc (Zn) or magnesium (Mg). In addition, the fourth compound semiconductor layer has a three-layer structure. In this case, the fourth A compound semiconductor layer and the fourth B compound semiconductor layer are in contact with a side of the active layer, and further the fourth C compound semiconductor layer is partially in contact with a side of the active layer. Also, the third compound semiconductor layer is partially in contact with a side of the active layer. The configurations and structures of the first compound semiconductor layer, the active layer, the second compound semiconductor layer, and the third compound semiconductor layer can be made the same as the configurations and structures of the first compound semiconductor layer, the active layer, the second compound semiconductor layer, and the third compound semiconductor layer of Example 1. Also, the configurations and structures of the fourth A compound semiconductor layer and the fourth C compound semiconductor layer can be made the same as the configuration and structure of the fourth compound semiconductor layer of Example 1. Further, the configuration and structure of the fourth B compound semiconductor layer can be made the same as the configuration and structure of the fourth compound semiconductor layer of, for example, Example 5. Therefore, detailed description is omitted.

The semiconductor light-emitting device of Example 10 or Example 12, Example 14, Example 16, Example 18, Example 20, Example 22, or Example 24 described below has the third compound semiconductor layer including at least three layers or the fourth compound semiconductor layer including at least three layers, and the third B compound semiconductor layer or the fourth B compound semiconductor layer in contact with a side of the active layer contains carbon (C) or silicon (Si) which is an impurity with relatively low diffusibility. Therefore, impurity diffusion from the compound semiconductor layer in contact with a side of the active layer to the active layer can be decreased.

FIG. 30 shows the measurement results of optical output in the semiconductor light-emitting device of Example 10 and the semiconductor light-emitting devices of Example 1 and Comparative Example 1 shown in Table 1A. In FIG. 30, the results of Example 10 are shown by "A", the results of Example 1 are shown by "B", the results of Comparative Example 1 are shown by "C". FIG. 30 indicates that in Example 10, further higher optical output can be obtained as compared with Example 1 and Comparative Example 1.

EXAMPLE 11

Figure 3:
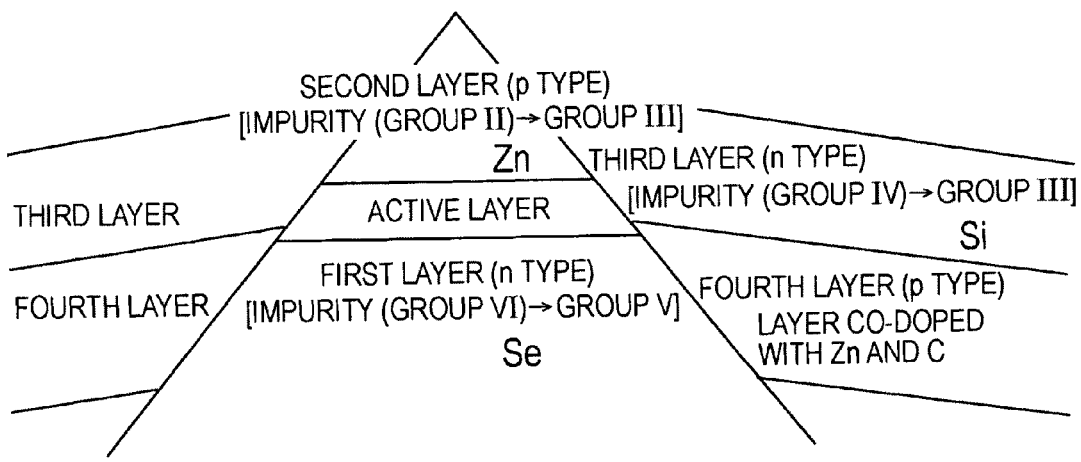
FIGS. 3(A) and (B) are conceptual views of semiconductor light-emitting devices of Example 11 and Example 19, respectively.
Figure 3:
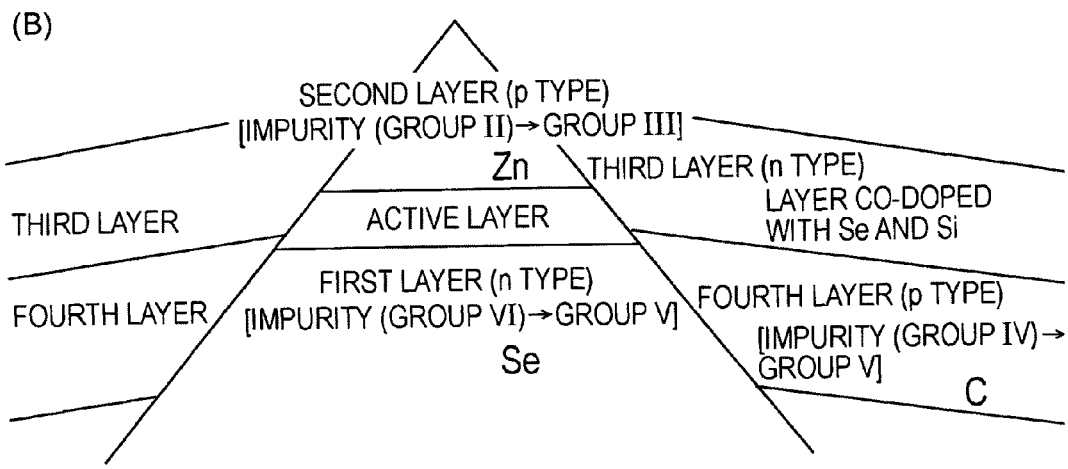

Example 11 is also a modification of Example 1 and relates to semiconductor light-emitting devices according to the embodiment 1-A-3 of the present invention and a tenth embodiment of the present invention. A conceptual view of the semiconductor light-emitting device of Example 11 is shown in FIG. 3(A).

Here, when the semiconductor light-emitting device of Example 11 is described with reference to the embodiment 1-A-3 of the present invention or the ninth embodiment of the present invention, the impurity in the fourth compound semiconductor layer includes an impurity at a substitution site occupied by a group III atom [specifically, zinc (Zn) or magnesium (Mg)] and carbon (C). In other words, in the semiconductor light-emitting device of Example 11, the fourth compound semiconductor layer is co-doped with the impurity at a substitution site occupied by a group III atom [specifically, zinc (Zn) or magnesium (Mg)] and carbon (C) as impurities. Namely, the fourth compound semiconductor layer is a co-doped layer. In this case, $2\times10^{17}$ cm$^{-3}$ to $1\times10^{19}$ cm$^{-3}$ can be used as the impurity concentration of carbon (C), and $2\times10^{17}$ cm$^{-3}$ to $1\times10^{19}$ cm$^{-3}$ can be used as the impurity concentration of zinc (Zn) or magnesium (Mg). In addition, the ratio of (impurity concentration of carbon/impurity concentration of zinc or magnesium) is not limited, but $0.1\leq$ (impurity concentration of carbon/impurity concentration of zinc or magnesium)$\leq 1$ can be exemplified. In Example 11, specifically, the impurity concentration of carbon was $1\times10^{18}$ cm$^{-3}$, and the impurity concentration of zinc or magnesium was $1\times10^{18}$ cm$^{-3}$.

The third compound semiconductor layer is partially in contact with a side of the active layer. Also, the fourth compound semiconductor layer is partially in contact with a side of the active layer. The configurations and structures of the first compound semiconductor layer, the active layer, the second compound semiconductor layer, and the third compound semiconductor layer can be made the same as the configurations and structures of the first compound semiconductor layer, the active layer, the second compound semiconductor layer, and the third compound semiconductor layer of Example 1. Therefore, detailed description is omitted.

The semiconductor light-emitting device of Example 11 or Example 13, Example 15, Example 17, Example 19, Example 21, Example 23, or Example 25 described below is provided with the third compound semiconductor layer or the fourth compound semiconductor layer including a compound semiconductor layer co-doped with carbon (C) or silicon (Si) which is an impurity with relatively low diffusibility. Therefore, impurity diffusion from the compound semiconductor layer in contact with a side of the active layer to the active layer can be decreased.

EXAMPLE 12

Figure 5:
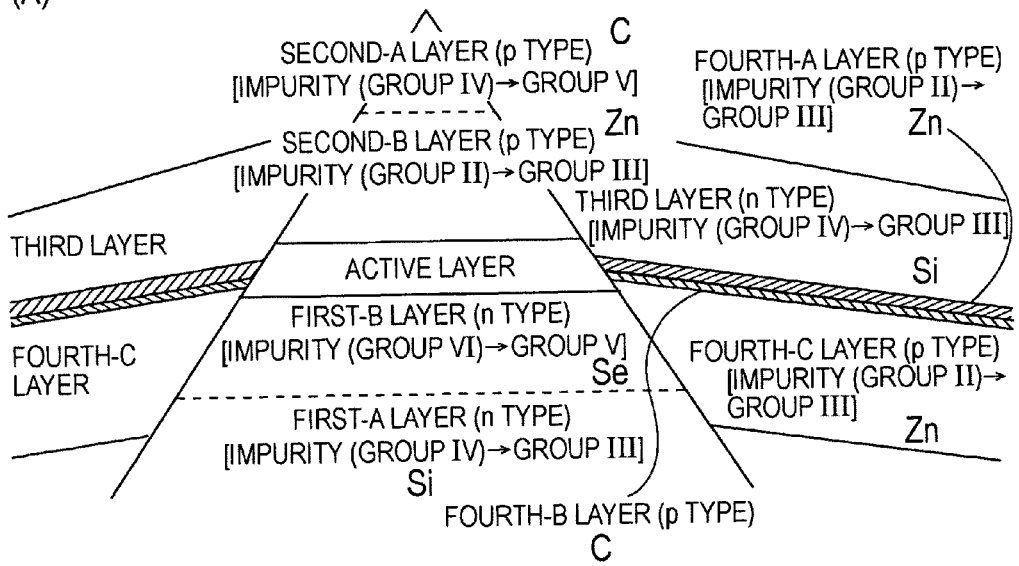
FIGS. 5(A) and (B) are conceptual views of semiconductor light-emitting devices of Example 12 and Example 20, respectively.
Figure 5:
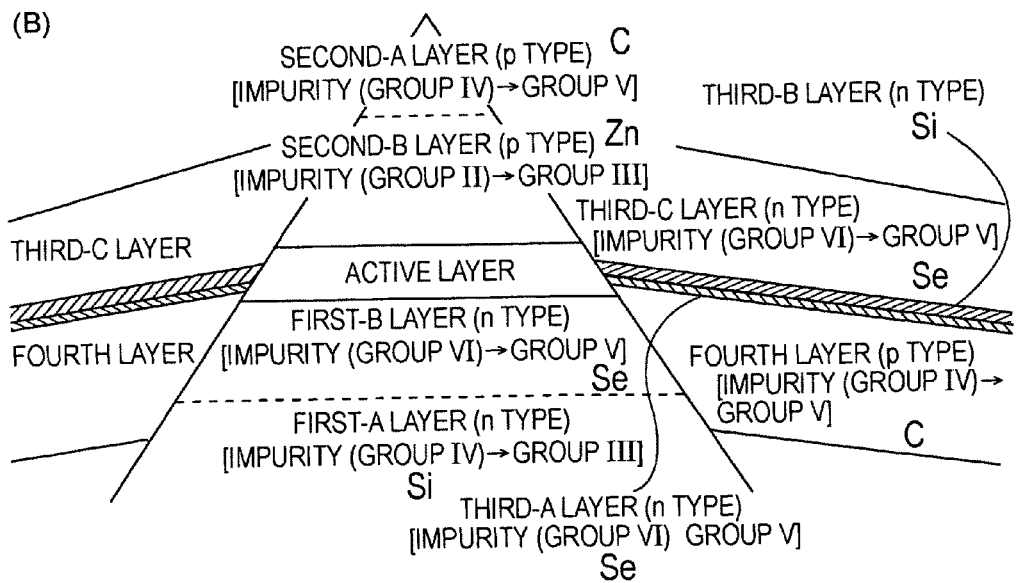

Example 12 is a modification of Example 2 and relates to a semiconductor light-emitting device according to the embodiment 1-B-2 of the present invention. A conceptual view of the semiconductor light-emitting device of Example 12 is shown in FIG. 5(A).

In the semiconductor light-emitting device of Example 12, the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by group III atoms, and the impurity in the fourth B compound semiconductor layer is carbon (C). In addition, the fourth B compound semiconductor layer is partially or entirely in contact with a side of the active layer, but more specifically, the fourth B compound semiconductor layer is entirely in contact with a side of the active layer.

In Example 12, the configurations and structures of the fourth compound semiconductor layer and further the configurations and structures of the first compound semiconductor layer, the active layer, the second compound semiconductor layer, and the third compound semiconductor layer can be made the same as the configurations and structures of these layers of Example 10. Therefore, detailed description is omitted.

EXAMPLE 13

Figure 6:
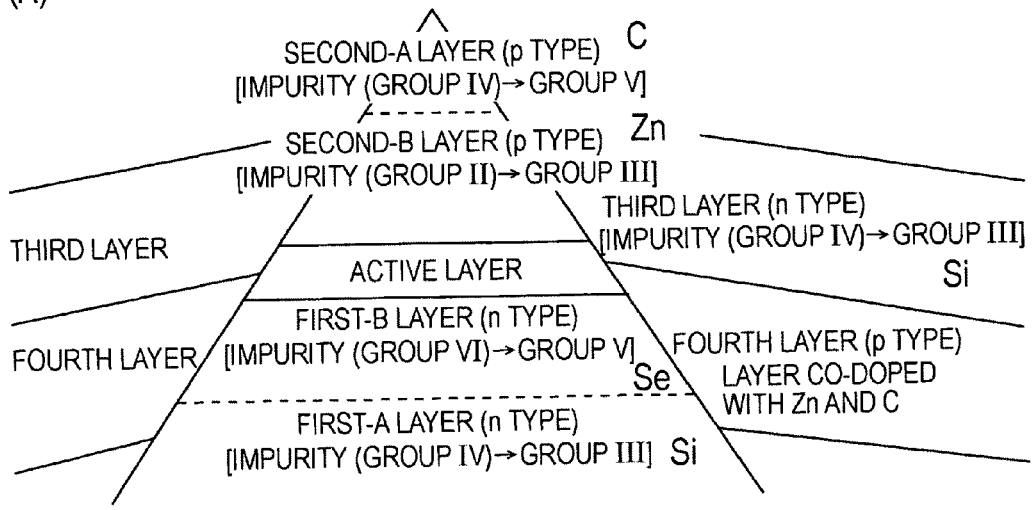
FIGS. 6(A) and (B) are conceptual views of semiconductor light-emitting devices of Example 13 and Example 21, respectively.
Figure 6:
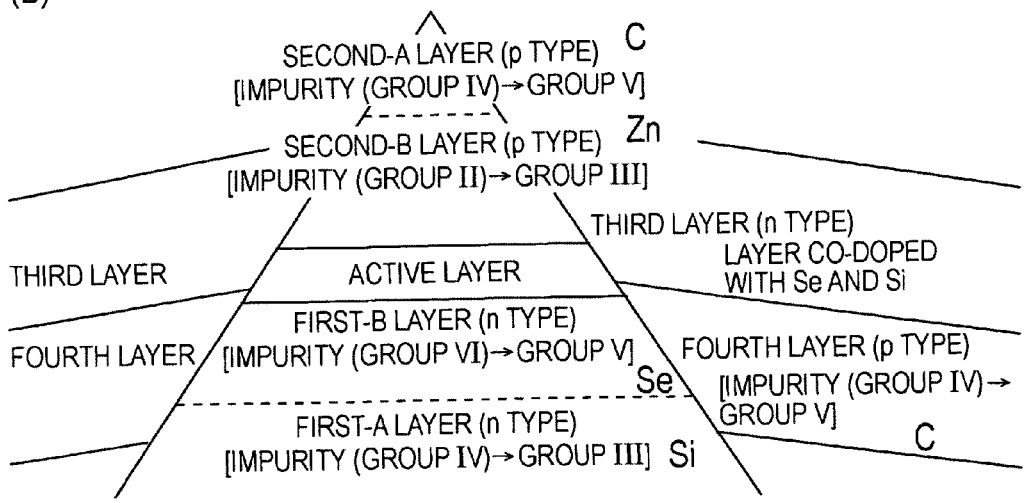

Example 13 is also a modification of Example 2 and relates to a semiconductor light-emitting device according to the embodiment 1-B-3 of the present invention. A conceptual view of the semiconductor light-emitting device of Example 13 is shown in FIG. 6(A).

In the semiconductor light-emitting device of Example 13, the impurity in the fourth compound semiconductor layer includes an impurity at a substitution site occupied by a group III atom [specifically, zinc (Zn) or magnesium (Mg)] and carbon (C). In other words, in the semiconductor light-emitting device of Example 13, the fourth compound semiconductor layer is co-doped with the impurity at a substitution site occupied by a group III atom [specifically, zinc (Zn) or magnesium (Mg)] and carbon (C) as impurities. Namely, the fourth compound semiconductor layer is a co-doped layer.

In Example 13, the configurations and structures of the fourth compound semiconductor layer and further the configurations and structures of the first compound semiconductor layer, the active layer, the second compound semiconductor layer, and the third compound semiconductor layer can be made the same as the configurations and structures of these layers of Example 11. Therefore, detailed description is omitted.

EXAMPLE 14

Figure 8:
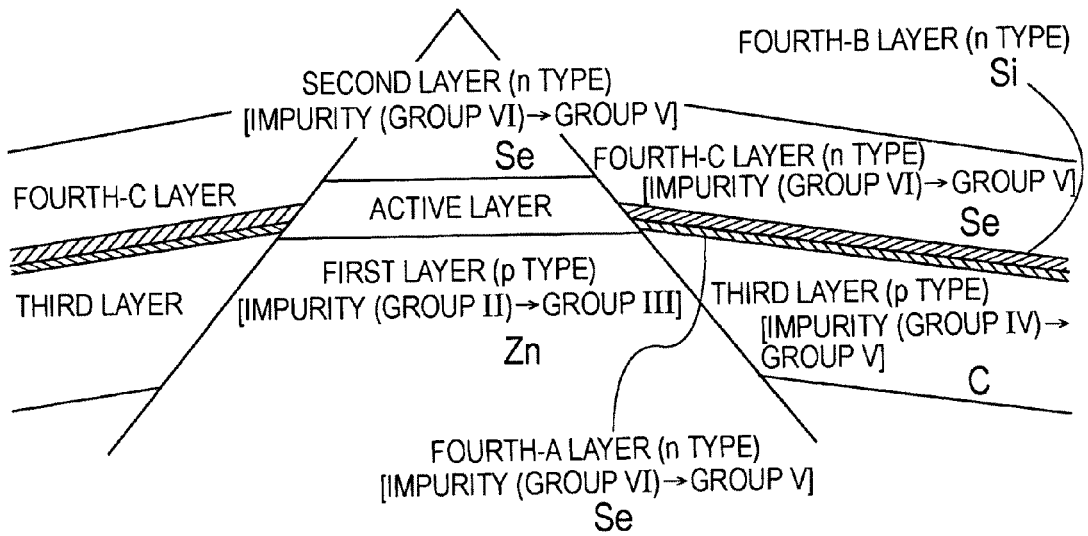
FIGS. 8(A) and (B) are conceptual views of semiconductor light-emitting devices of Example 14 and Example 22, respectively.
Figure 8:
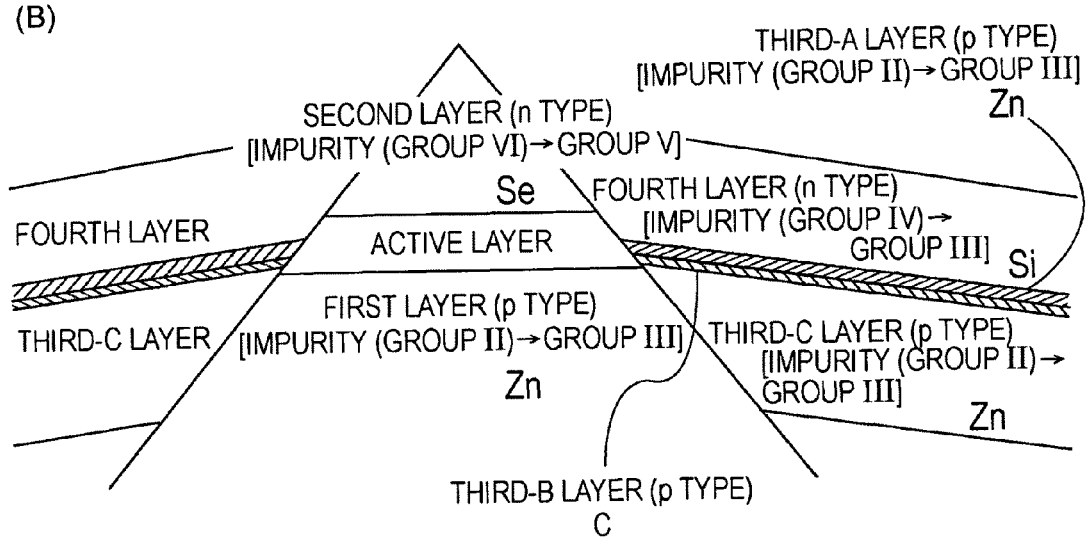

Example 14 is a modification of Example 3 and relates to semiconductor light-emitting devices according to the embodiment 1-C-2 of the present invention and an eleventh embodiment of the present invention. A conceptual view of the semiconductor light-emitting device of Example 14 is shown in FIG. 8(A).

When the semiconductor light-emitting device of Example 14 is described with reference to the embodiment 1-C-2 of the present invention or the eleventh embodiment of the present invention, the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by group V atoms, and the impurity in the fourth B compound semiconductor layer is silicon (Si). In addition, the fourth B compound semiconductor layer is partially or entirely in contact with a side of the active layer, but more specifically, the fourth B compound semiconductor layer is entirely in contact with a side of the active layer.

Specifically, impurities in the fourth A compound semiconductor layer and the fourth C compound semiconductor layer are selenium (Se). In addition, the fourth compound semiconductor layer has a three-layer structure. In this case, the fourth A compound semiconductor layer and the fourth B compound semiconductor layer are in contact with a side of the active layer, and further the fourth C compound semiconductor layer is partially in contact with a side of the active layer. Also, the third compound semiconductor layer is partially in contact with a side of the active layer. The configurations and structures of the first compound semiconductor layer, the active layer, the second compound semiconductor layer, and the third compound semiconductor layer can be made the same as the configurations and structures of the first compound semiconductor layer, the active layer, the second compound semiconductor layer, and the third compound semiconductor layer of Example 3. Also, the configurations and structures of the fourth A compound semiconductor layer and the fourth C compound semiconductor layer can be made the same as the configuration and structure of the fourth compound semiconductor layer of Example 3. Further, the configuration and structure of the fourth B compound semiconductor layer can be made the same as the configuration and structure of the fourth compound semiconductor layer of, for example, Example 7. Therefore, detailed description is omitted.

EXAMPLE 15

Figure 9:
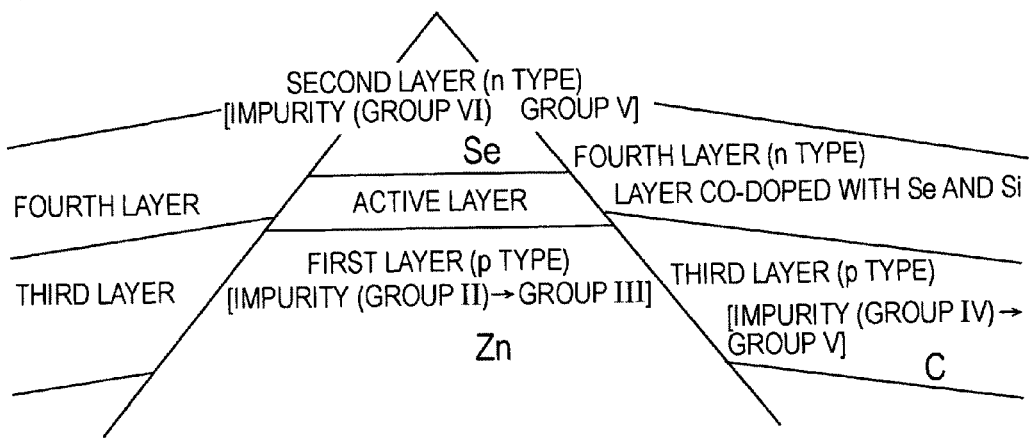
FIGS. 9(A) and (B) are conceptual views of semiconductor light-emitting devices of Example 15 and Example 23, respectively.
Figure 9:
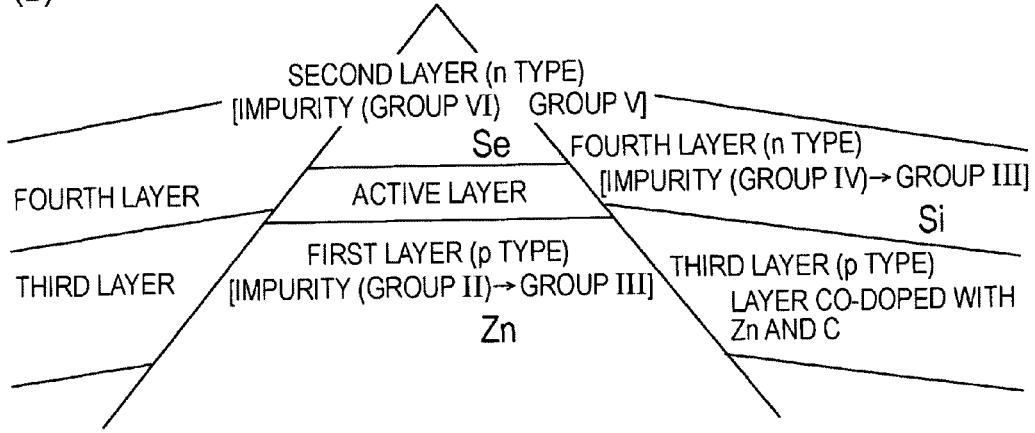

Example 15 is also a modification of Example 3 and relates to semiconductor light-emitting devices according to the embodiment 1-C-3 of the present invention and a twelfth embodiment of the present invention. A conceptual view of the semiconductor light-emitting device of Example 15 is shown in FIG. 9(A).

Here, when the semiconductor light-emitting device of Example 15 is described with reference to the embodiment 1-C-3 of the present invention or the twelfth embodiment of the present invention, the impurity in the fourth compound semiconductor layer includes an impurity at a substitution site occupied by a group V atom [specifically, selenium (Se)] and silicon (Si). In other words, in the semiconductor light-emitting device of Example 15, the fourth compound semiconductor layer is co-doped with the impurity at a substitution site occupied by a group V atom [specifically, selenium (Se)] and silicon (Si) as impurities. Namely, the fourth compound semiconductor layer is a co-doped layer. In this case, $2 \times 10^{17}$ cm$^{-3}$ to $1 \times 10^{19}$ cm$^{-3}$ can be used as the impurity concentration of silicon (Si), and $2 \times 10^{17}$ cm$^{-3}$ to $1 \times 10^{19}$ cm$^{-3}$ can be used as the impurity concentration of selenium (Se). In addition, the ratio of (impurity concentration of silicon/impurity concentration of selenium) is not limited, but $0.1 \leq$ (impurity concentration of silicon/impurity concentration of selenium)$\leq 1$ can be exemplified. In Example 15, specifically, the impurity concentration of silicon (Si) was $1 \times 10^{18}$ cm$^{-3}$, and the impurity concentration of selenium (Se) was $1 \times 10^{18}$ cm$^{-3}$.

The third compound semiconductor layer is partially in contact with a side of the active layer. Also, the fourth compound semiconductor layer is partially in contact with a side of the active layer. The configurations and structures of the first compound semiconductor layer, the active layer, the second compound semiconductor layer, and the third compound semiconductor layer can be made the same as the configurations and structures of the first compound semiconductor layer, the active layer, the second compound semiconductor layer, and the third compound semiconductor layer of Example 1. Therefore, detailed description is omitted.

EXAMPLE 16

Figure 11:
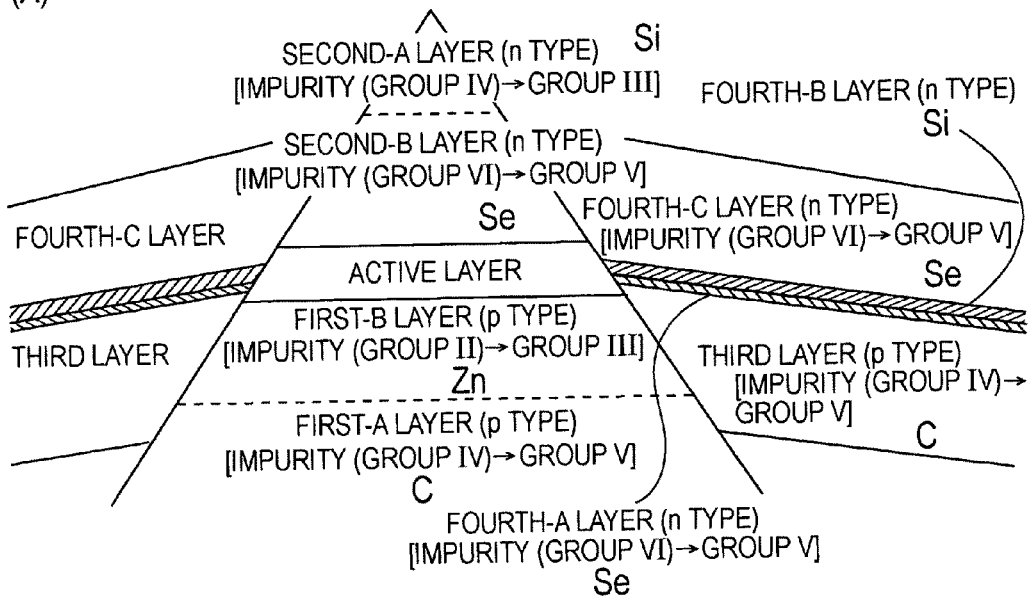
FIGS. 11(A) and (B) are conceptual views of semiconductor light-emitting devices of Example 16 and Example 24, respectively.
Figure 11:
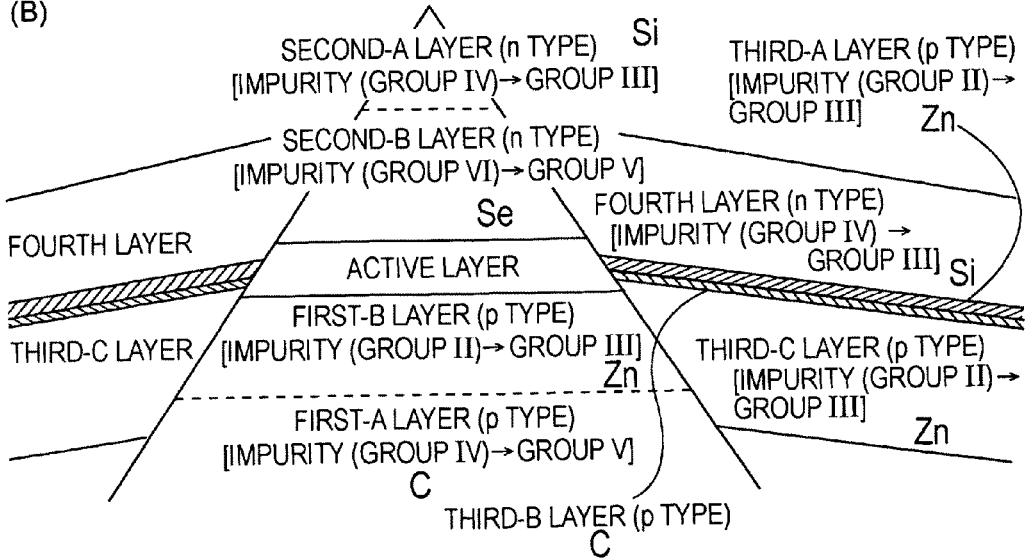

Example 16 is a modification of Example 4 and relates to a semiconductor light-emitting device according to the embodiment 1-D-2 of the present invention. A conceptual view of the semiconductor light-emitting device of Example 16 is shown in FIG. 11(A).

In the semiconductor light-emitting device of Example 16, the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by group V atoms, and the impurity in the fourth B compound semiconductor layer is silicon (Si). In addition, the fourth B compound semiconductor layer is partially or entirely in contact with a side of the active layer, but more specifically, the fourth B compound semiconductor layer is entirely in contact with a side of the active layer.

In Example 16, the configurations and structures of the fourth compound semiconductor layer and further the configurations and structures of the first compound semiconductor layer, the active layer, the second compound semiconductor layer, and the third compound semiconductor layer can be made the same as these layers of Example 14. Therefore, detailed description is omitted.

EXAMPLE 17

Figure 12:
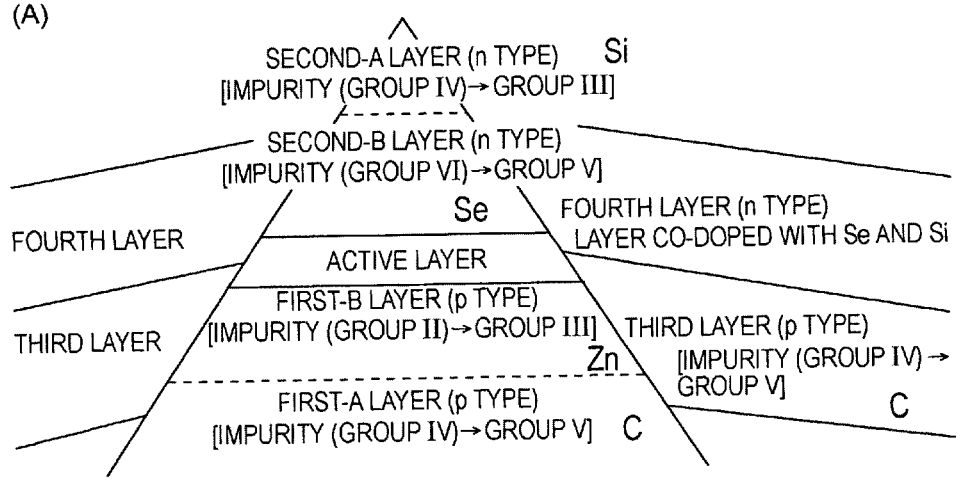
FIGS. 12(A) and (B) are conceptual views of semiconductor light-emitting devices of Example 17 and Example 25, respectively.
Figure 12:
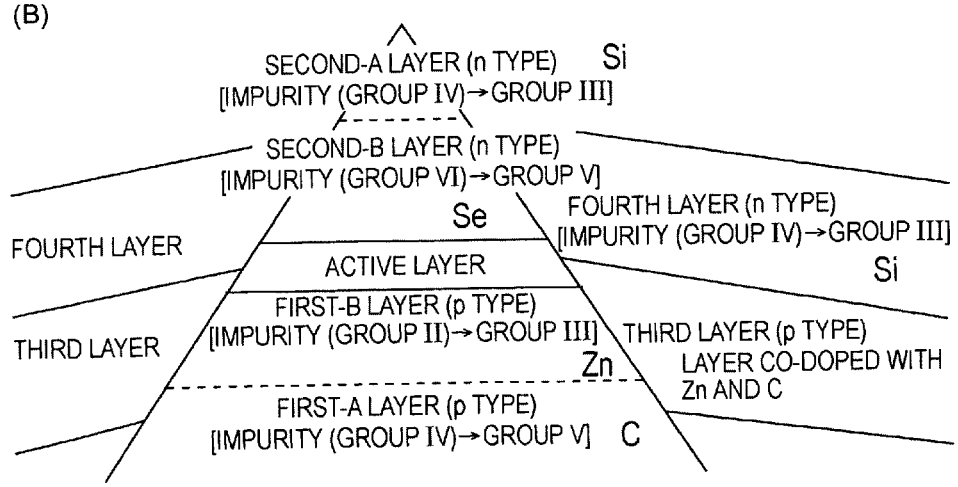

Example 17 is also a modification of Example 4 and relates to a semiconductor light-emitting device according to the embodiment 1-D-3 of the present invention. A conceptual view of the semiconductor light-emitting device of Example 17 is shown in FIG. 12(A).

In the semiconductor light-emitting device of Example 17, the impurity in the fourth compound semiconductor layer includes an impurity at a substitution site occupied by a group V atom [specifically, selenium (Se)] and silicon (Si). In other words, in the semiconductor light-emitting device of Example 17, the fourth compound semiconductor layer is co-doped with the impurity at a substitution site occupied by a group V atom [specifically, selenium (Se)] and silicon (Si) as impurities. Namely, the fourth compound semiconductor layer is a co-doped layer.

In Example 17, the configurations and structures of the fourth compound semiconductor layer and further the configurations and structures of the first compound semiconductor layer, the active layer, the second compound semiconductor layer, and the third compound semiconductor layer can be made the same as these layers of Example 15. Therefore, detailed description is omitted.

EXAMPLE 18

Example 18 is a modification of Example 5 and relates to semiconductor light-emitting devices according to the embodiment 1-a-2 of the present invention and a thirteenth embodiment of the present invention. A conceptual view of the semiconductor light-emitting device of Example 18 is shown in FIG. 2(B).

When the semiconductor light-emitting device of Example is described with reference to the embodiment 1-a-2 of the present invention or the thirteenth embodiment of the present invention, the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by group V atoms, and the impurity in the third B compound semiconductor layer is silicon (Si). In addition, the third B compound semiconductor layer is partially or entirely in contact with a side of the active layer, but more specifically, the third B compound semiconductor layer is entirely in contact with a side of the active layer.

Specifically, impurities in the third A compound semiconductor layer and the third C compound semiconductor layer are selenium (Se). In addition, the third compound semiconductor layer has a three-layer structure. In this case, the third A compound semiconductor layer and the third B compound semiconductor layer are in contact with a side of the active layer, and further the third C compound semiconductor layer is partially in contact with a side of the active layer. Also, the fourth compound semiconductor layer is partially in contact with a side of the active layer. The configurations and structures of the first compound semiconductor layer, the active layer, the second compound semiconductor layer, and the fourth compound semiconductor layer can be made the same as the configurations and structures of the first compound semiconductor layer, the active layer, the second compound semiconductor layer, and the fourth compound semiconductor layer of Example 5. Also, the configurations and structures of the third A compound semiconductor layer and the third C compound semiconductor layer can be made the same as the configuration and structure of the third compound semiconductor layer of Example 5. Further, the configuration and structure of the third B compound semiconductor layer can be made the same as the configuration and structure of the third compound semiconductor layer of, for example, Example 1. Therefore, detailed description is omitted.

EXAMPLE 19

Example 19 is also a modification of Example 5 and relates to semiconductor light-emitting devices according to the embodiment 1-a-3 of the present invention and a fourteenth embodiment of the present invention. A conceptual view of the semiconductor light-emitting device of Example 19 is shown in FIG. 3(B).

Here, when the semiconductor light-emitting device of Example 19 is described with reference to the embodiment 1-a-3 of the present invention or the fourteenth embodiment of the present invention, the impurity in the third compound semiconductor layer includes an impurity at a substitution site occupied by a group V atom [specifically, selenium (Se)] and silicon (Si). In other words, in the semiconductor light-emitting device of Example 19, the third compound semiconductor layer is co-doped with the impurity at a substitution site occupied by a group V atom [specifically, selenium (Se)] and silicon (Si) as impurities. Namely, the third compound semiconductor layer is a co-doped layer. In this case, the impurity concentration of silicon (Si) and the impurity concentration of selenium (Se) were the same as in Example 15.

The third compound semiconductor layer is partially in contact with a side of the active layer. Also, the fourth compound semiconductor layer is partially in contact with a side of the active layer. The configurations and structures of the first compound semiconductor layer, the active layer, the second compound semiconductor layer, and the fourth compound semiconductor layer can be made the same as the configurations and structures of the first compound semiconductor layer, the active layer, the second compound semiconductor layer, and the fourth compound semiconductor layer of Example 5. Therefore, detailed description is omitted.

EXAMPLE 20

Example 20 is a modification of Example 6 and relates to a semiconductor light-emitting device according to the embodiment 1-d-2 of the present invention. A conceptual view of the semiconductor light-emitting device of Example 20 is shown in FIG. 5(B).

In the semiconductor light-emitting device of Example 20, the third compound semiconductor layer has a three-layer structure including at least a third A compound semiconductor layer, a third B compound semiconductor layer, and a third C compound semiconductor layer which are laminated from the third compound semiconductor layer side, at least the third B compound semiconductor layer is in contact with a side of the active layer, substitution sites of impurities in the third A compound semiconductor layer and the third C compound semiconductor layer are sites occupied by group V atoms, and the impurity in the third B compound semiconductor layer is silicon (Si). In addition, the third B compound semiconductor layer is partially or entirely in contact with a side of the active layer, but more specifically, the third B compound semiconductor layer is entirely in contact with a side of the active layer.

In Example 20, the configurations and structures of the third compound semiconductor layer and further the configurations and structures of the first compound semiconductor layer, the active layer, the second compound semiconductor layer, and the fourth compound semiconductor layer can be made the same as these layers of Example 18. Therefore, detailed description is omitted.

EXAMPLE 21

Example 21 is also a modification of Example 6 and relates to a semiconductor light-emitting device according to the embodiment 1-b-3 of the present invention. A conceptual view of the semiconductor light-emitting device of Example 21 is shown in FIG. 6(B).

In the semiconductor light-emitting device of Example 21, the impurity in the third compound semiconductor layer includes an impurity at a substitution site occupied by a group V atom [specifically, selenium (Se)] and silicon (Si). In other words, in the semiconductor light-emitting device of Example 21, the third compound semiconductor layer is co-doped with the impurity at a substitution site occupied by a group V atom [specifically, selenium (Se)] and silicon (Si) as impurities. Namely, the third compound semiconductor layer is a co-doped layer.

In Example 21, the configurations and structures of the third compound semiconductor layer and further the configurations and structures of the first compound semiconductor layer, the active layer, the second compound semiconductor layer, and the fourth compound semiconductor layer can be made the same as these layers of Example 19. Therefore, detailed description is omitted.

EXAMPLE 22

Example 22 is a modification of Example 7 and relates to semiconductor light-emitting devices according to the embodiment 1-c-2 of the present invention and a fifteenth embodiment of the present invention. A conceptual view of the semiconductor light-emitting device of Example 22 is shown in FIG. 8(B).

When the semiconductor light-emitting device of Example 21 is described with reference to the embodiment 1-c-2 of the present invention or the fifteenth embodiment of the present invention, the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by group III atoms, and the impurity in the third B compound semiconductor layer is carbon (C). In addition, the third B compound semiconductor layer is partially or entirely in contact with a side of the active layer, but more specifically, the third B compound semiconductor layer is entirely in contact with a side of the active layer.

Specifically, impurities in the third A compound semiconductor layer and the third C compound semiconductor layer are zinc (Zn). In addition, the third compound semiconductor layer has a three-layer structure. In this case, the third A compound semiconductor layer and the third B compound semiconductor layer are in contact with a side of the active layer, and further the third C compound semiconductor layer is partially in contact with a side of the active layer. Also, the fourth compound semiconductor layer is partially in contact with a side of the active layer. The configurations and structures of the first compound semiconductor layer, the active layer, the second compound semiconductor layer, and the fourth compound semiconductor layer can be made the same as the configurations and structures of the first compound semiconductor layer, the active layer, the second compound semiconductor layer, and the fourth compound semiconductor layer of Example 7. Also, the configurations and structures of the third A compound semiconductor layer and the third C compound semiconductor layer can be made the same as the configuration and structure of the third compound semiconductor layer of Example 7. Further, the configuration and structure of the third B compound semiconductor layer can be made the same as the configuration and structure of the fourth compound semiconductor layer of, for example, Example 3. Therefore, detailed description is omitted.

EXAMPLE 23

Example 23 is also a modification of Example 7 and relates to semiconductor light-emitting devices according to the embodiment 1-c-3 of the present invention and a sixteenth embodiment of the present invention. A conceptual view of the semiconductor light-emitting device of Example 23 is shown in FIG. 9(B).

Here, when the semiconductor light-emitting device of Example 23 is described with reference to the embodiment 1-c-3 of the present invention or the sixteenth embodiment of the present invention, the impurity in the third compound semiconductor layer includes an impurity at a substitution site occupied by a group III atom [specifically, zinc (Zn) or magnesium (Mg)] and carbon (C). In other words, in the semiconductor light-emitting device of Example 23, the third compound semiconductor layer is co-doped with the impurity at a substitution site occupied by a group III atom [specifically, zinc (Zn) or magnesium (Mg)] and carbon (C) as impurities. Namely, the third compound semiconductor layer is a co-doped layer. In this case, the impurity concentration of carbon (C) and the impurity concentration of zinc (Zn) are the same as in Example 11.

The third compound semiconductor layer is partially in contact with a side of the active layer. Also, the fourth compound semiconductor layer is partially in contact with a side of the active layer. The configurations and structures of the first compound semiconductor layer, the active layer, the second compound semiconductor layer, and the fourth compound semiconductor layer can be made the same as the configurations and structures of the first compound semiconductor layer, the active layer, the second compound semiconductor layer, and the third compound semiconductor layer of Example 7. Therefore, detailed description is omitted.

EXAMPLE 24

Example 24 is a modification of Example 8 and relates to a semiconductor light-emitting device according to the embodiment 1-d-2 of the present invention. A conceptual view of the semiconductor light-emitting device of Example 24 is shown in FIG. 11(B).

In the semiconductor light-emitting device of Example 24, the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by group III atoms, and the impurity in the third B compound semiconductor layer is carbon (C). In addition, the third B compound semiconductor layer is partially or entirely in contact with a side of the active layer, but more specifically, the third B compound semiconductor layer is entirely in contact with a side of the active layer.

In Example 24, the configuration and structure of the third compound semiconductor layer and further the configurations and structures of the first compound semiconductor layer, the active layer, the second compound semiconductor layer, and the fourth compound semiconductor layer can be made the same as these layers of Example 22. Therefore, detailed description is omitted.

EXAMPLE 25

Example 25 is also a modification of Example 8 and relates to a semiconductor light-emitting device according to the embodiment 1-d-3 of the present invention. A conceptual view of the semiconductor light-emitting device of Example 25 is shown in FIG. 12(B).

In the semiconductor light-emitting device of Example 25, the impurity in the third compound semiconductor layer includes an impurity at a substitution site occupied by a group III atom [specifically, zinc (Zn) or magnesium (Mg)] and carbon (C). In other words, in the semiconductor light-emitting device of Example 25, the third compound semiconductor layer is co-doped with the impurity at a substitution site occupied by a group III atom [specifically, zinc (Zn) or magnesium (Mg)] and carbon (C) as impurities. Namely, the third compound semiconductor layer is a co-doped layer.

In Example 25, the configuration and structure of the third compound semiconductor layer and further the configurations and structures of the first compound semiconductor layer, the active layer, the second compound semiconductor layer, and the fourth compound semiconductor layer can be made the same as these layers of Example 23. Therefore, detailed description is omitted.

Although the present invention is described above on the basis of the preferred examples, the present invention is not limited to these examples.

Figure 4:
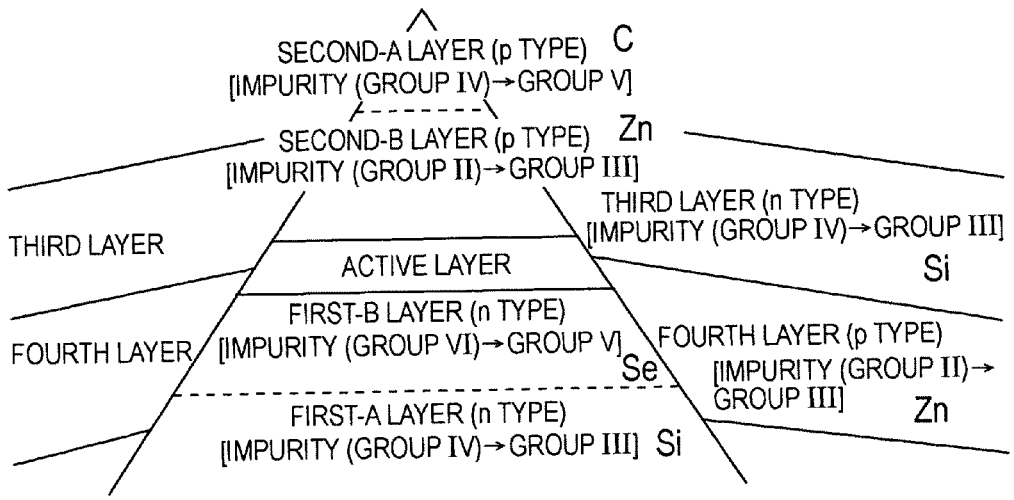
FIGS. 4(A) and (B) are conceptual views of semiconductor light-emitting devices of Example 2 and Example 6, respectively.
Figure 4:
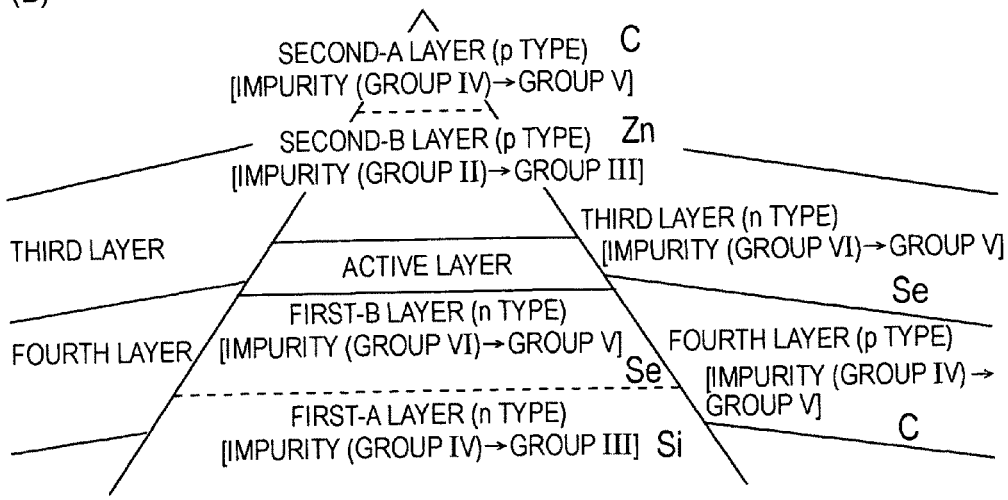
Figure 7:
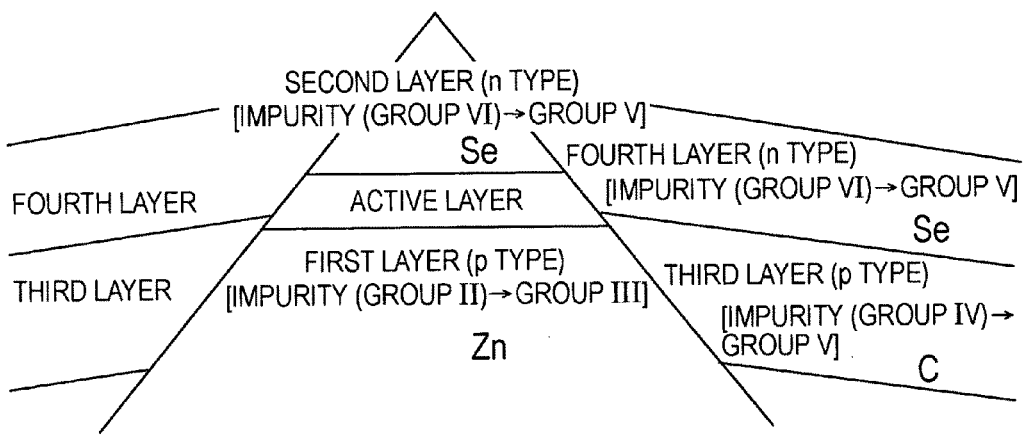
FIGS. 7(A) and (B) are conceptual views of semiconductor light-emitting devices of Example 3 and Example 7, respectively.
Figure 7:
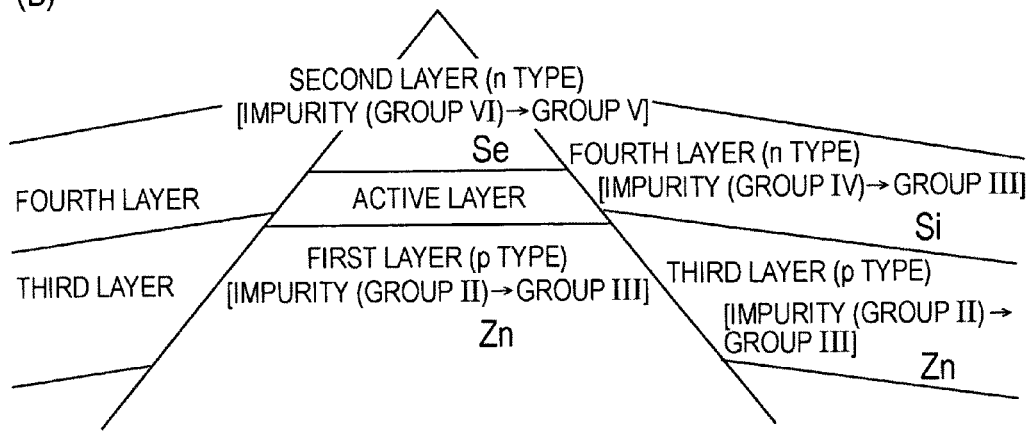

The structure of the first compound semiconductor layer in Example 1 (refer to FIG. 1(A)) and the structure of the second compound semiconductor layer in Example 2 (refer to FIG. 4(A)) may be combined, the structure of the second compound semiconductor layer in Example 1 (refer to FIG. 1(A)) and the structure of the first compound semiconductor layer in Example 2 (refer to FIG. 4(A)) may be combined, the structure of the first compound semiconductor layer in Example 3 (refer to FIG. 7(A)) and the structure of the second compound semiconductor layer in Example 4 (refer to FIG. 10(A)) may be combined, or the structure of the second compound semiconductor layer in Example 3 (refer to FIG. 7(A)) and the structure of the first compound semiconductor layer in Example 4 (refer to FIG. 10(A)) may be combined. In addition, the structure of the first compound semiconductor layer in Example 5 (refer to FIG. 1(B)) and the structure of the second compound semiconductor layer in Example 6 (refer to FIG. 4(B)) may be combined, the structure of the second compound semiconductor layer in Example 5 (refer to FIG. 1(B)) and the structure of the first compound semiconductor layer in Example 6 (refer to FIG. 4(B)) may be combined, the structure of the first compound semiconductor layer in Example 7 (refer to FIG. 7(B)) and the structure of the second compound semiconductor layer in Example 8 (refer to FIG. 10(B)) may be combined, or the structure of the second compound semiconductor layer in Example 7 (refer to FIG. 7(B)) and the structure of the first compound semiconductor layer in Example 8 (refer to FIG. 10(B)) may be combined.

Also, the semiconductor light-emitting devices described in Example 1 to Example 8 can be configured so that, the current-blocking layer 40 has a structure further including a fifth compound semiconductor layer having the second conductivity type, and the third compound semiconductor layer 43 is sandwiched between the fourth compound semiconductor layer 44 and the fifth compound semiconductor layer, and the impurity for imparting the first conductivity type to the third compound semiconductor layer 43 includes an impurity in the third compound semiconductor layer 43 at a substitution site which is competitive with a substitution site of the impurity in the fifth compound semiconductor layer, for imparting the second conductivity type to the fifth compound semiconductor layer.

In Example 1, Example 2, Example 5, and Example 6, depending on the lamination condition of the third compound semiconductor layer 43 and the fourth compound semiconductor layer 44, the current-blocking layer positioning layer 30 can be considered as the fifth compound semiconductor layer, or the buried layer 31 can be considered as the fifth compound semiconductor layer. This applies to Example 3, Example 4, Example 7, and Example 8.

Alternatively, the semiconductor light-emitting devices described in Example 1 to Example 8 can be configured so that, the current-blocking layer 40 has a structure further including a sixth compound semiconductor layer having the first conductivity type, and the fourth compound semiconductor layer 44 is sandwiched between the third compound semiconductor layer 43 and the sixth compound semiconductor layer, and the impurity for imparting the second conductivity type to the fourth compound semiconductor layer 44 includes an impurity in the fourth compound semiconductor layer 44 at a substitution site which is competitive with a substitution site of the impurity in the sixth compound semiconductor layer, for imparting the first conductivity type to the sixth compound semiconductor layer.

In Example 1, Example 2, Example 5, and Example 6, the current-blocking layer 40 can be configured to include the three layers of the third compound semiconductor layer 43 (n-type)/the fourth compound semiconductor layer 44 (p-type)/the sixth compound semiconductor layer (n-type) which are laminated in that order or can be configured to include the three layers of the sixth compound semiconductor layer (n-type)/the fourth compound semiconductor layer 44 (p-type)/the third compound semiconductor layer 43 (n-type) which are laminated in that order. Also, in Example 3, Example 4, Example 7, and Example 8, the current-blocking layer 40 can be configured to include the three layers of the third compound semiconductor layer 43 (p-type)/the fourth compound semiconductor layer 44 (n-type)/the sixth compound semiconductor layer (p-type) which are laminated in that order or can be configured to include the three layers of the sixth compound semiconductor layer (p-type)/the fourth compound semiconductor layer 44 (n-type)/the third compound semiconductor layer 43 (p-type) which are laminated in that order.

In Example 1, Example 3, Example 5, and Example 7, the second compound semiconductor layer has a two-layer configuration including the second compound semiconductor layer 22A and the second compound semiconductor layer 22B provided from the active layer side, and in Example 2, Example 4, Example 6, and Example 8, the second compound semiconductor layer has a two-layer configuration including the second A compound semiconductor layer and the second B compound semiconductor layer provided from the active layer side. In the former case, the second compound semiconductor layer having the two-layer configuration is defined by a change in the band gap (or refractive index). On the other hand, in the latter case, the second compound semiconductor layer having the two-layer configuration is defined by a change in the substitution site of the impurity. Therefore, in the laminated structure of the second compound semiconductor layer described in each example, particularly in the case of the two-layer configuration including the second A compound semiconductor layer and the second B compound semiconductor layer, the second A compound semiconductor layer can be considered as the second compound semiconductor layer 22A and the second B compound semiconductor layer can be considered as the second compound semiconductor layer 22B. Alternatively, for example, the second A compound semiconductor layer may be configured in a laminated structure including the second compound semiconductor layers 22A and 22B or the second B compound semiconductor layer may be configured in a laminated structure including the second compound semiconductor layers 22A and 22B.

The third compound semiconductor layer or the fourth compound semiconductor layer having the multilayer configuration described in Example 10 to Example 25 may be combined with a co-doped layer. Specifically, for example, in Example 10, Example 12, Example 14, and Example 16, when the fourth compound semiconductor layer has the multilayer configuration, the fourth A compound semiconductor layer and the fourth C compound semiconductor layer may be formed as co-doped layers like the fourth compound semiconductor layer in Example 11, Example 13, Example 15, and Example 17. In addition, in Example 18, Example 20, Example 22, and Example 24, when the third compound semiconductor layer has the multilayer configuration, the third A compound semiconductor layer and the third C compound semiconductor layer may be formed as co-doped layers like the third compound semiconductor layer in Example 19, Example 21, Example 23, and Example 25. Although, in the examples, the impurity concentration in a co-doped layer is constant, the impurity concentration may be changed in the thickness direction of a compound semiconductor layer. Although, in Example 10 to Example 25, the third compound semiconductor layer or the fourth compound semiconductor layer has a three-layer configuration, a multilayer configuration including three or more layers may be used.

In addition, when the first compound semiconductor layer is a n-type compound semiconductor layer to which an impurity with high diffusibility, such as selenium (Se) or the like, is added as an impurity, according to circumstances, a n-type compound semiconductor layer doped with silicon (Si) as an impurity may be formed between the first compound semiconductor layer and the active layer in order to suppress impurity diffusion from the first compound semiconductor layer to the active layer. Similarly, when the second compound semiconductor layer is a p-type compound semiconductor layer to which an impurity with high diffusibility, such as zinc (Zn), magnesium (Mg), or the like, is added as an impurity, according to circumstances, a p-type compound semiconductor layer doped with carbon (C) as an impurity may be formed between the second compound semiconductor layer and the active layer in order to suppress impurity diffusion from the second compound semiconductor layer to the active layer. In addition, when a n-type compound semiconductor layer is co-doped with at least silicon (Si) and a n-type impurity at the impurity substitution site different from that of silicon (Si), the amount of the impurity can be controlled to increase the rate of contribution of silicon (Si), which has low diffusibility to the active layer, to n-type conductivity while maintaining the concentration of n-type impurity (carrier concentration) at a desired constant concentration. As a result, impurity diffusion from the current-blocking layer to the active layer can be effectively suppressed. Similarly, when a p-type compound semiconductor layer is co-doped with at least carbon (C) and the impurity at the impurity substitution site different from that of carbon (C), the amount of the impurity can be controlled to increase the rate of contribution of carbon (C), which has low diffusibility to the active layer, to p-type conductivity while maintaining the concentration of p-type impurity (hole concentration) at a desired constant concentration. As a result, impurity diffusion from the current-blocking layer to the active layer can be effectively suppressed.

The invention claimed is:

1. A semiconductor light-emitting device comprising:
   (A) a light-emitting portion composed of a laminated structure in which a first compound semiconductor layer having a first conductivity type, an active layer, and a second compound semiconductor layer having a second conductivity type are laminated in order, and
   (B) a current-blocking layer in contact with a side of the light-emitting portion,
   wherein the current-blocking layer is composed of a third compound semiconductor layer having the first conductivity type and a fourth compound semiconductor layer having the second conductivity type and being in contact with the third compound semiconductor layer,
   an impurity for imparting the first conductivity type to the first compound semiconductor layer includes an impurity in the first compound semiconductor layer at a substitution site which is uncompetitive with a substitution site of an impurity in the second compound semiconductor layer, for imparting the second conductivity type to the second compound semiconductor layer, and
   an impurity for imparting the first conductivity type to the third compound semiconductor layer includes an impurity in the third compound semiconductor layer at a substitution site which is competitive with a substitution site of an impurity in the fourth compound semiconductor layer, for imparting the second conductivity type to the fourth compound semiconductor layer,
   wherein the first compound semiconductor layer, the second compound semiconductor layer, the third compound semiconductor layer, and the fourth compound semiconductor layer are composed of Group III-V compound semiconductors,
   the substitution site of the impurity in the first compound semiconductor layer is a site occupied by a Group V atom,
   the substitution site of the impurity in the second compound semiconductor layer is a site occupied by a Group III atom, and
   the substitution site of the impurity in the third compound semiconductor layer and the substitution site of the impurity in the fourth compound semiconductor layer are sites occupied by Group III atoms.

2. The semiconductor light-emitting device according to claim 1, wherein the fourth compound semiconductor layer has a three-layer structure including at least a fourth A compound semiconductor layer, a fourth B compound semiconductor layer, and a fourth C compound semiconductor layer which are laminated from the third compound semiconductor layer side,
- at least the fourth B compound semiconductor layer is in contact with a side of the active layer,
- substitution sites of impurities in the fourth A compound semiconductor layer and the fourth C compound semiconductor layer are sites occupied by Group III atoms, and
- the impurity in the fourth B compound semiconductor layer is carbon (C).

3. The semiconductor light-emitting device according to claim 1, wherein the impurity in the fourth compound semiconductor layer includes an impurity at a substitution site occupied by a Group III atom, and carbon (C).

4. A semiconductor light-emitting device, comprising:
(A) a light-emitting portion composed of a laminated structure in which a first compound semiconductor layer having a first conductivity type, an active layer, and a second compound semiconductor layer having a second conductivity type are laminated in order, and
(B) a current-blocking layer in contact with a side of the light-emitting portion,
wherein the current-blocking layer is composed of a third compound semiconductor layer having the first conductivity type and a fourth compound semiconductor layer having the second conductivity type and being in contact with the third compound semiconductor layer,
an impurity for imparting the first conductivity type to the first compound semiconductor layer includes an impurity in the first compound semiconductor layer at a substitution site which is uncompetitive with a substitution site of an impurity in the second compound semiconductor layer, for imparting the second conductivity type to the second compound semiconductor layer, and
an impurity for imparting the first conductivity type to the third compound semiconductor layer includes an impurity in the third compound semiconductor layer at a substitution site which is competitive with a substitution site of an impurity in the fourth compound semiconductor layer, for imparting the second conductivity type to the fourth compound semiconductor layer,
wherein the first compound semiconductor layer, the second compound semiconductor layer, the third compound semiconductor layer, and the fourth compound semiconductor layer are composed of Group III-V compound semiconductors,
the first compound semiconductor layer includes a first A compound semiconductor layer and a first B compound semiconductor layer provided on the first A compound semiconductor layer so as to be in contact with the active layer,
the second compound semiconductor layer includes a second B compound semiconductor layer in contact with the active layer and a second A compound semiconductor layer provided on the second B compound semiconductor layer,
the substitution site of the impurity in the first A compound semiconductor layer is a site occupied by a Group III atom,
the substitution site of the impurity in the first B compound semiconductor layer is a site occupied by a Group V atom,
the substitution site of the impurity in the second B compound semiconductor layer is a site occupied by a Group III atom,
the substitution site of the impurity in the second A compound semiconductor layer is a site occupied by a Group V atom,
and
the substitution site of the impurity in the third compound semiconductor layer and the substitution site of the impurity in the fourth compound semiconductor layer are sites occupied by Group III atoms.

5. The semiconductor light-emitting device according to claim 4,
wherein the fourth compound semiconductor layer has a three-layer structure including at least a fourth A compound semiconductor layer, a fourth B compound semiconductor layer, and a fourth C compound semiconductor layer which are laminated from the third compound semiconductor layer side,
at least the fourth B compound semiconductor layer is in contact with a side of the active layer,
substitution sites of impurities in the fourth A compound semiconductor layer and the fourth C compound semiconductor layer are sites occupied by Group III atoms, and
the impurity in the fourth B compound semiconductor layer is carbon (C).

6. The semiconductor light-emitting device according to claim 4, wherein the impurity in the fourth compound semiconductor layer includes an impurity at a substitution site occupied by a Group III atom, and carbon (C).

7. A semiconductor light-emitting device, comprising:
(A) a light-emitting portion composed of a laminated structure in which a first compound semiconductor layer having a first conductivity type, an active layer, and a second compound semiconductor layer having a second conductivity type are laminated in order, and
(B) a current-blocking layer in contact with a side of the light-emitting portion,
wherein the current-blocking layer is composed of a third compound semiconductor layer having the first conductivity type and a fourth compound semiconductor layer having the second conductivity type and being in contact with the third compound semiconductor layer,
an impurity for imparting the first conductivity type to the first compound semiconductor layer includes an impurity in the first compound semiconductor layer at a substitution site which is uncompetitive with a substitution site of an impurity in the second compound semiconductor layer, for imparting the second conductivity type to the second compound semiconductor layer, and
an impurity for imparting the first conductivity type to the third compound semiconductor layer includes an impurity in the third compound semiconductor layer at a substitution site which is competitive with a substitution site of an impurity in the fourth compound semiconductor layer, for imparting the second conductivity type to the fourth compound semiconductor layer,
wherein the first compound semiconductor layer, the second compound semiconductor layer, the third compound semiconductor layer, and the fourth compound semiconductor layer are composed of Group III-V compound semiconductors,
the substitution site of the impurity in the first compound semiconductor layer is a site occupied by a Group V atom,
the substitution site of the impurity in the second compound semiconductor layer is a site occupied by a Group III atom, and the substitution site of the impurity in the third compound semiconductor layer and the substitution site of the impurity in the fourth compound semiconductor layer are sites occupied by Group V atoms.

8. The semiconductor light-emitting device according to claim 7,
wherein the third compound semiconductor layer has a three-layer structure including at least a third A compound semiconductor layer, a third B compound semiconductor layer, and a third C compound semiconductor layer which are laminated from the fourth compound semiconductor layer side,
at least the third B compound semiconductor layer is in contact with a side of the active layer,
substitution sites of impurities in the third A compound semiconductor layer and the third C compound semiconductor layer are sites occupied by Group V atoms, and
the impurity in the third B compound semiconductor layer is silicon (Si).

9. The semiconductor light-emitting device according to claim 7,
wherein the impurity in the third compound semiconductor layer includes an impurity at a substitution site occupied by a Group V atom, and silicon (Si).

10. The semiconductor light-emitting device, comprising:
(A) a light-emitting portion composed of a laminated structure in which a first compound semiconductor layer having a first conductivity type, an active layer, and a second compound semiconductor layer having a second conductivity type are laminated in order, and
(B) a current-blocking layer in contact with a side of the light-emitting portion,
wherein the current-blocking layer is composed of a third compound semiconductor layer having the first conductivity type and a fourth compound semiconductor layer having the second conductivity type and being in contact with the third compound semiconductor layer,
an impurity for imparting the first conductivity type to the first compound semiconductor layer includes an impurity in the first compound semiconductor layer at a substitution site which is uncompetitive with a substitution site of an impurity in the second compound semiconductor layer, for imparting the second conductivity type to the second compound semiconductor layer, and
an impurity for imparting the first conductivity type to the third compound semiconductor layer includes an impurity in the third compound semiconductor layer at a substitution site which is competitive with a substitution site of an impurity in the fourth compound semiconductor layer, for imparting the second conductivity type to the fourth compound semiconductor layer,
wherein the first compound semiconductor layer, the second compound semiconductor layer, the third compound semiconductor layer, and the fourth compound semiconductor layer are composed of Group III-V compound semiconductors,
the first compound semiconductor layer includes a first A compound semiconductor layer and a first b compound semiconductor layer provided on the first A compound semiconductor layer so as to be in contact with the active layer,
the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group III atom,
the substitution site of the impurity in the first B compound semiconductor layer is a site occupied by a Group V atom,
the substitution site of the impurity in the second B compound semiconductor layer is a site occupied by a Group III atom,
the substitution site of the impurity in the second A compound semiconductor layer is a site occupied by a Group V atom, and
the substitution site of the impurity in the third compound semiconductor layer and the substitution site of the impurity in the fourth compound semiconductor layer are sites occupied by Group V atoms.

11. The semiconductor light-emitting device according to claim 10,
wherein the third compound semiconductor layer has a three-layer structure including at least a third A compound semiconductor layer, a third B compound semiconductor layer, and a third C compound semiconductor layer which are laminated from the fourth compound semiconductor layer side,
at least the third B compound semiconductor layer is in contact with a side of the active layer,
substitution sites of impurities in the third A compound semiconductor layer and the third C compound semiconductor layer are sites occupied by Group V atoms, and
the impurity in the third B compound semiconductor layer is silicon (Si).

12. The semiconductor light-emitting device according to claim 10, wherein the impurity in the third compound semiconductor layer includes an impurity at a substitution site occupied by a Group V atom, and silicon (Si).

13. A semiconductor light-emitting device, comprising:
(A) a light-emitting portion composed of a laminated structure in which a first compound semiconductor layer having a first conductivity type, an active layer, and a second compound semiconductor layer having a second conductivity type are laminated in order, and
(B) a current-blocking layer in contact with a side of the light-emitting portion,
wherein the current-blocking layer is composed of a third compound semiconductor layer having the first conductivity type and a fourth compound semiconductor layer having the second conductivity type and being in contact with the third compound semiconductor layer,
an impurity for imparting the first conductivity type to the first compound semiconductor layer includes an impurity in the first compound semiconductor layer at a substitution site which is uncompetitive with a substitution site of an impurity in the second compound semiconductor layer, for imparting the second conductivity type to the second compound semiconductor layer, and
an impurity for imparting the first conductivity type to the third compound semiconductor layer includes an impurity in the third compound semiconductor layer at a substitution site which is competitive with a substitution site of an impurity in the fourth compound semiconductor layer, for imparting the second conductivity type to the fourth compound semiconductor layer,
wherein the first compound semiconductor layer, the second compound semiconductor layer, the third compound semiconductor layer, and the fourth compound semiconductor layer are composed of Group III-V compound semiconductors, the substitution site of the impurity in the first compound semiconductor layer is a site occupied by a Group III atom, the substitution site of the impurity in the second compound semiconductor layer is a site occupied by a Group V atom, and the substitution site of the impurity in the third compound semiconductor layer and the substitution site of the impurity in the fourth compound semiconductor layer are sites occupied by Group V atoms.

14. The semiconductor light-emitting device according to claim 13, wherein the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by Group V atoms, and the impurity in the fourth B compound semiconductor layer is silicon (Si).

15. The semiconductor light-emitting device according to claim 13, wherein the impurity in the fourth compound semiconductor layer includes an impurity at a substitution site occupied by a Group V atom, and silicon (Si).

16. The semiconductor light-emitting device, comprising:
(A) a light-emitting portion composed of a laminated structure in which a first compound semiconductor layer having a first conductivity type, an active layer, and a second compound semiconductor layer having a second conductivity type are laminated in order, and
(B) a current-blocking layer in contact with a side of the light-emitting portion, wherein the current-blocking layer is composed of a third compound semiconductor layer having the first conductivity type and a fourth compound semiconductor layer having the second conductivity type and being in contact with the third compound semiconductor layer, an impurity for imparting the first conductivity type to the first compound semiconductor layer includes an impurity in the first compound semiconductor layer at a substitution site which is uncompetitive with a substitution site of an impurity in the second compound semiconductor layer, for imparting the second conductivity type to the second compound semiconductor layer, and an impurity for imparting the first conductivity type to the third compound semiconductor layer includes an impurity in the third compound semiconductor layer at a substitution site which is competitive with a substitution site of an impurity in the fourth compound semiconductor layer, for imparting the second conductivity type to the fourth compound semiconductor layer, wherein the first compound semiconductor layer, the second compound semiconductor layer, the third compound semiconductor layer, and the fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with the active layer, the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group V atom, the substitution site of the impurity in the first B compound semiconductor layer is a site occupied by a Group III atom, the substitution site of the impurity in the second B compound semiconductor layer is a site occupied by a Group V atom, the substitution site of the impurity in the second A compound semiconductor layer is a site occupied by a Group III atom, and the substitution site of the impurity in the third compound semiconductor layer and the substitution site of the impurity in the fourth compound semiconductor layer are sites occupied by Group V atoms.

17. The semiconductor light-emitting device according to claim 16, wherein the fourth compound semiconductor layer has a three-layer structure including at least a fourth A compound semiconductor layer, a fourth B compound semiconductor layer, and a fourth C compound semiconductor layer which are laminated from the third compound semiconductor layer side, at least the fourth B compound semiconductor layer is in contact with a side of the active layer, substitution sites of impurities in the fourth A compound semiconductor layer and the fourth C compound semiconductor layer are sites occupied by Group V atoms, and the impurity in the fourth B compound semiconductor layer is silicon (Si).

18. The semiconductor light-emitting device according to claim 16, wherein the impurity in the fourth compound semiconductor layer includes an impurity at a substitution site occupied by a Group V atom, and silicon (Si).

19. The semiconductor light-emitting device, comprising:
(A) a light-emitting portion composed of a laminated structure in which a first compound semiconductor layer having a first conductivity type, an active layer, and a second compound semiconductor layer having a second conductivity type are laminated in order, and
(B) a current-blocking layer in contact with a side of the light-emitting portion, wherein the current-blocking layer is composed of a third compound semiconductor layer having the first conductivity type and a fourth compound semiconductor layer having the second conductivity type and being in contact with the third compound semiconductor layer, an impurity for imparting the first conductivity type to the first compound semiconductor layer includes an impurity in the first compound semiconductor layer at a substitution site which is uncompetitive with a substitution site of an impurity in the second compound semiconductor layer, for imparting the second conductivity type to the second compound semiconductor layer, and an impurity for imparting the first conductivity type to the third compound semiconductor layer includes an impurity in the third compound semiconductor layer at a substitution site which is competitive with a substitution site of an impurity in the fourth compound semiconductor layer, for imparting the second conductivity type to the fourth compound semiconductor layer, wherein the first compound semiconductor layer, the second compound semiconductor layer, the third compound semiconductor layer, and the fourth compound semiconductor layer are composed of Group III-V compound semiconductors, the substitution site of the impurity in the first compound semiconductor layer is a site occupied by a Group Ill atom, the substitution site of the impurity in the second compound semiconductor layer is a site occupied by a Group V atom, and the substitution site of the impurity in the third compound semiconductor layer and the substitution site of the impurity in the fourth compound semiconductor layer are sites occupied by Group III atoms.

20. The semiconductor light-emitting device according to claim 19, wherein the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by Group III atoms, and the impurity in the third B compound semiconductor layer is carbon (C).

21. The semiconductor light-emitting device according to claim 19, wherein the impurity in the fourth compound semiconductor layer includes an impurity at a substitution site occupied by a Group III atom, and carbon (C).

22. The semiconductor light-emitting device, comprising:
(A) a light-emitting portion composed of a laminated structure in which a first compound semiconductor layer having a first conductivity type, an active layer, and a second compound semiconductor layer having a second conductivity type are laminated in order, and
(B) a current-blocking layer in contact with a side of the light-emitting portion, wherein the current-blocking layer is composed of a third compound semiconductor layer having the first conductivity type and a fourth compound semiconductor layer having the second conductivity type and being in contact with the third compound semiconductor layer, an impurity for imparting the first conductivity type to the first compound semiconductor layer includes an impurity in the first compound semiconductor layer at a substitution site which is uncompetitive with a substitution site of an impurity in the second compound semiconductor layer, for imparting the second conductivity type to the second compound semiconductor layer, and an impurity for imparting the first conductivity type to the third compound semiconductor layer includes an impurity in the third compound semiconductor layer at a substitution site which is competitive with a substitution site of an impurity in the fourth compound semiconductor layer, for imparting the second conductivity type to the fourth compound semiconductor layer, wherein the first compound semiconductor layer, the second compound semiconductor layer, the third compound semiconductor layer, and the fourth compound semiconductor layer are composed of Group III-V compound semiconductors, the first compound semiconductor layer includes a first A compound semiconductor layer and a first B compound semiconductor layer provided on the first A compound semiconductor layer so as to be in contact with the active layer, the second compound semiconductor layer includes a second B compound semiconductor layer in contact with the active layer and a second A compound semiconductor layer provided on the second B compound semiconductor layer, the substitution site of the impurity in the first A compound semiconductor layer is a site occupied by a Group V atom, the substitution site of the impurity in the first B compound semiconductor layer is a site occupied by a Group III atom, the substitution site of the impurity in the second B compound semiconductor layer is a site occupied by a Group V atom, the substitution site of the impurity in the second A compound semiconductor layer is a site occupied by a Group III atom, and the substitution site of the impurity in the third compound semiconductor layer and the substitution site of the impurity in the fourth compound semiconductor layer are sites occupied by Group III atoms.

23. The semiconductor light-emitting device according to claim 22, wherein the third compound semiconductor layer has a three-layer structure including at least a third A compound semiconductor layer, a third B compound semiconductor layer, and a third C compound semiconductor layer which are laminated from the fourth compound semiconductor layer side, at least the third B compound semiconductor layer is in contact with a side of the active layer, substitution sites of impurities in the third A compound semiconductor layer and the third C compound semiconductor layer are sites occupied by Group III atoms, and the impurity in the third B compound semiconductor layer is carbon (C).

24. The semiconductor light-emitting device according to claim 22, wherein the impurity in the third compound semiconductor layer includes an impurity at a substitution site occupied by a Group III atom, and carbon (C).

25. The semiconductor light-emitting device according to claim 22, wherein the current-blocking layer has a structure further including a fifth compound semiconductor layer having the second conductivity type, and the third compound semiconductor layer is sandwiched between the fourth compound semiconductor layer and the fifth compound semiconductor layer, and the impurity for imparting the first conductivity type to the third compound semiconductor layer includes an impurity in the third compound semiconductor layer at a substitution site which is competitive with the substitution site of the impurity in the fifth compound semiconductor layer, for imparting the second conductivity type to the fifth compound semiconductor layer.

26. The semiconductor light-emitting device according to claim 22,
- wherein the current-blocking layer has a structure further including a sixth compound semiconductor layer having the first conductivity type, and
- the fourth compound semiconductor layer is sandwiched between the third compound semiconductor layer and the sixth compound semiconductor layer, and
- the impurity for imparting the second conductivity type to the fourth compound semiconductor layer includes an impurity in the fourth compound semiconductor layer at a substitution site which is competitive with the substitution site of the impurity in the sixth compound semiconductor layer, for imparting the first conductivity type to the sixth compound semiconductor layer.

27. A semiconductor light-emitting device comprising:
- (A) a light-emitting portion composed of a laminated structure in which a first compound semiconductor layer having a first conductivity type, an active layer, and a second compound semiconductor layer having a second conductivity type are laminated in order, and
- (B) a current-blocking layer in contact with a side of the light-emitting portion,
- wherein the current-blocking layer is composed of a laminated structure in which at least a fourth compound semiconductor layer having the second conductivity type and a third compound semiconductor layer having the first conductivity type are laminated in order,
- an impurity for imparting the second conductivity type to the fourth compound semiconductor layer includes an impurity in the fourth compound semiconductor layer at a substitution site which is competitive with a substitution site of an impurity in the third compound semiconductor layer, for imparting the first conductivity type to the third compound semiconductor layer and an impurity competitive with a substitution site of an impurity in the first compound semiconductor layer, for imparting the first conductivity type to the first compound semiconductor layer,
- an impurity for imparting the second conductivity type to the second compound semiconductor layer includes an impurity in the second compound semiconductor layer at a substitution site which is competitive with a substitution site of an impurity in the third compound semiconductor layer, for imparting the first conductivity type to the third compound semiconductor layer, and
- when an alternative route passing through the first compound semiconductor layer, the current-blocking layer, and the second compound semiconductor layer is assumed, at least three pn junction interfaces composed of the interfaces between the respective compound semiconductor layers are present in the alternative route.

28. The semiconductor light-emitting device according to claim 27,
- wherein the first compound semiconductor layer includes a first A compound semiconductor layer and a first B compound semiconductor layer provided on the first A compound semiconductor layer so as to be in contact with the active layer,
- the impurity for imparting the first conductivity type to the first B compound semiconductor layer includes the impurity in the first B compound semiconductor layer at a substitution site which is uncompetitive with a substitution site of the impurity in the first A compound semiconductor layer, for imparting the first conductivity type to the first A compound semiconductor layer, and the impurity at a substitution site uncompetitive with a substitution site of the impurity in the second compound semiconductor layer, for imparting the second conductivity type to the second compound semiconductor layer.

29. The semiconductor light-emitting device according to claim 27,
- wherein the second compound semiconductor layer includes a second B compound semiconductor layer in contact with the active layer and a second A compound semiconductor layer provided on the second B compound semiconductor layer, and
- the impurity for imparting the second conductivity type to the second B compound semiconductor layer includes the impurity in the second B compound semiconductor layer at a substitution site which is uncompetitive with a substitution site of the impurity in the second A compound semiconductor layer, for imparting the second conductivity type to the second A compound semiconductor layer, and the impurity uncompetitive with a substitution site of the impurity in the first compound semiconductor layer, for imparting the first conductivity type to the first compound semiconductor layer.

30. The semiconductor light-emitting device according to claim 27, wherein at least two compound semiconductor layers including a compound semiconductor layer having the first conductivity type and a compound semiconductor layer having the second conductivity type are further laminated in order between the fourth compound semiconductor layer and the third compound semiconductor layer.

* * * * *